(12) United States Patent
Yun et al.

(10) Patent No.: US 11,569,262 B2
(45) Date of Patent: Jan. 31, 2023

(54) SEMICONDUCTOR DEVICE INCLUDING VERTICAL MEMORY STRUCTURE

(71) Applicant: SAMSUNG ELECTRONICS CO., LTD., Suwon-si (KR)

(72) Inventors: Janggn Yun, Hwaseong-si (KR); Jaeduk Lee, Seongnam-si (KR); Dongwhee Kwon, Yongin-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 176 days.

(21) Appl. No.: 17/036,034

(22) Filed: Sep. 29, 2020

(65) Prior Publication Data

US 2021/0143172 A1 May 13, 2021

(30) Foreign Application Priority Data

Nov. 7, 2019 (KR) .................... 10-2019-0142089

(51) Int. Cl.
| | | |
|---|---|---|
| *H01L 27/11582* | (2017.01) | |
| *H01L 27/24* | (2006.01) | |
| *H01L 23/535* | (2006.01) | |
| *H01L 27/11556* | (2017.01) | |

(52) U.S. Cl.
CPC ...... *H01L 27/11582* (2013.01); *H01L 23/535* (2013.01); *H01L 27/11556* (2013.01); *H01L 27/249* (2013.01); *H01L 27/2454* (2013.01)

(58) Field of Classification Search
None
See application file for complete search history.

(56) References Cited

U.S. PATENT DOCUMENTS

| | | |
|---|---|---|
| 9,324,730 B2 | 4/2016 | Nam et al. |
| 9,520,485 B2 | 12/2016 | Lue |
| 9,530,789 B2 | 12/2016 | Lee et al. |
| 9,553,146 B2 | 1/2017 | Zhang et al. |
| 9,837,431 B2 | 12/2017 | Nishikawa et al. |
| 9,837,434 B2 | 12/2017 | Sakata et al. |
| 9,929,179 B2 | 3/2018 | Son et al. |
| 10,103,165 B2 | 10/2018 | Son et al. |
| 2014/0239376 A1* | 8/2014 | Zhang ................. H01L 27/1052 438/591 |
| 2018/0182776 A1 | 6/2018 | Kim |
| 2018/0211969 A1 | 7/2018 | Lue |

* cited by examiner

*Primary Examiner* — Hsien Ming Lee
(74) *Attorney, Agent, or Firm* — F. Chau & Associates, LLC

(57) ABSTRACT

A semiconductor device includes a first stacked structure and a second stacked structure spaced apart from each other on a substrate, and a plurality of separation structures and a plurality of vertical memory structures alternately arranged between the first stacked structure and the second stacked structure in a first direction parallel to an upper surface of the substrate. Each of the first and second stacked structures includes a plurality of interlayer insulating layers and a plurality of gate layers alternately repeatedly stacked on the lower structure. Each of the vertical memory structures includes a first data storage structure facing the first stacked structure and a second data storage structure facing the second stacked structure. Side surfaces of the first and second stacked structures facing the vertical memory structures are concave in a plan view.

20 Claims, 50 Drawing Sheets

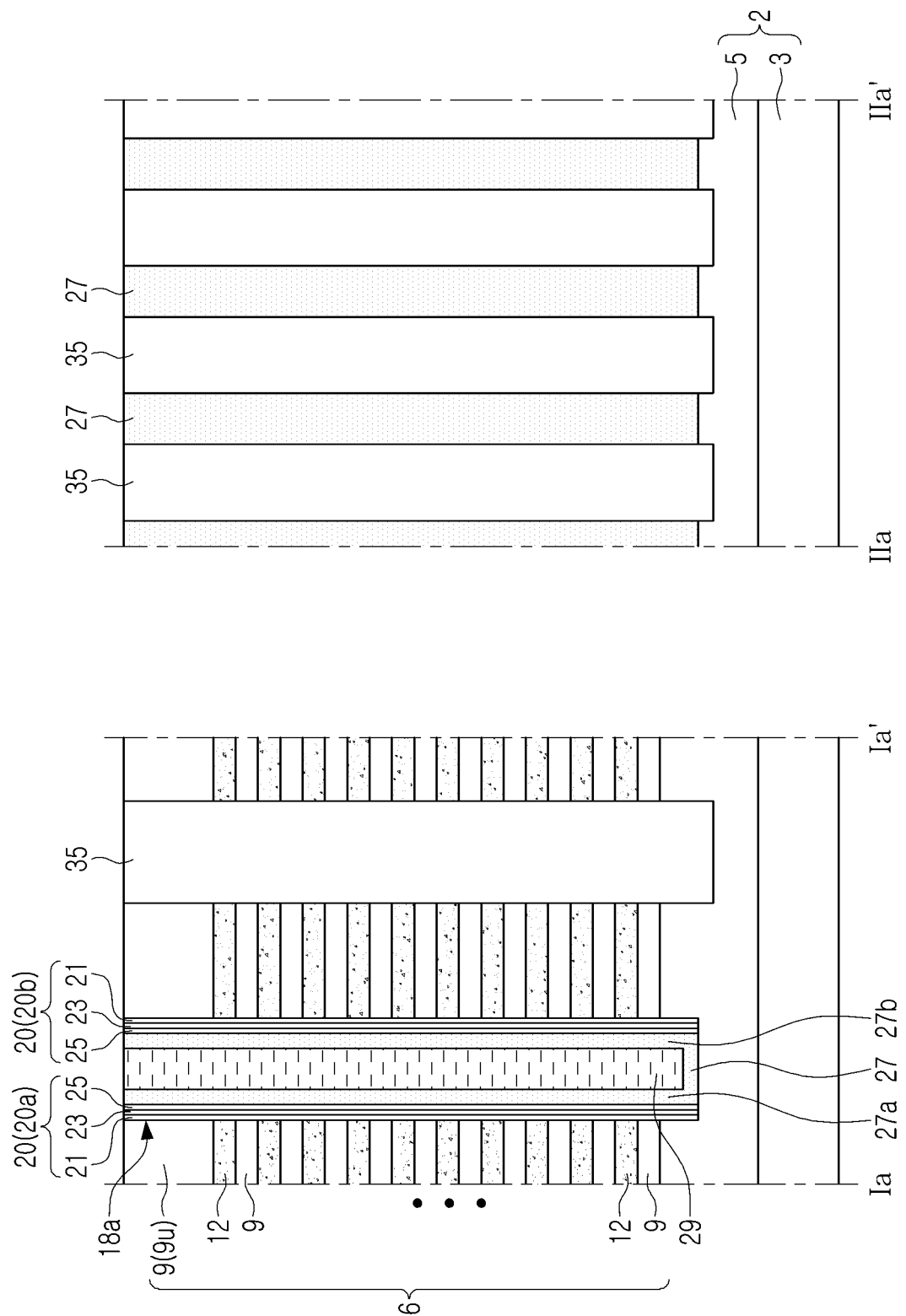

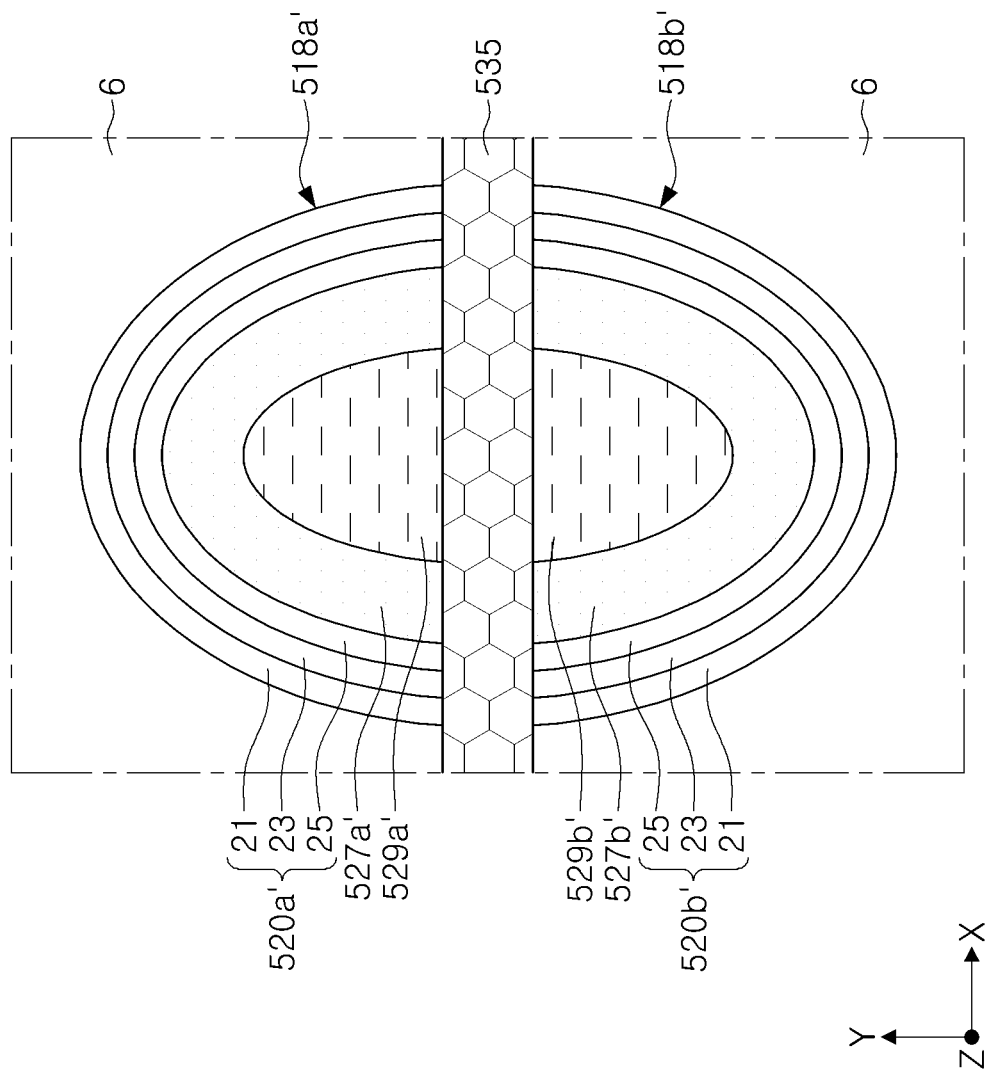

27
SEMICONDUCTOR DEVICE INCLUDING VERTICAL MEMORY STRUCTURE

CROSS-REFERENCE TO RELATED APPLICATION(S)

This application claims priority under 35 U.S.C. § 119 to Korean Patent Application No. 10-2019-0142089, filed on Nov. 7, 2019 in the Korean Intellectual Property Office, the disclosure of which is incorporated herein by reference in its entirety herein.

1. TECHNICAL FIELD

The present inventive concepts relate to a semiconductor device, and more particularly, to a semiconductor device having a vertical memory structure and a method of forming the same.

2. DISCUSSION OF RELATED ART

There is a growing demand for improving the integration of semiconductor devices to increase the price competitiveness of products. To improve the degree of integration of a semiconductor device, a semiconductor device having a three-dimensional array of memory cells instead of a two-dimensional array of memory cells has been proposed.

SUMMARY

Exemplary embodiments of the present inventive concepts provide a semiconductor device in which the degree of integration may be improved, and a method of forming the same.

According to an exemplary embodiment of the present inventive concepts, a semiconductor device includes a lower structure and a plurality of separation structures disposed on the lower structure and spaced apart from each other in a first direction that is parallel to an upper surface of the lower structure. A vertical memory structure is disposed between adjacent separation structures of the plurality of separation structures. The vertical memory structure includes a core region, a channel semiconductor structure and a data storage structure. A stacked structure is disposed on the lower structure. The stacked structure includes a first stacked structure and a second stacked structure spaced apart from each other in a second direction by the plurality of separation structures and the vertical memory structure. The second direction is parallel to the upper surface of the lower structure and perpendicular to the first direction. Each of the first and second stacked structures includes a plurality of interlayer insulating layers and a plurality of gate layers alternately repeatedly stacked on the lower structure. The channel semiconductor structure includes a first channel semiconductor layer disposed between the core region and the first stacked structure in the second direction and a second channel semiconductor layer disposed between the core region and the second stacked structure in the second direction. The data storage structure includes a first data storage structure disposed between the first stacked structure and the first channel semiconductor layer in the second direction and a second data storage structure disposed between the second stacked structure and the second channel semiconductor layer in the second direction. Each of the first and second data storage structures includes a first dielectric layer, a second dielectric layer, and a data storage layer disposed between the first and second dielectric layers; and side surfaces of the first and second stacked structures that face the vertical memory structure are concave in a first plan view defined by the first direction and the second direction.

According to an exemplary embodiment of the present inventive concepts, a semiconductor device includes a first stacked structure and a second stacked structure disposed on a substrate. The first stacked structure and the second stacked structure are spaced apart from each other in a first direction that is parallel to an upper surface of the substrate. A plurality of separation structures and a plurality of vertical memory structures are alternately arranged between the first stacked structure and the second stacked structure in a second direction that is parallel to the upper surface of the substrate and is perpendicular to the first direction. Each of the first and second stacked structures includes a plurality of interlayer insulating layers and a plurality of gate layers alternately repeatedly stacked on the substrate. Each of the plurality of vertical memory structures includes a first data storage structure facing the first stacked structure and a second data storage structure facing the second stacked structure. Side surfaces of the first and second stacked structures that face the plurality of vertical memory structures are concave in a first plan view defined by the first direction and the second direction.

According to an exemplary embodiment of the present inventive concepts, a semiconductor device includes a first stacked structure and a second stacked structure disposed on a substrate. Each of the first and second stacked structures includes a plurality of interlayer insulating layers and a plurality of gate layers alternately repeatedly stacked on the substrate. A plurality of vertical memory structures is disposed between the first and second stacked structures and arranged in a first direction that is parallel to an upper surface of the substrate. Each of the plurality of vertical memory structures includes a channel semiconductor structure and a data storage structure. A separation structure fills a gap between the first and second stacked structures together with the plurality of vertical memory structures and separates adjacent vertical memory structures of the plurality of vertical memory structures. Conductive lines are disposed on the vertical memory structures to extend in the first direction. The channel semiconductor structure includes a first channel semiconductor layer and a second channel semiconductor layer having a mirror symmetry structure with respect to each other. A first data storage structure and a second data storage structure have a mirror symmetry structure with respect to each other. The first data storage structure is disposed between the first channel semiconductor layer and the first stacked structure. The second data storage structure is disposed between the second channel semiconductor layer and the second stacked structure. A side surface of the first stacked structure that faces the first data storage structure is concave. A side surface of the second stacked structure that faces the second data storage structure is concave. The first channel semiconductor layer has a substantially uniform thickness and faces the first data storage structure in a plan view.

According to an exemplary embodiment of the present inventive concepts, a semiconductor device includes a lower structure. A plurality of separation structures and a plurality of vertical memory structures are disposed on the lower structure. The plurality of separation structures and the plurality of vertical memory structures are alternately repeatedly arranged in a first direction that is parallel to an upper surface of the lower structure. A stacked structure is disposed on the lower structure and is divided in a second direction by the plurality of separation structures and the plurality of vertical memory structures. The second direction is a direction that is parallel to the upper surface of the lower structure and perpendicular to the first direction. The stacked structure includes a plurality of interlayer insulating layers and a plurality of gate layers alternately repeatedly stacked on the lower structure. Each of the plurality of vertical memory structures includes a channel semiconductor structure and a data storage structure. The plurality of separation structures includes a plurality of first separation structures and a second separation structure disposed between adjacent first separation structures of the plurality of first separation structure. A width in the first direction of each of the plurality of first separation structures is less than a width in the first direction of the second separation structure.

According to an exemplary embodiment of the present inventive concepts, a semiconductor device includes a lower structure and a stacked structure disposed on the lower structure. The stacked structure includes a plurality of interlayer insulating layers and a plurality of gate layers that are alternately repeatedly stacked on the lower structure. A plurality of separation structures is disposed on the lower structure to penetrate through the stacked structure and is spaced apart from each other in a first direction that is parallel to an upper surface of the lower structure. A vertical memory structure is disposed between the plurality of separation structures to penetrate through the stacked structure. The vertical memory structure includes a core region, a channel semiconductor structure and a data storage structure. The vertical memory structure has sides that face the stacked structure. A distance between the sides of the vertical memory structure facing the stacked structure gradually narrows or gradually widens from a first separation structure of the plurality of separation structures to an adjacent second separation structure of the plurality of separation structures.

According to an exemplary embodiment of the present inventive concepts, a semiconductor device includes a lower structure and a plurality of separation structures disposed on the lower structure. The plurality of separation structures are spaced apart from each other in a first direction that is parallel to an upper surface of the lower structure. A vertical memory structure is disposed between adjacent separation structures of the plurality of separation structures. A stacked structure is disposed on the lower structure. The stacked structure includes a first stacked structure and a second stacked structure spaced apart from each other in a second direction by the plurality of separation structures and the vertical memory structure. The second direction is parallel to the upper surface of the lower structure and perpendicular to the first direction. Each of the first and second stacked structures includes a plurality of interlayer insulating layers and a plurality of gate layers alternately repeatedly stacked on the lower structure. At least a portion of sides of the first and second stacked structures that face the vertical memory structure is concave in a first plan direction defined by the first direction and the second direction.

BRIEF DESCRIPTION OF DRAWINGS

The above and other aspects, features, and advantages of the present inventive concepts will be more clearly understood from the following detailed description of exemplary embodiments, taken in conjunction with the accompanying drawings, in which:

FIG. 2A is a cross-sectional view of a semiconductor device taken along lines Ia-Ia' and IIa-IIa' of FIG. 1 according to exemplary embodiments of the present inventive concepts;

FIG. 19C is an enlarged plan view of a semiconductor device according to an exemplary embodiment of the present inventive concepts;

DETAILED DESCRIPTION OF EXEMPLARY EMBODIMENTS

Figure 1:
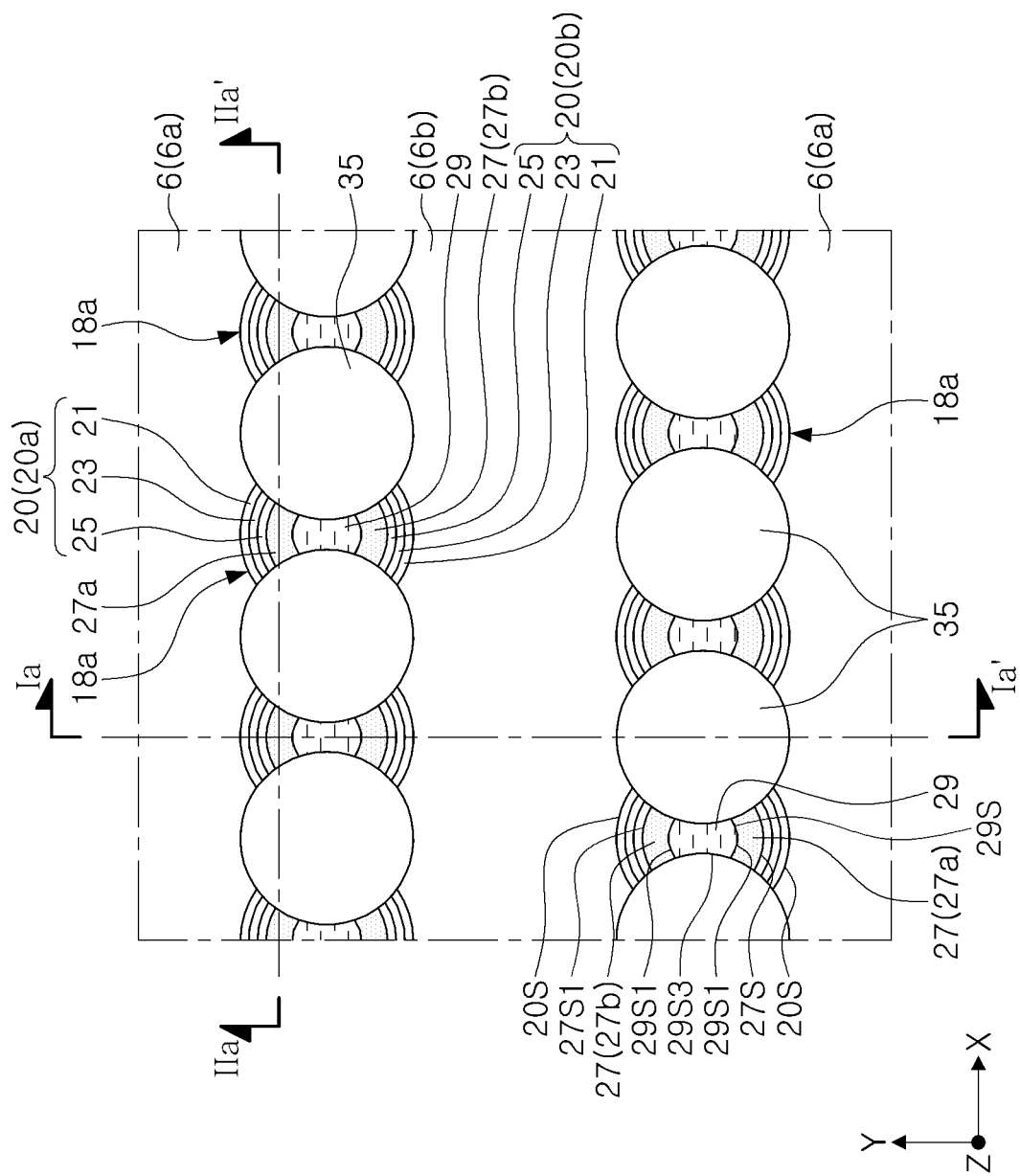
FIG. 1 is a plan view of a semiconductor device according to an exemplary embodiment of the present inventive concepts.

A semiconductor device according to exemplary embodiments of the present inventive concepts will be described with reference to FIGS. 1 and 2A. FIG. 1 is a plan view illustrating a semiconductor device according to an exemplary embodiment, and FIG. 2A is a cross-sectional view illustrating regions taken along lines Ia-Ia' and IIa-IIa' of FIG. 1.

Referring to FIGS. 1 and 2A, a stacked structure 6 may be disposed on a lower structure 2 (e.g., in a vertical Z direction). The lower structure 2 may include a substrate 3 and an impurity region 5 disposed on the substrate 3 (e.g., in the Z direction). In an exemplary embodiment, the impurity region 5 may have an N-type conductivity. The substrate 3 may be a semiconductor substrate.

The stacked structure 6 may include interlayer insulating layers 9 and gate layers 12 that are alternately repeatedly stacked (e.g., in the Z direction). An uppermost layer of the interlayer insulating layers 9 and the gate layers 12 may be an uppermost interlayer insulating layer 9U. In an exemplary embodiment, the interlayer insulating layers 9 may be formed of an insulating material such as silicon oxide. However, exemplary embodiments of the present inventive concepts are not limited thereto.

The gate layers 12 may include a conductive material. For example, in an exemplary embodiment, the gate layers 12 may include at least one material selected from polysilicon, metal nitride (e.g., TiN, TaN, etc.), metal silicide (e.g., TiSi, TaSi, CoSi, WSi, etc.), and a metal (e.g., W, etc.). For example, the gate layers 12 may be formed of polysilicon having a P-type conductivity.

The gate layers 12 may include gate electrodes. For example, among the gate layers 12, one gate electrode or at least one of a plurality of lower gate layers may be a ground select gate electrode, and one gate electrode or at least one of a plurality of upper gate layers may be a string select gate electrode, and a plurality of intermediate gate layers between the one or the plurality of lower gate layers and the one or the plurality of upper gate layers may be word lines.

On the lower structure 2, vertical memory structures 18a and separation structures 35 may be disposed to penetrate through the stacked structure 6. The vertical memory structures 18a may extend in the vertical direction Z that is perpendicular to the upper surface of the lower structure 2, to penetrate through the stacked structure 6. The separation structures 35 may be spaced apart from each other. For example, the separation structures 35 may be spaced apart from each other in an X direction that is parallel to the upper surface of the lower structure 2. The vertical memory structures 18a may be spaced apart from each other (e.g., in the X direction).

In a plan view taken in the X direction and a Y direction that is parallel to the upper surface of the lower structure 2 and is perpendicular to the X direction, the vertical memory structures 18a and the separation structures 35 are arranged to be in contact with each other in the X direction, and may be arranged to be spaced apart from each other in the Y direction. Accordingly, the vertical memory structures 18a and the separation structures 35 arranged in the X direction may be alternately repeatedly arranged while being in contact with each other, and the vertical memory structures 18a and the separation structures 35 arranged while being spaced apart from each other in Y direction may be arranged in a shape of a zigzag.

The vertical memory structures 18a and the separation structures 35 arranged in the X direction may divide the stacked structure 6 in the Y direction perpendicular to the X direction. Accordingly, as shown in the exemplary embodiment of FIG. 1, the stacked structure 6 may include a first stacked structure 6a and a second stacked structure 6b which are spaced apart from each other in the Y direction by the separation structures 35 and the vertical memory structures 18a arranged in the X direction.

Each of the vertical memory structures 18a may include a data storage structure 20, a channel semiconductor structure 27, and a core region 29.

The core region 29 may be disposed between the first stacked structure 6a and the second stacked structure 6b (e.g., in the Y direction). In an exemplary embodiment, the core region 29 may include an insulating material such as silicon oxide. Alternatively, the core region 29 may include an insulating material including voids. However, exemplary embodiments of the present inventive concepts are not limited thereto.

Between the first and second stacked structures 6a and 6b, the channel semiconductor structure 27 may cover the bottom surface and lateral side surfaces of the core region 29.

In the channel semiconductor structure 27, a first portion 27a thereof disposed between the core region 29 and the first stacked structure 6a is described as a first channel semiconductor layer 27a', and a second portion 27b thereof disposed between the core region 29 and the second stacked structure 6b is described as a 'second channel semiconductor layer 27b'. The first channel semiconductor layer 27a and the second channel semiconductor layer 27b may extend in the Z direction and may be spaced apart in the Y direction.

The channel semiconductor structure 27 may be electrically connected to the impurity region 5 of the lower structure 2. In an exemplary embodiment, the channel semiconductor structure 27 may be formed of polysilicon.

The data storage structure 20 includes a first data storage structure 20a between the first stacked structure 6a and the first channel semiconductor layer 27a, and a second data storage structure 20b between the second stacked structure 6b and the second channel semiconductor layer 27b (e.g., in the Y direction). The first data storage structure 20a and the second data storage structure 20b may be spaced apart from each other in the Y direction. The first channel semiconductor layer 27a and the second channel semiconductor layer 27b may be spaced apart from each other in the Y direction.

Each of the first data storage structure 20a and the second data storage structure 20b may include a first dielectric layer 21, a data storage layer 23, and a second dielectric layer 25 arranged in the Y direction. The data storage layer 23 may be interposed between the first dielectric layer 21 and the second dielectric layer 25 (e.g., in the Y direction). The first dielectric layer 21 may be interposed between the stacked structure 6 and the data storage layer 23, and the second dielectric layer 25 may be interposed between the channel semiconductor structure 27 and the data storage layer 23. The first dielectric layer 21 may be in direct contact with the stacked structure 6, and the second dielectric layer 25 may be in direct contact with the channel semiconductor structure 27. In an exemplary embodiment, the second dielectric layer 25 may include silicon oxide or silicon oxide doped with impurities. The first dielectric layer 21 may include silicon oxide and/or a high-k dielectric. However, exemplary embodiments of the present inventive concepts are not limited thereto.

The data storage layer 23 may be a charge trap layer capable of trapping charge. The data storage layer 23 may include a material capable of trapping charge, for example silicon nitride. The data storage layer 23 may be used as a data storage area of a NAND flash memory. Each of the first data storage structure 20a and the second data storage structure 20b may include the data storage layer 23 that may be used as a data storage region of a NAND flash memory. However, exemplary embodiments of the present inventive concepts are not limited thereto. For example, in other exemplary embodiments, at least one of the first data storage structure 20a and the second data storage structure 20b may also include a data storage layer capable of storing information in a manner different from that of the NAND flash memory.

In the plan view shown in FIG. 1 (e.g., in a plane defined in the X direction and the Y direction), each of the separation structures 35 may be circular. In an exemplary embodiment, the separation structures 35 may be formed of an insulating material such as silicon oxide.

In the plan view shown in FIG. 1, side surfaces 29S1 of the core region 29 facing the channel semiconductor structure 27 may have a convex shape in a direction towards the channel semiconductor structure 27.

In the plan view shown in FIG. 1, side surfaces 29S2 of the core region 29 facing the separation structures 35 may have a concave shape in a direction towards the separation structures 35.

When seen in the plan view shown in FIG. 1, the first data storage structure 20a may have a predetermined thickness and faces the first stacked structure 6a, and the second data storage structure 20b may have a predetermined thickness and faces the second stacked structure 6b. When seen in the plan view, the first data storage structure 20a may have a substantially uniform thickness and faces the first stacked structure 6a, and the second data storage structure 20b may have a substantially uniform thickness and faces the second stacked structure 6b. In the plan view, the first channel semiconductor layer 27a may have a predetermined thickness and faces the first data storage structure 20a, and the second channel semiconductor layer 27b may have a predetermined thickness and faces the second data storage structure 20b. In the plan view, the first channel semiconductor layer 27a may have a substantially uniform thickness, and the second channel semiconductor layer 27b may have a substantially uniform thickness.

In the plan view shown in FIG. 1, the first channel semiconductor layer 27a and the first data storage structure 20a may have a bar shape that is convexly curved in a direction from the core region 29 toward the first stacked structure 6a, and the second channel semiconductor layer 27b and the second data storage structure 20b may have a bar shape that is convexly curved in a direction from the core region 29 toward the second stacked structure 6b.

In the plan view shown in FIG. 1, the length of an interfacial surface between the data storage structure 20 and the channel semiconductor structure 27 may be greater than the length of an interfacial surface between the channel semiconductor structure 27 and the core region 29. For example, as shown in the exemplary embodiment of FIG. 1, the length of an interfacial surface 27S between the first data storage structure 20a and the first channel semiconductor layer 27a may be greater than the length of an interfacial surface 29S between the first channel semiconductor layer 27a and the core region 29. The length of an interfacial surface 27S1 between the second data storage structure 20b and the second channel semiconductor layer 27b may be greater than the length of an interfacial surface 29S3 between the second channel semiconductor layer 27b and the core region 29.

In the plan view shown in FIG. 1, the length of the interfacial surface 20S between the data storage structure 20 and the stacked structure 6 may be greater than the length of the interfacial surface 27S between the first data storage structure 20a and the first channel semiconductor structure 27a and the length of the interfacial surface 27S1 between the second data storage structure 20b and the second channel semiconductor layer 27b. For example, the length of the interfacial surface 20S between the first data storage structure 20a and the first stacked structure 6a may be greater than the length of the interfacial surface 27S between the first data storage structure 20a and the first channel semiconductor layer 27a. The length of the interfacial surface 20S between the second data storage structure 20b and the second stacked structure 6b may be greater than the length of the interfacial surface 27S1 between the second data storage structure 20b and the second channel semiconductor layer 27b.

The interfacial surface 20S between the data storage structure 20 and the stacked structure 6 may be sides of the vertical memory structures 18a facing the stacked structure 6.

In the plan view shown in FIG. 1, the side surfaces of the vertical memory structures 18a facing the separation structures 35 may be concave in a direction towards the separation structures 35.

In the plan view shown in FIG. 1, the side surfaces of the first and second stacked structures 6a and 6b facing the vertical memory structures 18a may be concave in a direction towards the vertical memory structures 18a. For example, when seen in the plan view, the side surfaces 20S of the vertical memory structures 18a facing the first and second stacked structures 6a and 6b may be convex in a direction towards the adjacent stacked structure. As such, the side surfaces 20S of the vertical memory structures 18a are convex, and thus, the sides surfaces of the data storage structure 20 facing the gate layers, which may be word lines, among the gate layers 12 of the stacked structure 6, and the side surfaces of the channel semiconductor structure 27 may also be convex. Therefore, when the data storage structure 20 is used as the data storage area of the NAND flash memory, since the channel semiconductor structure 27 is curved in the direction toward the adjacent stacked structure 6, the program operating speed of the NAND flash memory by the field-effect concentration may be increased and the back-tunneling phenomenon during the erase operation may be reduced. Therefore, the performance of semiconductor devices such as NAND flash memories may be improved.

As described above, the separation structures 35 and the vertical memory structures 18a arranged in the X direction may divide the stacked structure 6 into the first stacked structure 6a and the second stacked structure 6b. As such, each of the first and second stacked structures 6a and 6b may include a plurality of gate layers 12. Accordingly, each of the vertical memory structures 18a may include the first data storage structure 20a facing the plurality of gate layers 12 of the first stacked structure 6a, and the second data storage structure 20b facing the plurality of gate layers 12 of the second stacked structure 6b. As described above, the plurality of gate layers 12 may include a plurality of word lines.

Thus, in the case of each of the vertical memory structures 18a, a plurality of data storage areas capable of storing information may be formed in the data storage layer 23 of the second data storage structure 20a facing the plurality of gate layers 12 which may be word lines of the first stacked structure 6a, and a plurality of data storage areas capable of storing information may be formed in the data storage layer 23 of the second data storage structure 20b facing the plurality of gate layers 12 which may be word lines of the second stacked structure 6b. Accordingly, the plurality of data storage areas may be formed in each of the first and second data storage structures 20a and 20b, and such data storage areas may constitute memory cells. Therefore, since relatively more data storage areas may be formed in one vertical memory structure 18a, the degree of integration of the semiconductor device may be improved.

The components of the above-described exemplary embodiments are not limited to those of the above-described exemplary embodiments, and may be variously modified. Hereinafter, in describing various modified exemplary embodiments of some of these components, the description of the remaining components that are not modified and are substantially identical to those of the previously described embodiments will be omitted while describing the modified components. For example, in the foregoing embodiment, when "A component" and "B component" are described, and only a variation example of "the A component" is described in a modified example, even in the case in which there is no description or mention with respect to "the B component," it is to be understood that the modified example includes the "B component" along with the "modified A component".

Figure 2B:
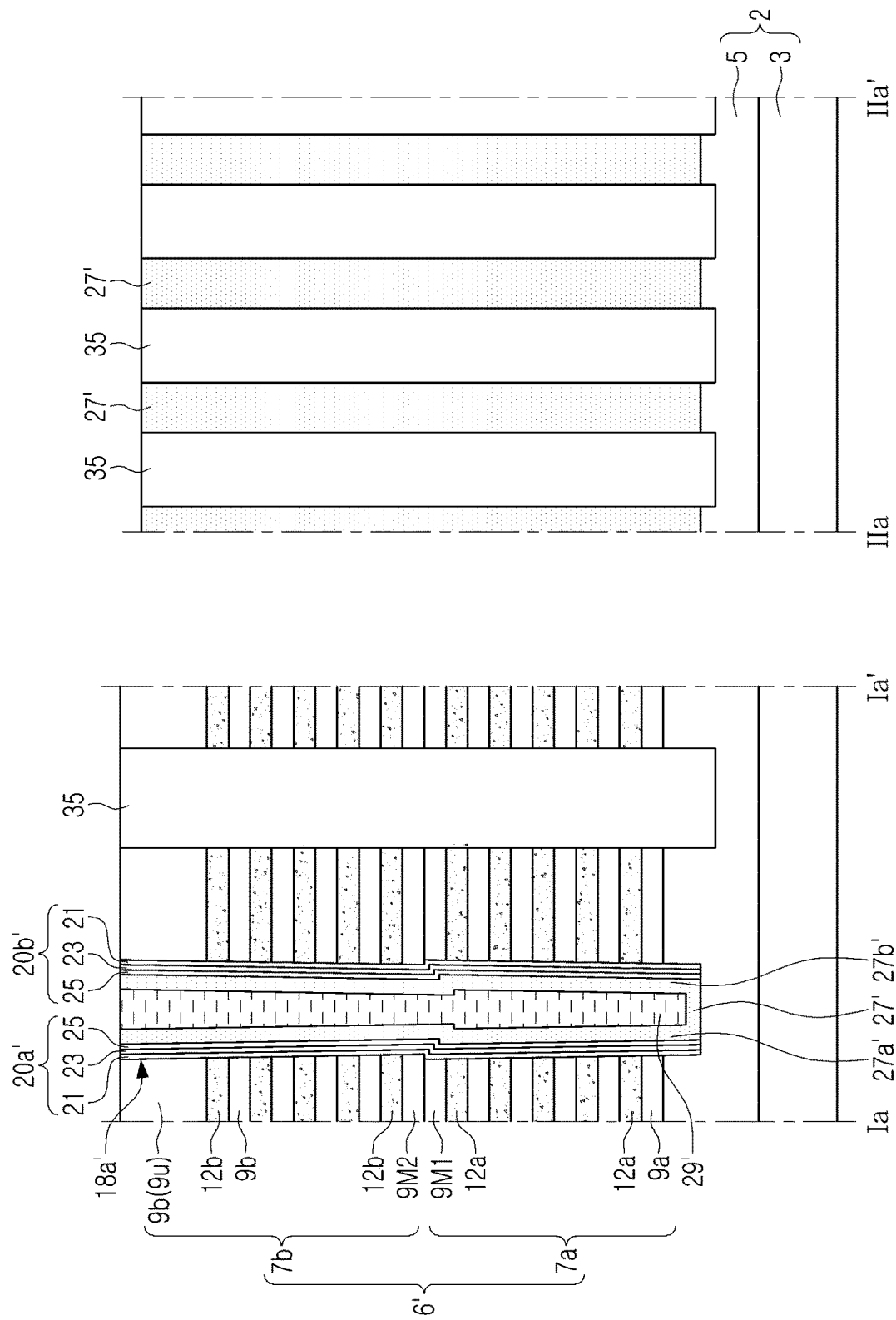
FIG. 2B is a cross-sectional view of a semiconductor device taken along lines Ia-Ia' and IIa-IIa' of FIG. 1 according to exemplary embodiments of the present inventive concepts.

Next, modified examples of the vertical memory structure 18a and the stacked structure 6 described above with respect to the exemplary embodiments of FIGS. 1 and 2A will be described with reference to FIG. 2B. FIG. 2B is a cross-sectional view taken along lines Ia-Ia' and IIa-IIa' of FIG. 1.

Referring to the exemplary embodiment of FIG. 2B, a stacked structure 6' may include a lower stacked structure 7a and an upper stacked structure 7b disposed on the lower stacked structure 7a (e.g., in the Z direction). The lower stacked structure 7a may include first interlayer insulating layers 9a and first gate layers 12a alternately and repeatedly stacked. An uppermost layer (e.g., in the Z direction) of the first interlayer insulating layers 9a and the first gate layers 12a may be a first intermediate interlayer insulating layer 9M1. The upper stacked structure 7b may include a second interlayer insulating layers 9b and second gate layers 12b that are alternately and repeatedly stacked. An uppermost layer (e.g., in the Z direction) of the second interlayer insulating layers 9b and the second gate layers 12b may be an uppermost interlayer insulating layer 9U, and a lowermost layer thereof may be a second intermediate interlayer insulating layer 9M2. As shown in the exemplary embodiment of FIG. 2B, a lower surface of the second intermediate interlayer insulating layer 9M2 may directly contact an upper surface of the first intermediate interlayer insulating layer 9M1.

Vertical memory structures 18a' and separation structures 35 may be disposed to penetrate through the stacked structure 6' (e.g., in the Z direction). The separation structures 35 may be substantially the same as the separation structures 35 described above with respect to the exemplary embodiments of FIGS. 1 and 2A.

The planar shape (e.g., in a plane defined by the X direction and the Y direction) of the vertical memory structures 18a' and the separation structures 35 may be substantially the same as the planar shape of the vertical memory structures (see 18a in FIG. 1) and the separation structures 35 described above in the exemplary embodiments of FIGS. 1 and 2A.

Each of the vertical memory structures 18a' may include a first data storage structure 20a', a second data storage structure 20b', a channel semiconductor layer 27' and a core region 29', corresponding to the first data storage structure (see 20a of FIGS. 1 and 2A), the second data storage structure (see 20b of FIGS. 1 and 2A), the channel semiconductor structure (see 27 of FIGS. 1 and 2A), and the core region (see 29 of FIGS. 1 and 2A), respectively. The channel semiconductor structure 27' may include first and second channel semiconductor layers 27a' and 27b' corresponding to the first and second channel semiconductor layers 27a and 27b described above with reference to the exemplary embodiments of FIGS. 1 and 2A, respectively.

Each of the vertical memory structures 18a' may include a lower vertical memory portion penetrating through the lower stacked structure 7a and an upper vertical memory portion penetrating through the upper stacked structure 7b. In the vertical memory structures 18a', an upper width (e.g., length in the Y direction) of the lower memory vertical portion penetrating through the lower stacked structure 7a may be greater than a lower width of the upper memory vertical portion penetrating through the upper stacked structure 7b. For example, the width of the lower memory vertical portion that penetrates through the first intermediate interlayer insulating layer 9M1 may have a width that is greater than the upper memory vertical portion that penetrates through the second intermediate interlayer insulating layer 9M2. In an exemplary embodiment, the width of the lower memory vertical portion penetrating through the lower stacked structure 7a may increase as the distance (e.g., in the Z direction) from the lower structures 2 increases and the width of the upper memory vertical portion penetrating through the upper stacked structure 7b may increase as the distance (e.g., in the Z direction) from the lower structures 2 increases.

Figure 2C:
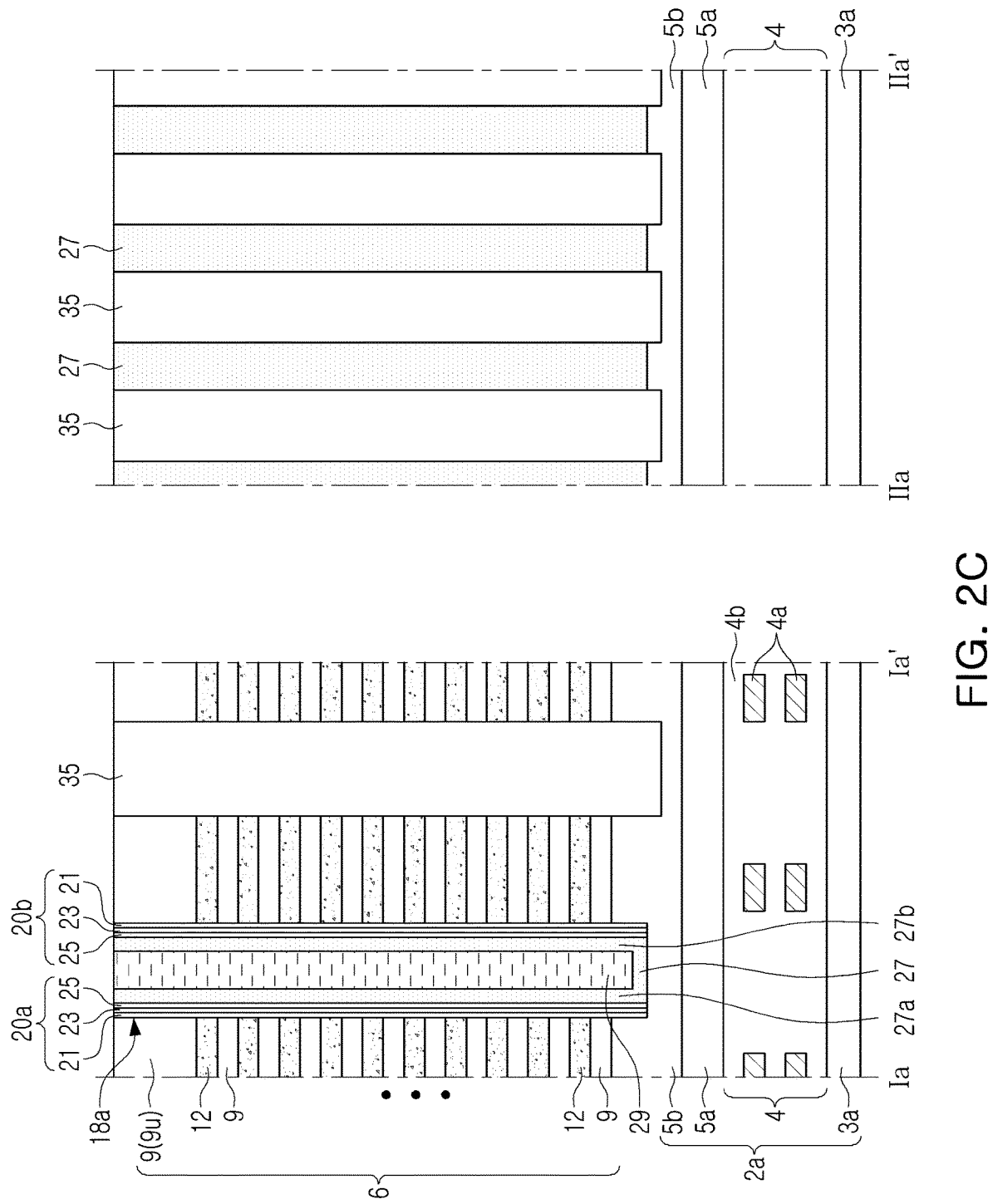
FIG. 2C is a cross-sectional view of a semiconductor device taken along lines Ia-Ia' and IIa-IIa' of FIG. 1 according to exemplary embodiments of the present inventive concepts.

Next, a modified example of the lower structure 2 described above will be described with reference to the exemplary embodiment of FIG. 2C. FIG. 2C is a cross-sectional view illustrating regions taken along lines Ia-Ia' and IIa-IIa' in FIG. 1.

In a modified embodiment, referring to the exemplary embodiment of FIG. 2C, a lower structure 2a may include a lower substrate 3a, an upper substrate Sa disposed on the lower substrate 3a (e.g., in the Z direction), a peripheral circuit region 4 disposed between the lower substrate 3a and the upper substrate 5a (e.g., in the Z direction), and an impurity region 5b disposed on the upper substrate Sa (e.g., in the Z direction). In an exemplary embodiment, the lower substrate 3a may be a semiconductor substrate that may be formed of a semiconductor material such as silicon. The peripheral circuit region 4 may include peripheral wirings 4a that may constitute a peripheral circuit, and a lower insulating layer 4b covering the peripheral wirings 4a and extending between the lower substrate 3a and the upper substrate 5a. In an exemplary embodiment, the upper substrate Sa may include a conductive material layer including a metal material. For example, the upper substrate 5a may include a metal and/or metal silicide. For example, the upper substrate 5a may be formed of a conductive material layer including tungsten and tungsten silicide on the tungsten. The impurity region Sb may be formed of polysilicon having an N-type conductivity.

Figure 2D:
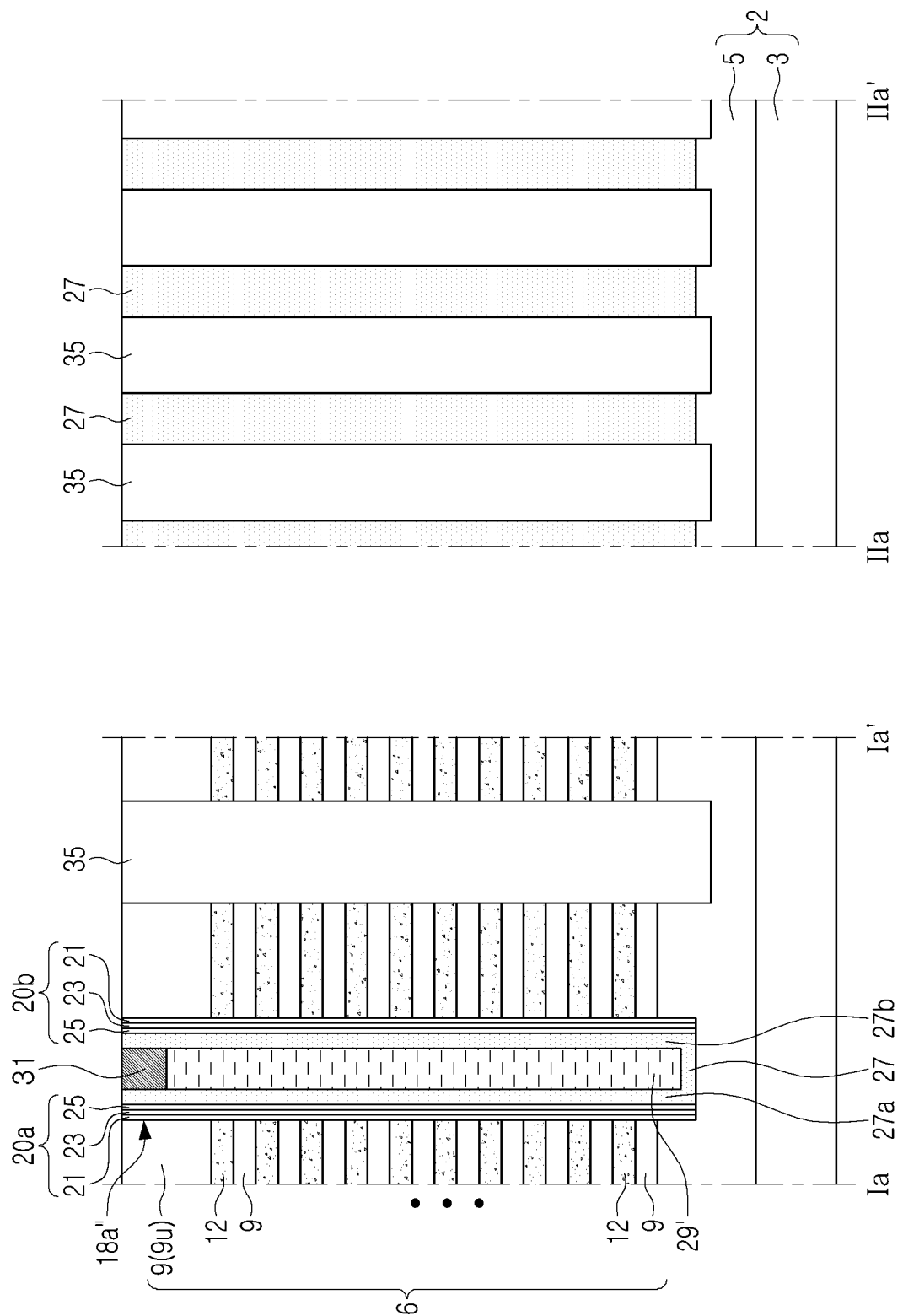
FIG. 2D is a cross-sectional view of a semiconductor device taken along lines Ia-Ia' and IIa-IIa' of FIG. 1 according to exemplary embodiments of the present inventive concepts.

Next, a modified example of the vertical memory structure 18a described above will be described with reference to the exemplary embodiment of FIG. 2D. FIG. 2D is a cross-sectional view illustrating the semiconductor device taken along lines Ia-Ia' and IIa-IIa' in FIG. 1.

In a variant, with reference to FIG. 2D, the vertical memory structure 18a" may include the first and second data storage structures 20a and 20b and the channel semiconductor structure 27 as described above. The vertical memory structure 18a" may further include a core region 29' and a pad pattern 31 stacked on the core region 29' (e.g., in the Z direction). For example, as shown in the exemplary embodiment of FIG. 2D, a lower surface of the pad pattern 31 may directly contact an upper surface of the core region 29. In an exemplary embodiment, the pad pattern 31 may be formed of polysilicon. For example, the pad pattern 31 may be formed of polysilicon having an N-type conductivity. The pad pattern 31 may contact the channel semiconductor structure 27. The channel semiconductor structure 27 may include the first channel semiconductor layer 27a and the second channel semiconductor layer 27b described above.

In an exemplary embodiment, the core region 29' may be referred to as a "bottom core region" and the pad pattern 31 may be referred to as an "upper core region". For example, the lower core region 29' and the upper core region 31 may penetrate through the stacked structure 6 (e.g., in the Z direction).

Some of the components using the term 'core region' described below may be replaced with the insulating lower core region 29' and the upper core region 31 having an N-type conductivity as described in the exemplary embodiment of FIG. 2D.

Figure 3A:
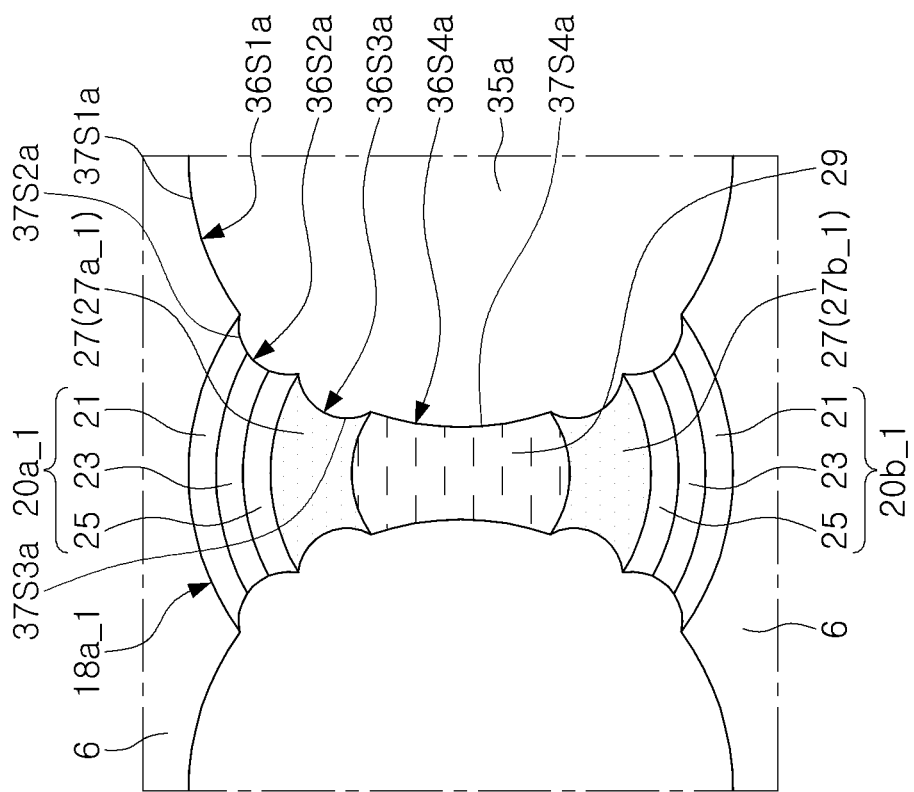
FIG. 3A is an enlarged plan view of a semiconductor device according to an exemplary embodiment of the present inventive concepts.
Figure 3A:
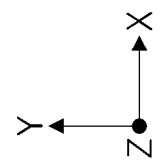
Figure 3B:
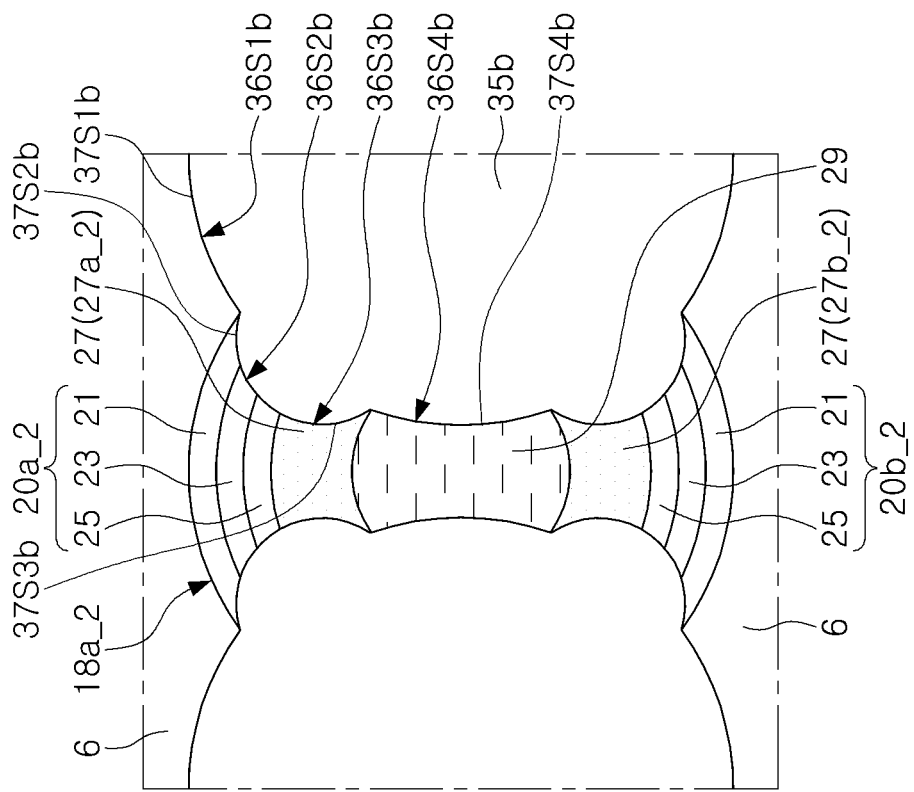
FIG. 3B is an enlarged plan view of a semiconductor device according to an exemplary embodiment of the present inventive concepts.
Figure 3B:
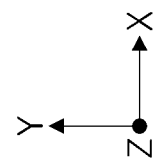
Figure 3C:
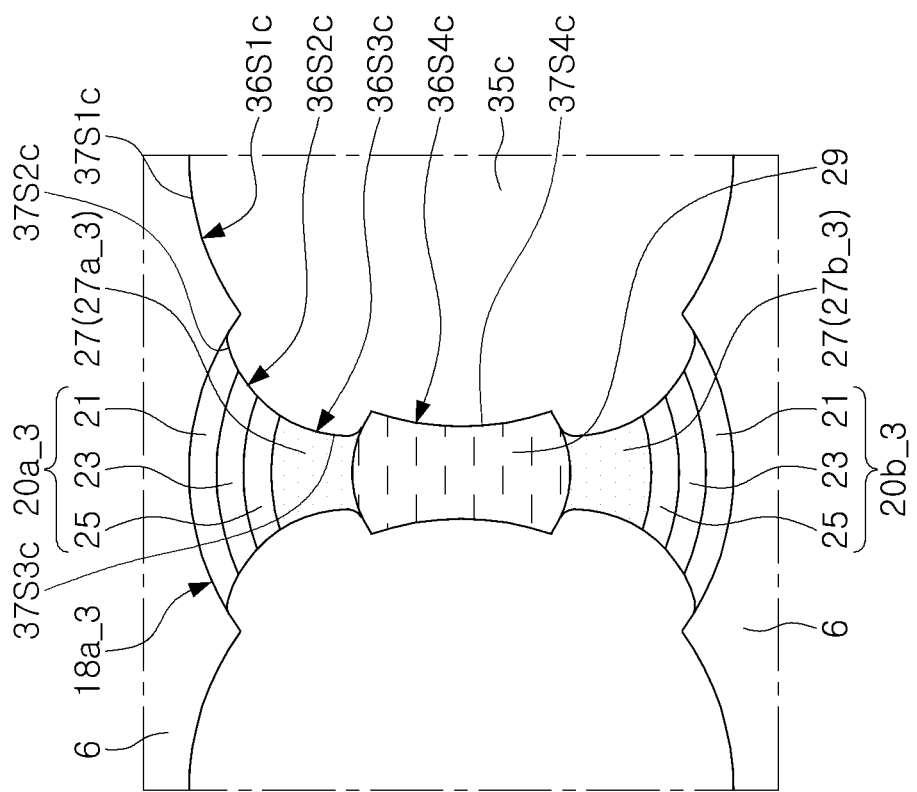
FIG. 3C is an enlarged plan view of a semiconductor device according to an exemplary embodiment of the present inventive concepts.

Modified examples of the vertical memory structures 18a and the separation structures 35 described above will be described with reference to the exemplary embodiments of FIGS. 3A, 3B, and 3C, respectively. FIGS. 3A, 3B, and 3C are partially enlarged plan views illustrating a pair of separation structures adjacent to each other and one vertical memory structure located between the pair of separation structures to illustrate various modifications of the semiconductor device according to the example. Therefore, in the following description with reference to the exemplary embodiments of FIGS. 3A, 3B, and 3C, a vertical memory structure and a pair of separation structures will be described that are modified from the vertical memory structure and separation structures shown in the exemplary embodiment of FIG. 1.

Referring to the exemplary embodiment of FIG. 3A, one vertical memory structure 18a_1 may be disposed between a pair of separation structures 35a in contact with the pair of separation structures 35a (e.g., in the X direction). As described above, the vertical memory structure 18a_1 includes a first data storage structure 20a_1 and a second data storage structure 20b_1 spaced apart from each other in the Y direction, a first channel semiconductor layer 27a_1 and a second channel semiconductor layer 27b_1 disposed between the first and second data storage structures 20a_1 and 20b_1 and spaced apart from each other in the Y direction, and a core region 29 disposed between the first and second channel semiconductor layers 27a_1 and 27b_1). Each of the first and second data storage structures 20a_1 and 20b_1 may include the first dielectric layer 21, the data storage layer 23, and the second dielectric layer 25 described above.

Each of the separation structures 35a may have a first side 36S1a in contact with the stacked structure 6 and a second side surface 36S2a in contact with the first and second data storage structures 20a_1, 20b_1. A third side surface 36S3a may contact the first and second channel semiconductor layers 27a_1 and 27b_1, and a fourth side surface 36S4a may contact the core region 29.

The stacked structure 6 may have a first side surface 37S1a that is concave in a direction facing the separation structures 35a and may form a first concave side surface. The second side surface 37S2a of each of the first and second data storage structures 20a_1 and 20b_1 may be concave in a direction facing the separation structures 35a and may form a second concave side surface. The third side surface 37S3a of each of the first and second channel semiconductor layers 27a_1 and 27b_1 may be concave in a direction facing the separation structures 35a and may form a third concave side surface. The fourth side surface 37S4a of the core region 29 may be concave in a direction facing the separation structures 35a and may form a fourth concave side surface. The first side surface 36S1a and the second side surface 36S2a may have a protruding shape, such as a convex shape. The second side surface 36S2a and the third side surface 36S3a may have a protruding shape, such as a convex shape. The third side surface 36S3a and the fourth side surface 36S4a may have a protruding shape, such as a convex shape.

With reference to the exemplary embodiment of FIG. 3B, in one vertical memory structure 18a_2 between a pair of separation structures 35b, the vertical memory structure 18a_2 may include a first data storage structure 20a_2, a first channel semiconductor layer 27a_2, a core region 29, a second channel semiconductor layer 27b_2 and a second data storage structure 20b_2 as described in the exemplary embodiment of FIG. 3A.

The stacked structure 6 may have a first side surface 37S1b facing a first side surface 36S1b of the separation structures 35b that is concave and may form a first concave side surface. Each of the first and second data storage structures 20a2 and 20b_2 may have a second side surface 37S2b facing a second side surface 36S2b of the separation structures 35b that is concave and may form a second concave side surface. Each of the first and second channel semiconductor layers 27a_2 and 27b2 may have a third side surface 37S3b facing a third side surface 36S3b of the separation structures 35b that is concave and may form a third concave side surface. The core region 29 may have a fourth side surface 37S4b facing a fourth side surface 36S4b of the separation structures 35b that is concave and may form a fourth concave side surface. The first side surface 36S1b of the separation structures 35b may have a protruding shape, such as a convex shape. The second side surface 36S2b and the third side surface 36S3b of the separation structures 35b may have a protruding shape. The second side surface 36S2b and the third side surface 36S3b of the separation structures 35b may together form a convex shape. The fourth side surface 36S4b of the separation structures 35b may have a protruding shape.

Referring to the exemplary embodiment shown in FIG. 3C, in the case of one vertical memory structure 18a_3 between a pair of separation structures 35c, the vertical memory structure 18a_3 may include a first data storage structure 20a_3, a first channel semiconductor layer 27a_3, a core region 29, a second channel semiconductor layer 27b_3, and a second data storage structure 20b3 similarly to the description of the exemplary embodiment of FIG. 3A.

The stacked structure 6 may have a first side surface 37S1c facing a first side surface 36S1c of the separation structures 35c that is concave and forms a first concave side surface. Each of the first and second data storage structures 20a_3 and 20b_3 may have a second side surface 37S2c facing a second side surface 36S2c of the separation structures 35c that is concave and forms a second concave surface. Each of the first and second channel semiconductor layers 27a_3 and 27b_3 may have a third side surface 37S3c facing a third side surface 36S3c of the separation structures 35c that is concave and forms a third concave surface. The core region 29 may have a fourth side surface 37S4c facing a fourth side surface 36S4c of the separation structures 35c that is concave and forms a fourth concave surface. The second side surface 37S2c and the third side surface 37S3c may together form a concave shape. The second side surface 37S2c of the first and second data storage structures 20a_3 and 20b_3, and the third side surface 37S3c of the first and second channel semiconductor layers 27a_3 and 27b_3 may formed a concave shape that is further recessed than the first side surface 37S1c of the stacked structure 6 and the fourth side surface 37S4c of the core region 39.

Figure 4A:
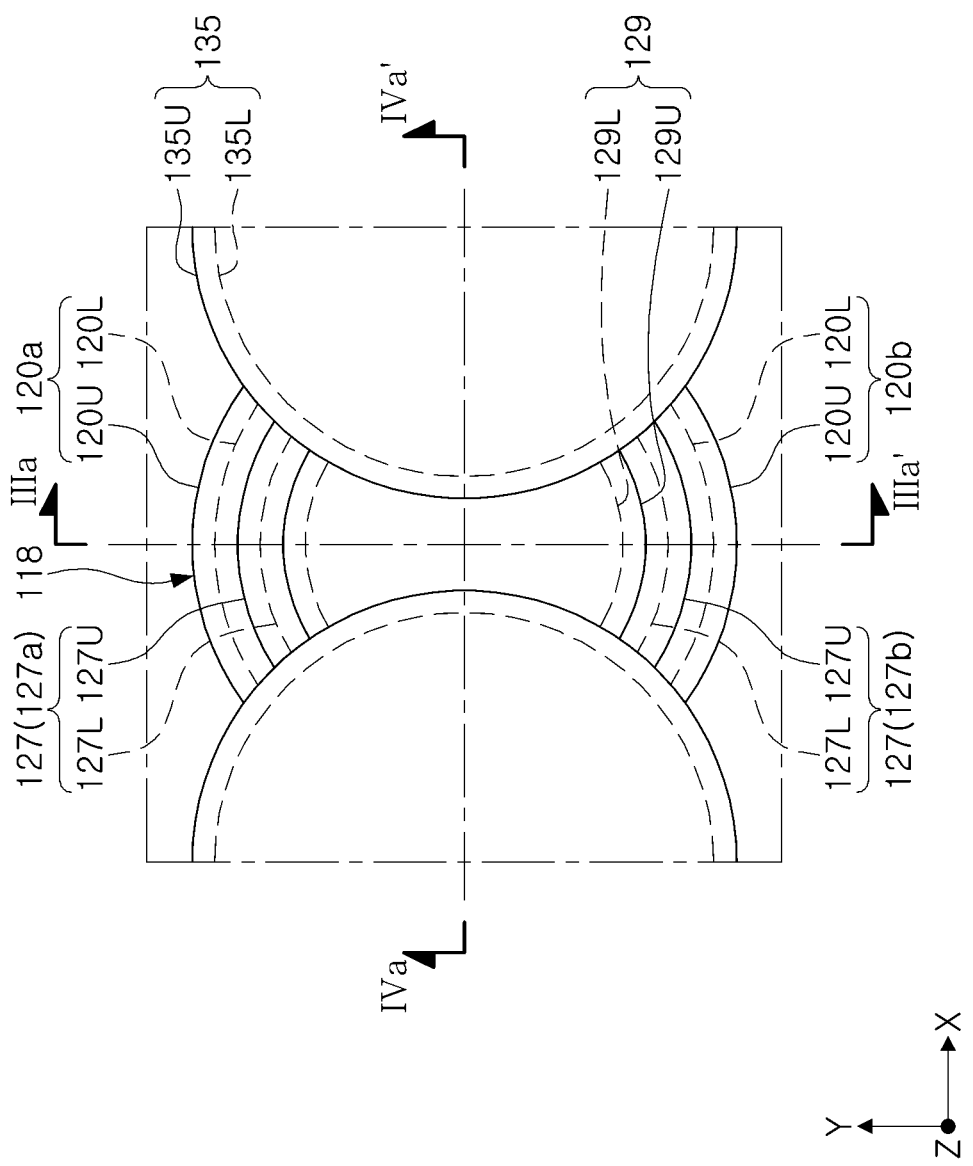
FIG. 4A is an enlarged plan view of a semiconductor device according to an exemplary embodiment of the present inventive concepts.
Figure 4B:
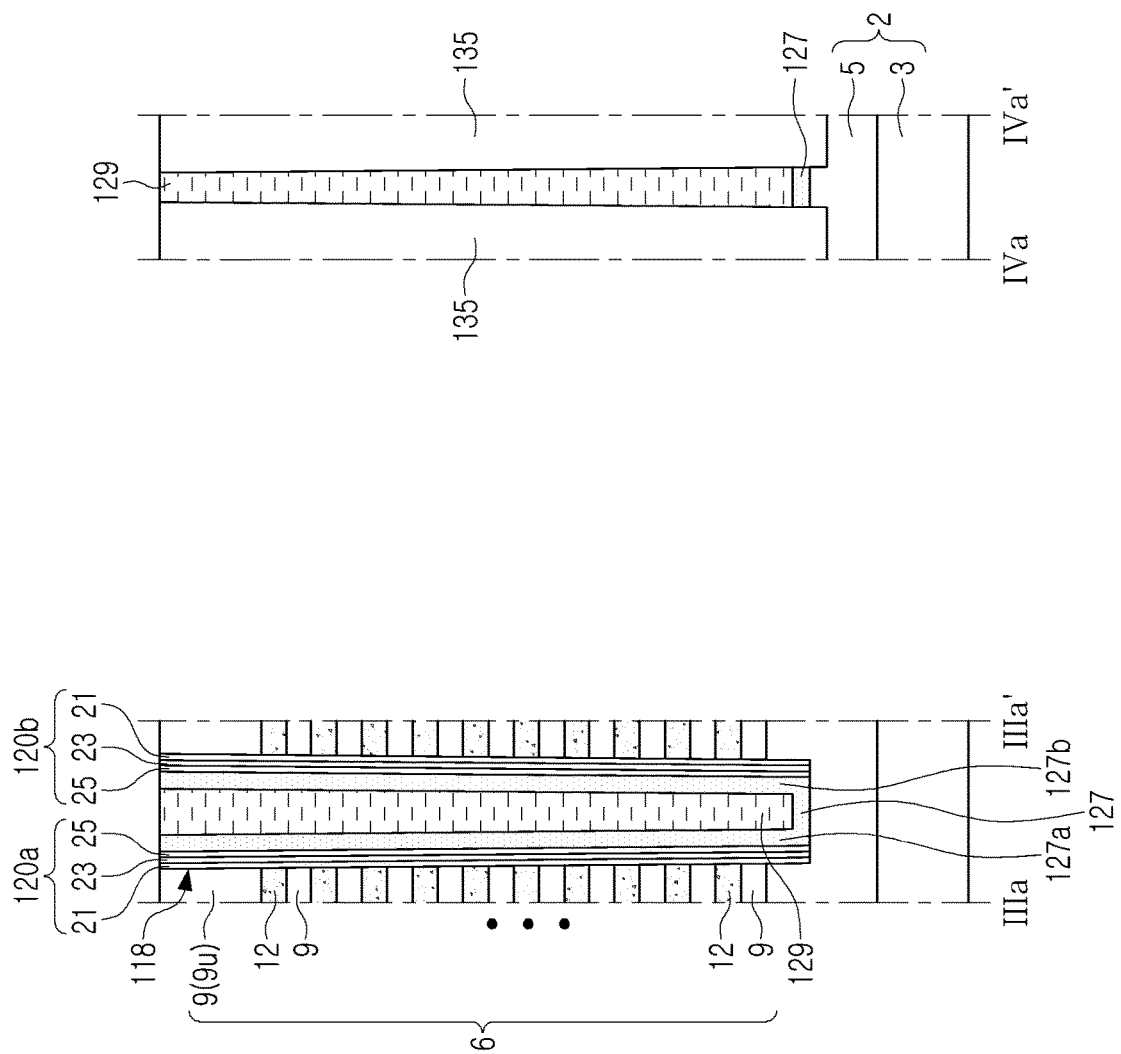
FIG. 4B is a cross-sectional view of a semiconductor device taken along lines IIIa-IIIa' and IVa-IVa' of FIG. 4A according to an exemplary embodiment of the present inventive concepts

FIGS. 4A and 4B are diagrams illustrating a modified example of a semiconductor device according to exemplary embodiments of the present inventive concepts. FIG. 4A is a plan view illustrating a pair of separation structures adjacent to each other and a vertical memory structure positioned between a pair of separation structures to illustrate a modified example of the semiconductor device according to an exemplary embodiment. FIG. 4A is an enlarged plan view, and FIG. 4B is a cross-sectional view illustrating a region taken along lines IIIa-IIIa' and IVa-IVa' of FIG. 4A.

Referring to the exemplary embodiments of FIGS. 4A and 4B, in the case of one vertical memory structure 118 between a pair of separation structures 135, the vertical memory structure 118 may include a first data storage structure 120a, a first channel semiconductor layer 127a, a core region 129, a second channel semiconductor layer 127b, and a second data storage structure 120b, corresponding to the first data storage structure (see 20A of FIGS. 1 and 2A), the first channel semiconductor layer (see 27a of FIGS. 1 and 2A), the core region (see 29 of FIGS. 1 and 2A), the second channel semiconductor layer (see 27b of FIGS. 1 and 2A) and the second data storage structure (see 20b of FIGS. 1 and 2A), respectively. The first and second channel semiconductor layers 127a and 127b may constitute a channel semiconductor structure 127.

In the exemplary embodiment of FIG. 4A, reference numeral 120U indicates an outer surface of the upper end (e.g., in the Z direction) of the first data storage structure 120*a*, reference numeral 120L may indicate an outer surface of the lower end (e.g., in the Z direction) of the first data storage structure 120*a*, reference numeral 127U may denote an outer surface of the upper end (e.g., in the Z direction) of the channel semiconductor structure 127, reference numeral 127L may indicate an outer surface of the lower end (e.g., in the Z direction) of the channel semiconductor structure 127, reference numeral 129U may indicate an outer surface of the upper end (e.g., in the Z direction) of the core region 129, and reference numeral 129L may represent an outer surface of the lower end (e.g., in the Z direction) of the core region 129.

Thus, in the vertical memory structure 118, a width of the upper surface of the vertical memory structure 118 in the Y direction may be greater than the width of the lower surface of the vertical memory structure 118 in the Y direction. The vertical memory structure 118 may have an inclined side surface in such a manner that the width in the Y direction increases towards the upper portion of the vertical memory structure 118.

In FIG. 4A, reference numeral 135U may indicate a side surface of an upper end (e.g., in the Z direction) of each of the separation structures 135, and reference numeral 135L may indicate a side surface of a lower end (e.g., in the Z direction) of each of the separation structures 135. Therefore, in each of the separation structures 135, the width in the Y direction of the upper surface may be greater than the width of the lower surface. Each of the separation structures 135 may have an inclined side surface that increases in width towards the top.

Figure 5A:
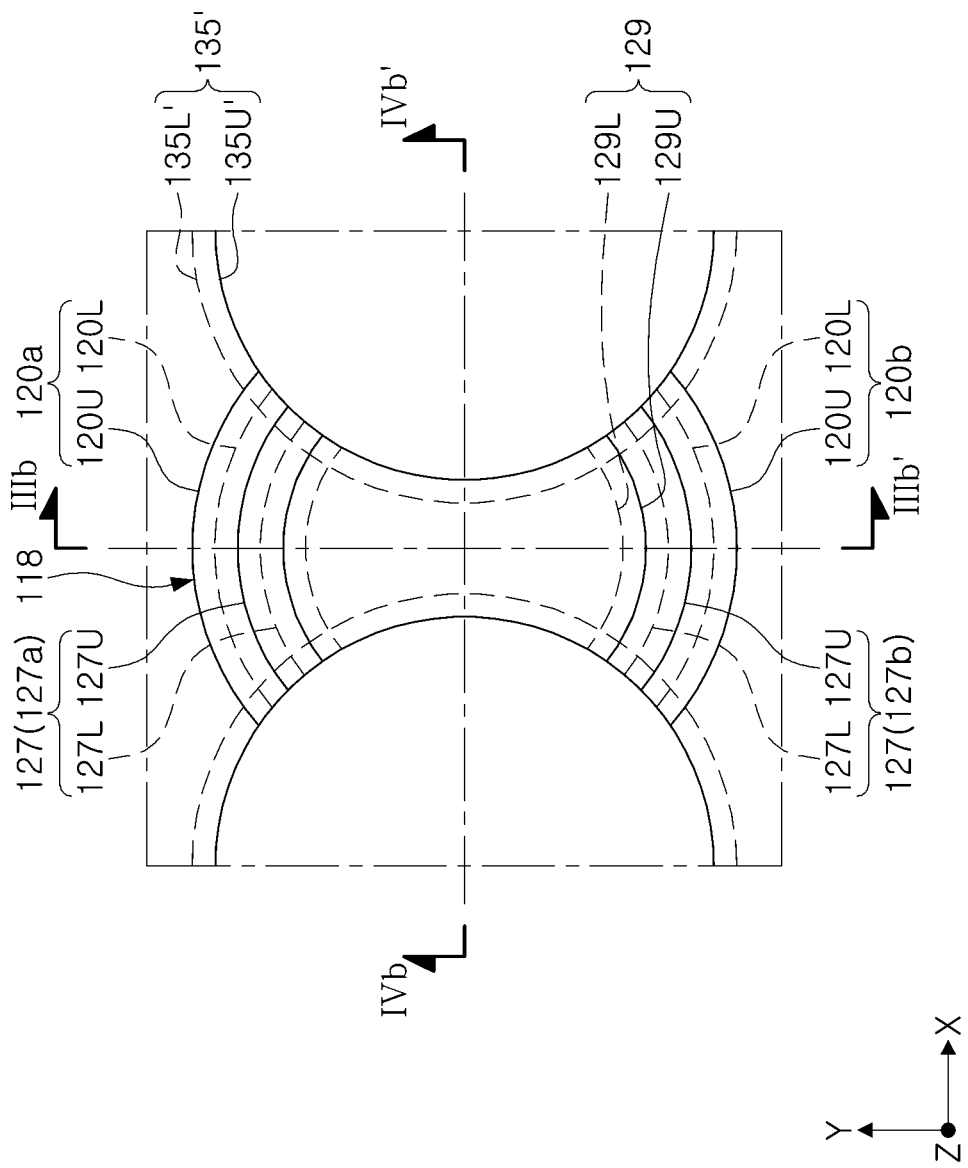
FIG. 5A is an enlarged plan view of a semiconductor device according to an exemplary embodiment of the present inventive concepts.
Figure 5B:
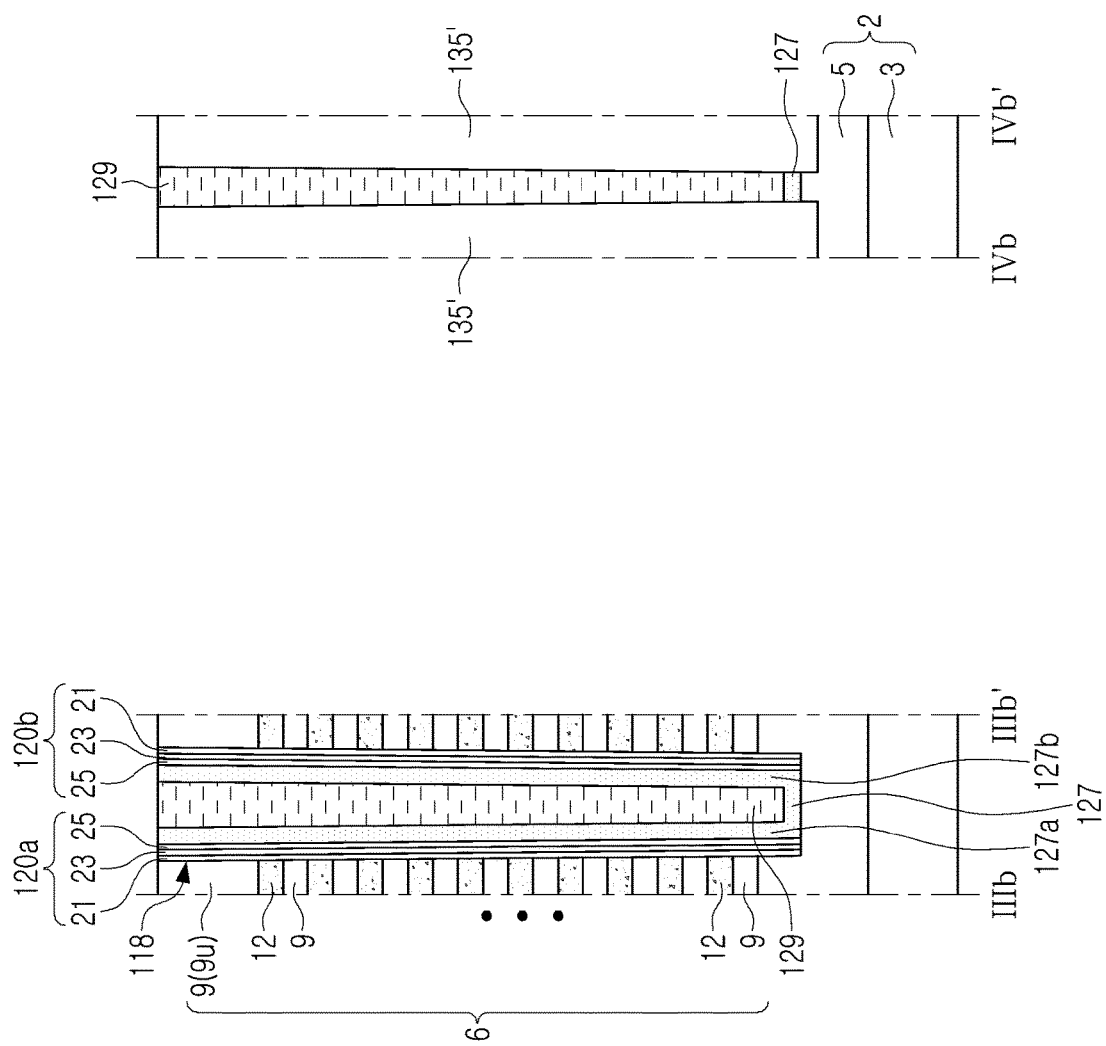
FIG. 5B is a cross-sectional view of a semiconductor device taken along lines IIIb-IIIb and IVb-IVb' of FIG. 5A according to an exemplary embodiment of the present inventive concepts.

FIGS. 5A and 5B are diagrams illustrating a modified example of a semiconductor device according to exemplary embodiments of the present inventive concepts. FIG. 5A is a partially enlarged plan view illustrating a pair of separation structures adjacent to each other and a memory vertical structure positioned between the pair of separation structures to illustrate a modification of the semiconductor device according to an exemplary embodiment. FIG. 5B is a cross-sectional view illustrating a region taken along lines IIIb-IIIb' and IVb-IVb' of FIG. 5A.

Referring to the exemplary embodiments of FIGS. 5A and 5B, the vertical memory structure 118 as described in FIG. 4A may be disposed between a pair of separation structures 135'. In FIG. 5A, reference numeral 135U' may represent a side of an upper end (e.g., in the Z direction) of each of the separation structures 135', and reference 135L' may represent a side of a lower end (e.g., in the Z direction) of each of the separation structures 135'. Each of the separation structures 135' may include a lower portion and an upper portion on the lower portion. A width of the lower portion of each of the separation structures 135' may be greater than a width of the upper portion of each of the separation structures 135'. Thus, in each of the separation structures 135', the width of the upper surface may be smaller than the width of the lower surface. Each of the separation structures 135' may have an inclined side to decrease in width toward the top.

Figure 6A:
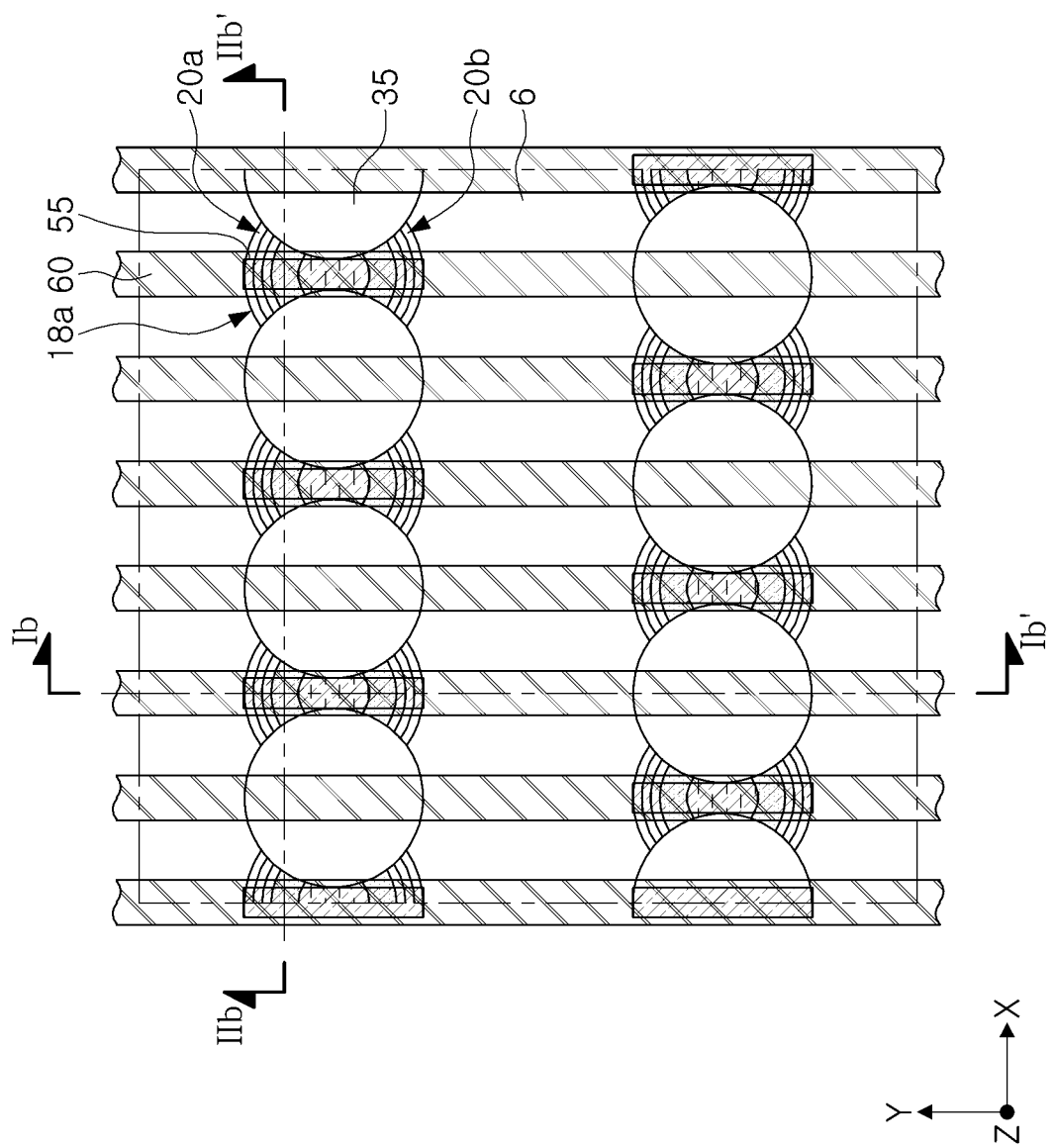
FIG. 6A is a plan view of a semiconductor device according to an exemplary embodiment of the present inventive concepts.
Figure 6B:
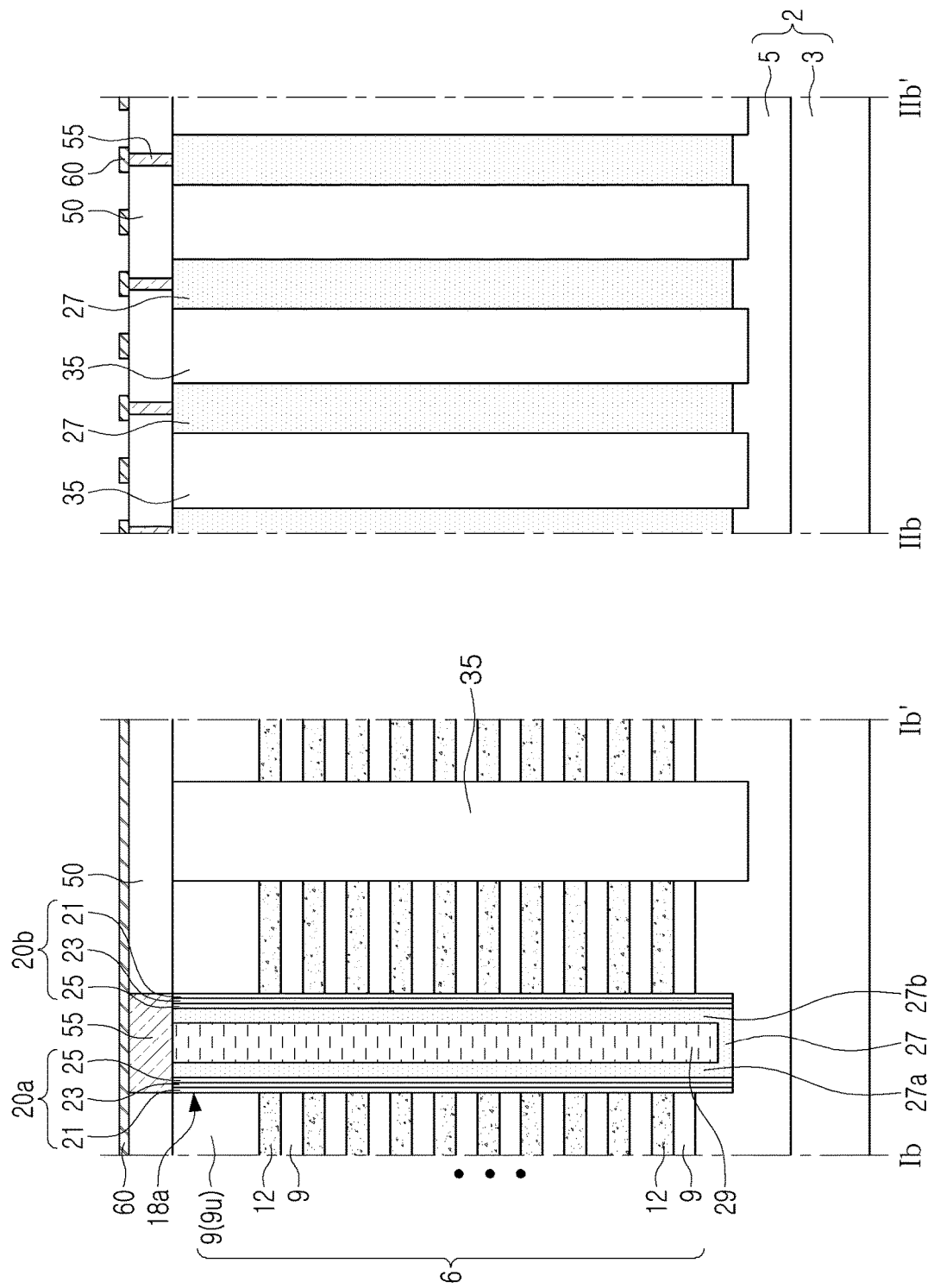
FIG. 6B is a cross-sectional view of a semiconductor device taken along lines IIb-IIb and Ib-Ib' of FIG. 6A according to an exemplary embodiment of the present inventive concepts.

An example of a semiconductor device according to an exemplary embodiment will be described with reference to FIGS. 6A and 6I. FIG. 6A is a plan view further including a contact plug 55 and a conductive line 60 in the plan view of FIG. 1, and FIG. 6B is a cross-sectional view illustrating an upper insulating layer 50, the contact plug 55, and the conductive line 60 in the cross-sectional view of FIG. 2A. FIG. 6B is a cross-sectional view illustrating a region taken along lines Ib-Ib' and IIb-IIb' of FIG. 6A.

Referring to the exemplary embodiments of FIGS. 6A and 6B, together with FIGS. 1 and 2A described above, the upper insulating layer 50 may be disposed on the stacked structure 6, the vertical memory structure 18*a*, and the separation structure 35 (e.g., in the Z direction). The contact plug 55 may penetrate through the upper insulating layer 50 (e.g., in the Z direction) and may be electrically connected to the first and second channel semiconductor layers 27*a* and 27*b*. The conductive line 60 may be disposed on the upper insulating layer 50 to be electrically connected to the contact plug 55. For example, a lower surface of the conductive line 60 may directly contact upper surfaces of the upper insulating layer 50 and the contact plug 55. Accordingly, the conductive line 60 may be electrically connected to the first and second channel semiconductor layers 27*a* and 27*b* through the contact plug 55.

In an exemplary embodiment, the impurity region 5 of the lower structure 2 may be a common source line, and the conductive line 60 may be a bit line. However, exemplary embodiments of the present inventive concepts are not limited thereto.

Figure 7A:
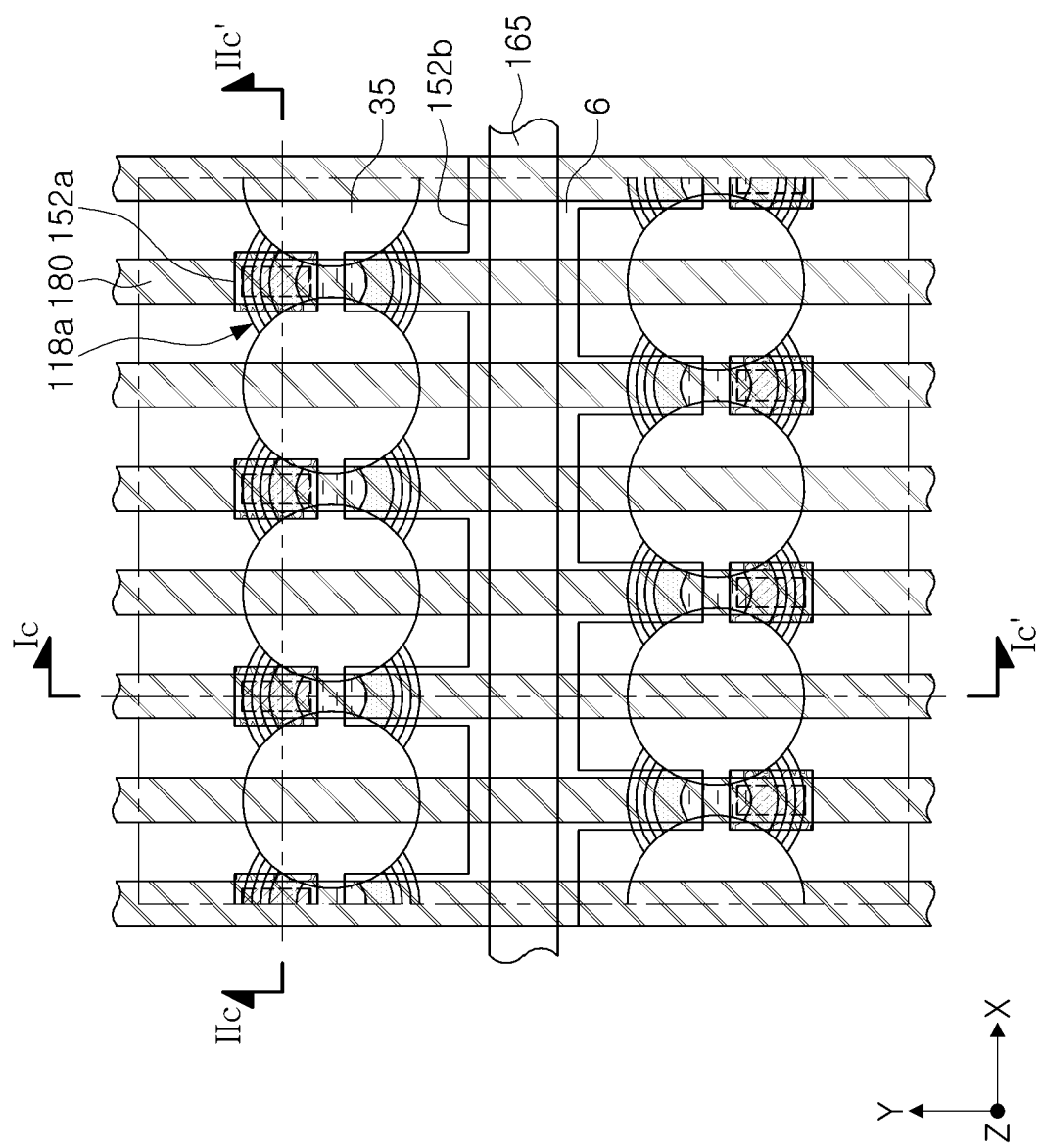
FIG. 7A is a plan view of a semiconductor device according to an exemplary embodiment of the present inventive concepts.

A modified example of the semiconductor device according to exemplary embodiments of the present inventive concepts will be described with reference to FIGS. 7A and 7B. FIG. 7A is a plan view illustrating a modified semiconductor device according to an exemplary embodiment of the present inventive concepts, and FIG. 7B is a cross-sectional view illustrating a region taken along lines Ic-Ic' and IIc-IIc' of FIG. 7A according to an exemplary embodiment of the present inventive concepts.

Figure 7B:
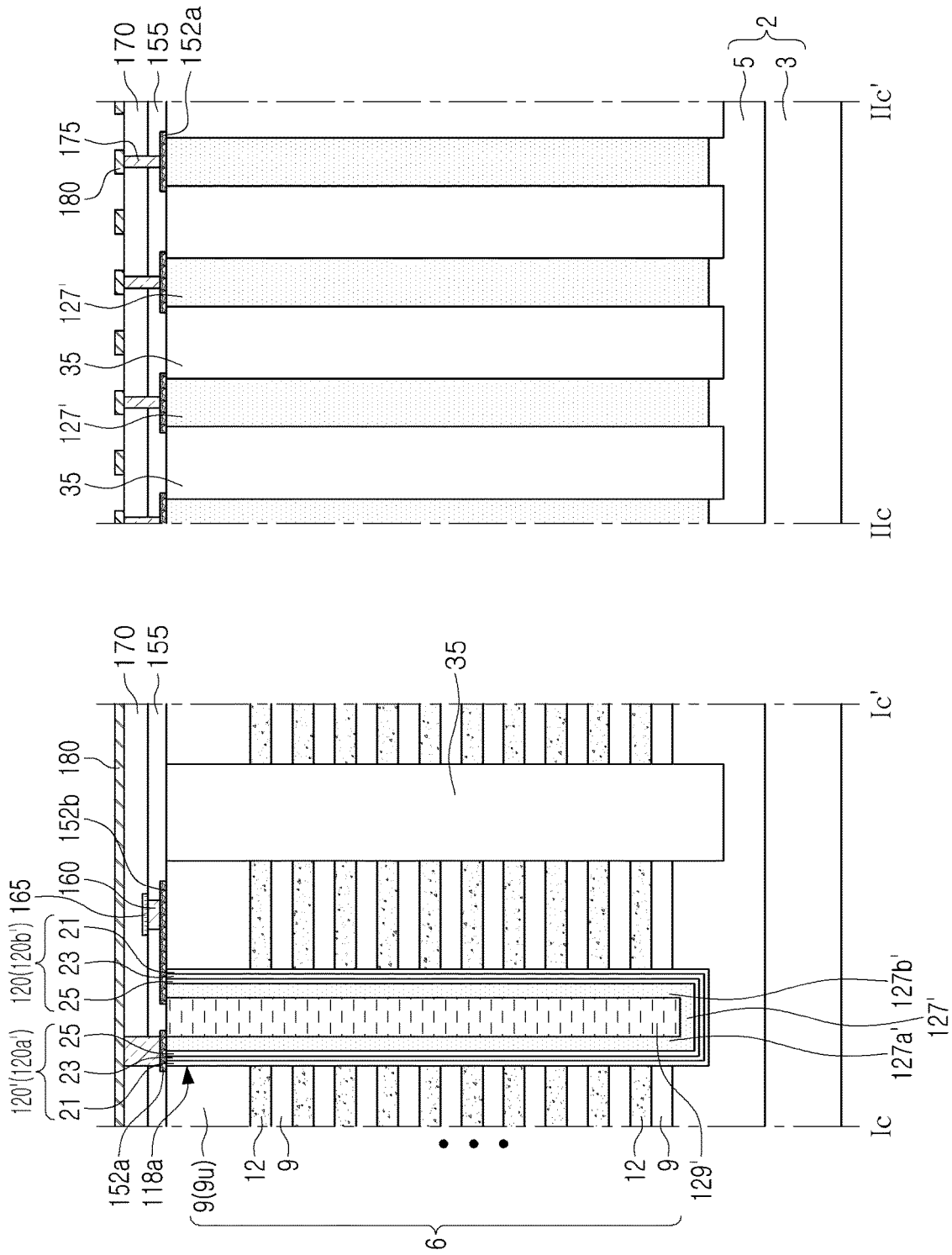
FIG. 7B is a cross-sectional view of a semiconductor device taken along lines Ic-Ic' and IIc-IIc' of FIG. 7A according to an exemplary embodiment of the present inventive concepts.

Referring to the exemplary embodiments of FIGS. 7A and 7B, the stacked structure 6 including the interlayer insulating layers 9 and the gate layers 12 as described in the exemplary embodiment of FIG. 2A may be disposed on the lower structure 2 (e.g., in the Z direction).

Vertical memory structures 118*a* may be disposed to penetrate through the stacked structure 6 (e.g., in the Z direction). Each of the vertical memory structures 118*a* may include a core region 129' at least penetrating through the gate layers 12, a data storage structure 120' covering a bottom surface and lateral side surfaces of the core region 129', and a channel semiconductor layer 127' disposed between the data storage structure 120' and the core region 129'. The data storage structure 120' may include the same first dielectric layer 21, data storage layer 23 and second dielectric layer 25 as those described above.

The channel semiconductor structure 127' may have a "U" shape when viewed in a cross-section labeled Ic-Ic' in FIG. 7B. Accordingly, the channel semiconductor structure 127' may include a first channel semiconductor layer 127*a*' and a second channel semiconductor layer 127*b*' facing each other with the core region 129' interposed therebetween and a lower surface below the lower surface of the core region 129'.

The data storage structure 120' may include a first data storage structure 120*a*' and a second data storage structure 120*b*' facing each other with the core region 129' therebetween and a lower surface below the lower surface of the channel semiconductor structure 127'. The data storage structure 120' may have a "U" shape covering outer lateral side surfaces and a lower surface of the channel semiconductor structure 127' when viewed in a cross-section labeled Ic-Ic' in FIG. 7B. Thus, the data storage structure 120' may extend (e.g., in the Z direction) between the channel semiconductor structure 127' and the lower structure 2.

The separation structures 35 may be disposed to penetrate through the stacked structure 6 (e.g., in the Z direction). The separation structures 35 may be the same as those described with reference to the exemplary embodiments of FIGS. 1 and 2A. The planar shape or arrangement of the vertical memory structures 118a and the separation structures 35 may be substantially the same as those described with reference to the exemplary embodiments of FIGS. 1 and 2A.

First pads 152a and second pads 152b may be disposed on the stacked structure 6, the vertical memory structures 118a, and the separation structures 35. For example, lower surfaces of the first pads 152a and second pads 152b may directly contact upper surfaces of the stacked structures 6 and the vertical memory structures 118a.

Each of the first pads 152a may be electrically connected to the first channel semiconductor layer 127a' of each of the vertical memory structures 118a, and the second pad 152b may be electrically connected to the second channel semiconductor layers 127b' of the vertical memory structures 118a. Therefore, one second pad 152b may be electrically connected to the plurality of second channel semiconductor layers 127b'.

A first upper insulating layer 155 covering the first pads 152a and the second pad 152b, and a second upper insulating layer 170 may be disposed on the first upper insulating layer 155 (e.g., in the Z direction).

Contact plugs 175 penetrating through the first upper insulating layer 155 and the second upper insulating layer 170 and electrically connected to the first pads 152a may be disposed on the first pads 152a.

Conductive lines 180 may be disposed on the second upper insulating layer 170 (e.g., an upper surface of the second upper insulating layer 170) to be electrically connected to the contact plugs 175 and extend in the Y direction and are arranged in the X direction.

A contact pattern 160 penetrating through the first upper insulating layer 155 (e.g., in the Z direction) and electrically connected to the second pad 152b may be disposed on the second pad 152b. A conductive pattern 165 may be disposed on the first upper insulating layer to be electrically connected to the contact pattern 160.

In an exemplary embodiment, the conductive lines 180 may be bit lines, and the second pad 152b may be a common source line. The contact pattern 160 and the conductive pattern 165 provide the electrical connection relationship of the second pad 152b, and exemplary embodiments are not limited to the shapes disclosed in FIGS. 7A and 7B. For example, the contact pattern 160 and the conductive pattern 165 may be disposed on the second pad 152b in a region that does not overlap the conductive lines 180.

Figure 8A:
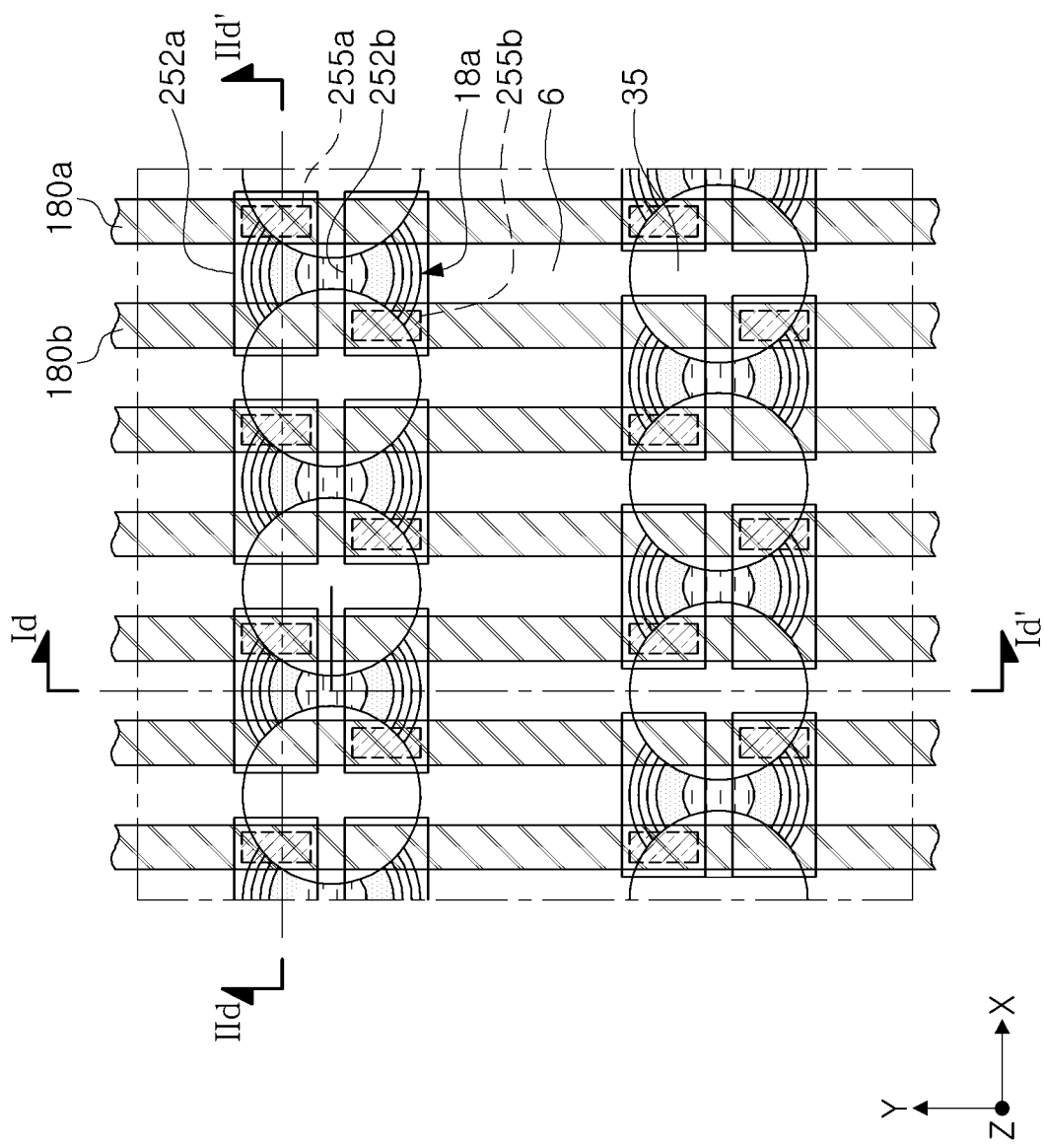
FIG. 8A is a plan view of a semiconductor device according to an exemplary embodiment of the present inventive concepts.
Figure 8B:
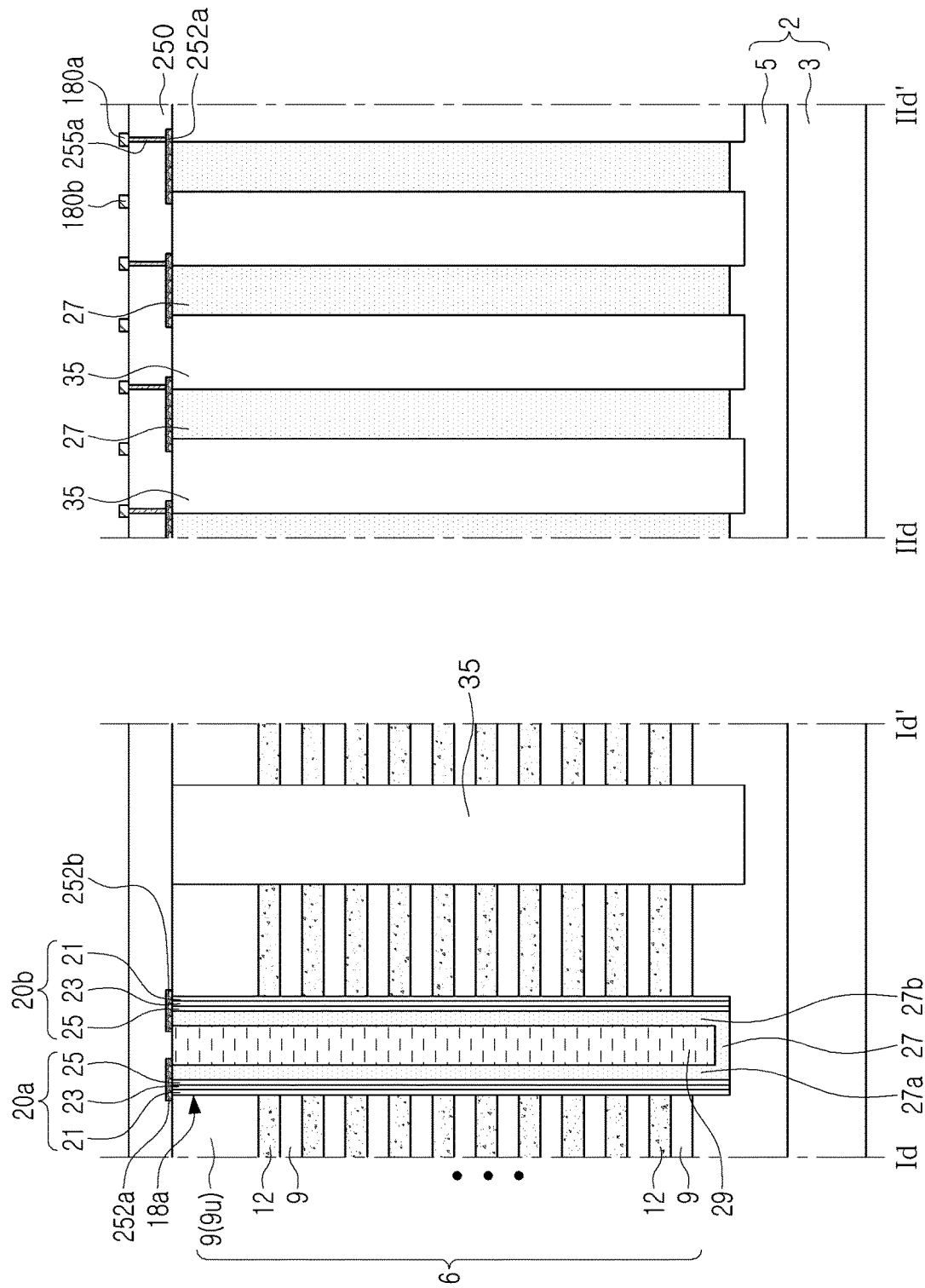
FIG. 8B is a cross-sectional view of a semiconductor device taken along lines Id-Id' and IId-IId' of FIG. 8A according to an exemplary embodiment of the present inventive concepts.

A modification of a semiconductor device according to an exemplary embodiment will be described with reference to FIGS. 8A and 8B. FIG. 8A is a plan view further including first pads 252a, second pads 252b, first contact plugs 255a, second contact plugs 255b, first conductive lines 180a and second conductive lines 180b in the plan view of FIG. 1. FIG. 8B is a cross-sectional view illustrating a region taken along lines Id-Id' and IId-IId' of FIG. 8A.

Referring to the exemplary embodiments of FIGS. 8A and 8B, the semiconductor device may include the same stacked structure 6, vertical memory structures 18a and separation structures 35 as those described in the exemplary embodiments of FIGS. 1 and 2A. First pads 252a that may be electrically connected to the first channel semiconductor layers 27a of the vertical memory structures 18a, and second pads 252b that may be electrically connected to the second channel semiconductor layers 27b of the vertical memory structures 18a may be disposed on the vertical memory structures 18a. For example, a lower surface of the first pads 252a may directly contact an upper surface of the vertical memory structures 18a.

An upper insulating layer 250 covering the first pads 252a and the second pads 252b may be disposed on the stacked structure 6, the vertical memory structures 18a, and the separation structures 35.

The first contact plugs 255a penetrating through the upper insulating layer 250 may be disposed on the first pads 252a to be electrically connected to the first pads 252a. The second contact plugs 255b may be disposed on the second pads 252b to be electrically connected to the second pads 252b.

First and second conductive lines 180a and 180b extending in the Y direction and arranged in the X direction may be disposed on the upper insulating layer 250.

The conductive lines 180a, 180b may include first conductive lines 180a and second conductive lines 180b that are alternately arranged in the X direction.

The first conductive lines 180a may be electrically connected to the first channel semiconductor layers 27a of the vertical memory structures 18a through the first contact plugs 255a and the first pads 252a. The second conductive lines 180b may be electrically connected to the second channel semiconductor layers 27b of the vertical memory structures 18a through the second contact plugs 255b and the second pads 252b.

Figure 9:
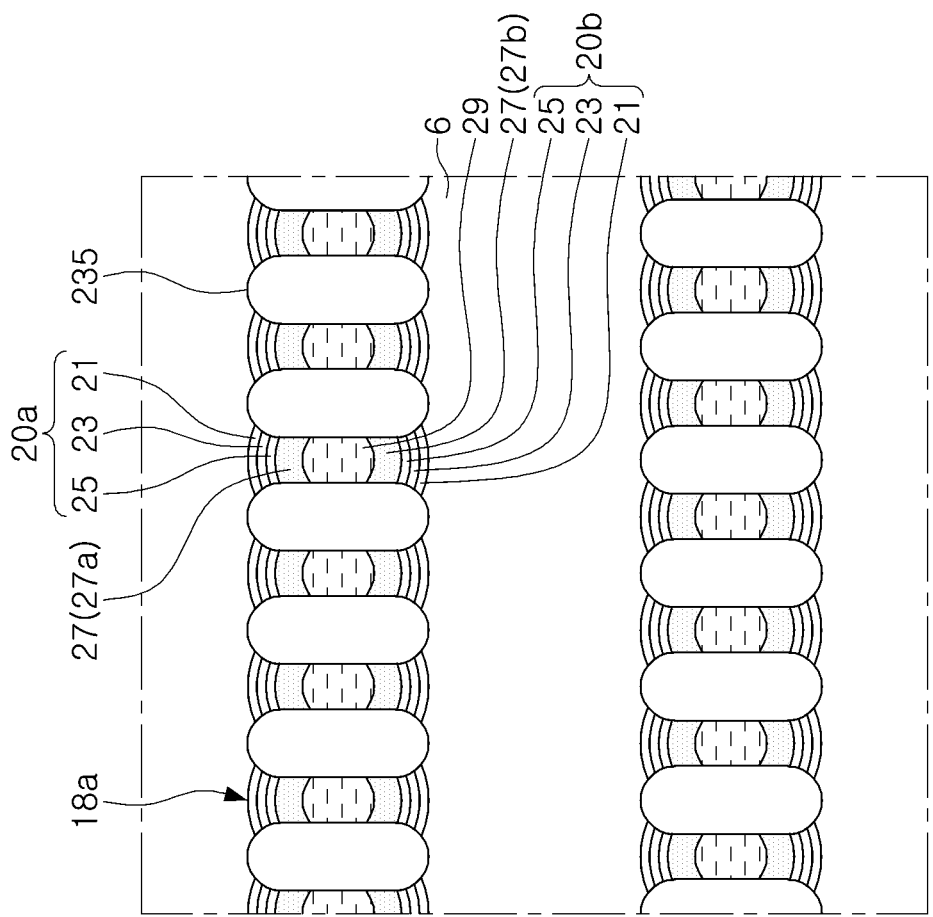
FIG. 9 is a plan view of a semiconductor device according to an exemplary embodiment of the present inventive concepts.

A modified example of the semiconductor device according to an exemplary embodiment will be described with reference to FIG. 9. FIG. 9 is a plan view illustrating a planar variation of the separation structures 35 and the vertical memory structures 18a of FIG. 1.

Referring to the exemplary embodiment of FIG. 9, the circular separation structures 35 of FIG. 1 may be modified to separation structures 235 having vertical sides (e.g., extending substantially in the Y direction). For example, each of the separation structures 235 may have a shape having a predetermined width between the core regions 29 adjacent to each other in the X direction. Each of the separation structures 235 may have a shape having a uniform width between the core regions 29 and between the channel semiconductor structures 27, adjacent to each other in the X direction. When seen in a plan view (e.g., in a plane defined by the X direction and Y direction), the side surfaces of the core region 29 facing the separation structures 235 may have line shapes parallel to each other (e.g., extending substantially in the Y direction), and the side surface of the core region 29 facing the channel semiconductor structure 27 may have a convex shape.

Each of the separation structures 235 may be disposed between the first data storage structures 20a adjacent to each other in the X direction and between the second data storage structures 20b adjacent to each other in the X direction, while having a width decreasing in the direction toward the stacked structure 6. For example, the ends (e.g., in the Y direction) of the plurality of vertical memory structures 235 adjacent to the data storage structure 20a (e.g., in the X direction) may have a convex shape in a direction toward the stacked structure 6.

Figure 10:
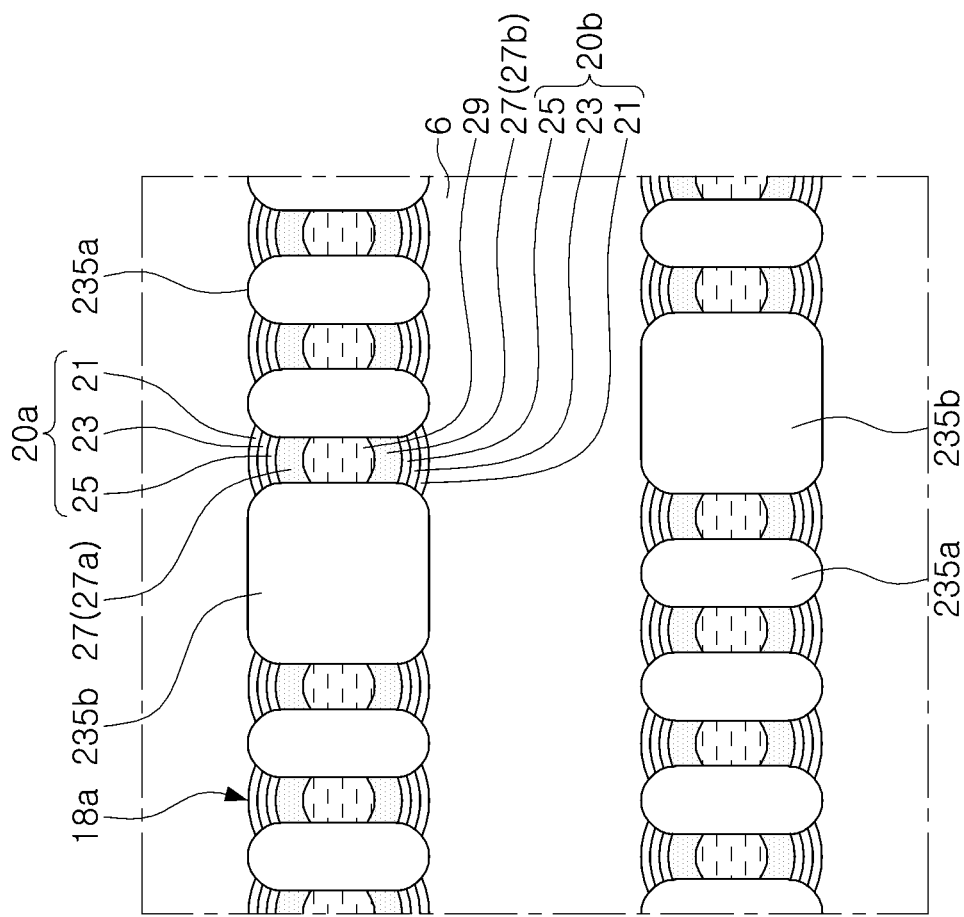
FIG. 10 is a plan view of a semiconductor device according to an exemplary embodiment of the present inventive concepts.
Figure 10:
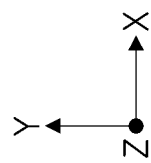

A modified example of a semiconductor device according to an exemplary embodiment will be described with reference to FIG. 10. FIG. 10 is a plan view illustrating a variation of a planar shape of the separation structures 35 and the vertical memory structures 18a of FIG. 1.

Referring to the exemplary embodiment of FIG. 10, the semiconductor device includes separation structures 235a and 235b having different sizes and different shapes in contrast with the separation structures 35 of FIG. 1 that are formed to have the same size and same shape. For example, the semiconductor device may include first separation structures 235a having a shape similar to the shape of the separation structures 235 in the exemplary embodiment of FIG. 9 and second separation structures 235b having a substantially square shape with rounded corners. The size of each of the first separation structures 235a may be smaller than the size of each of the second separation structures 235b. For example, each of the first separation structures 235a may have a width in the X direction that is smaller than a width of each of the second separation structures 235b in the X direction to form the different shapes. The placement density of the first separation structures 235a may be greater than the placement density of the second separation structures 235b. For example, the first and second separation structures 235a and 235b may be sequentially disposed in the X direction with each of the second separation structures 235b disposed between a plurality of consecutive first separation structures 235a on each side of the second separation structure 235b.

Figure 11:
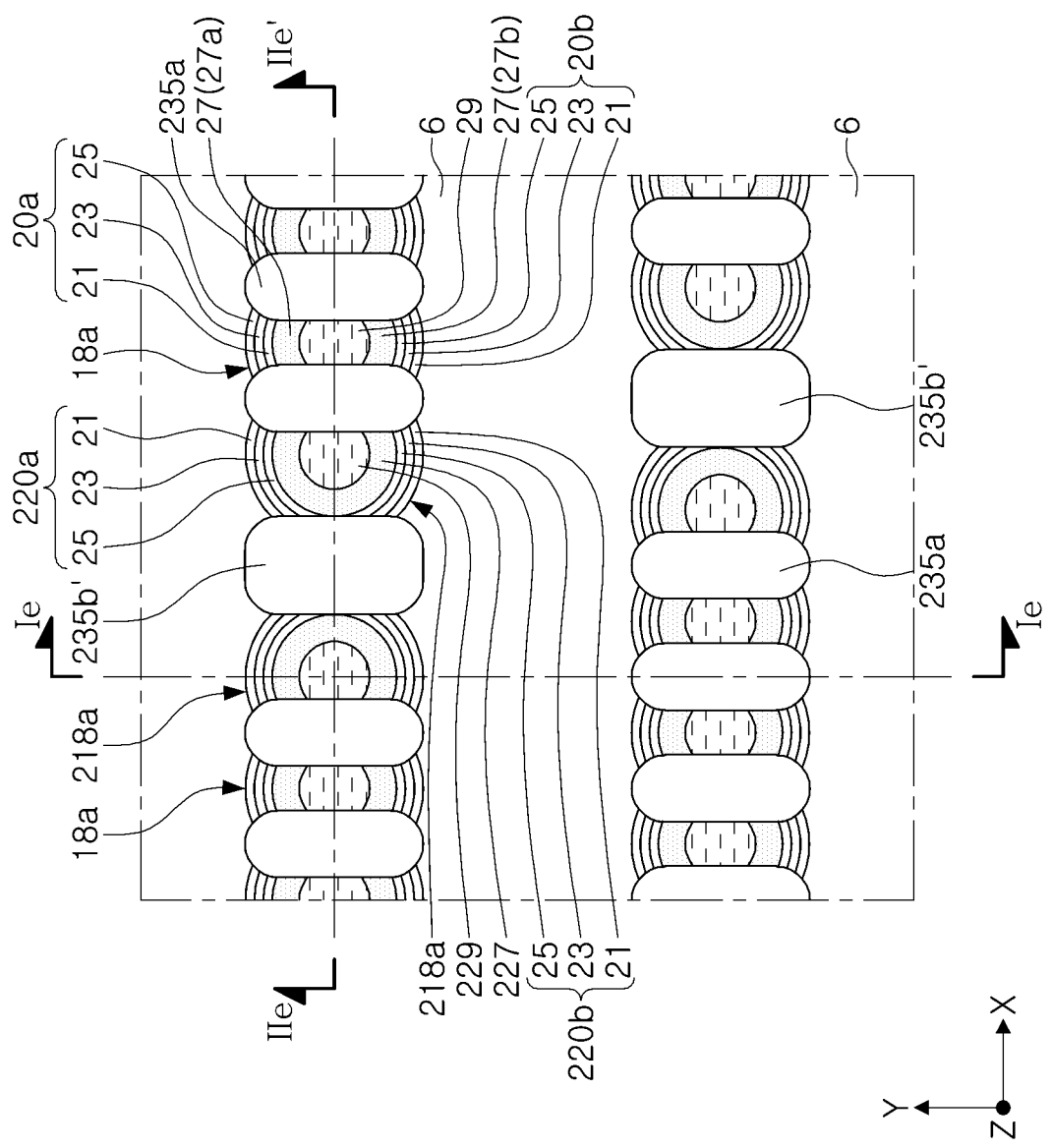
FIG. 11 is a plan view of a semiconductor device according to an exemplary embodiment of the present inventive concepts.
Figure 12:
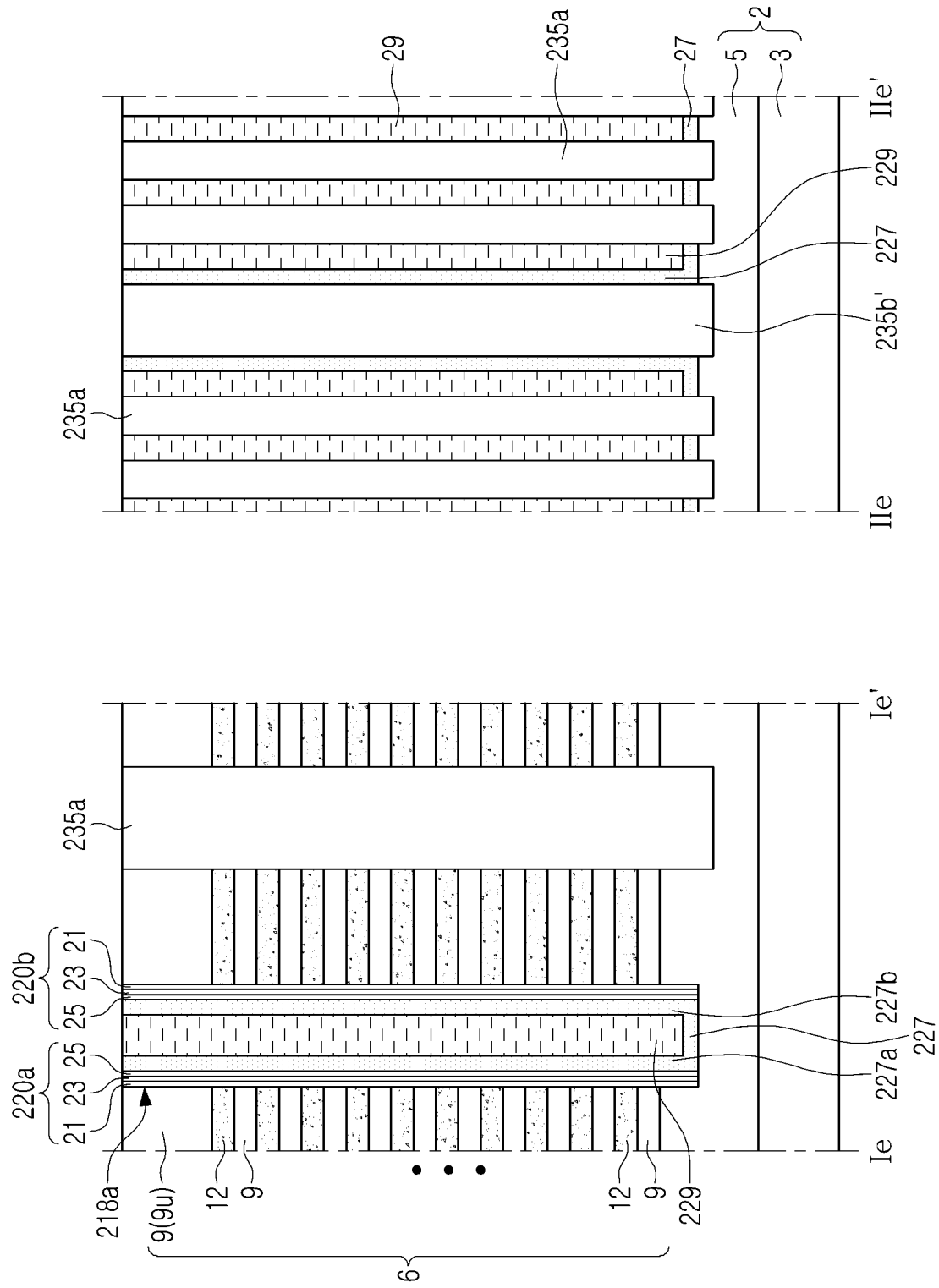
FIG. 12 is a cross-sectional view of a semiconductor device taken along lines Ie-Ie' and IIe-IIe' of FIG. 11 according to an exemplary embodiment of the present inventive concepts.
Figure 13:
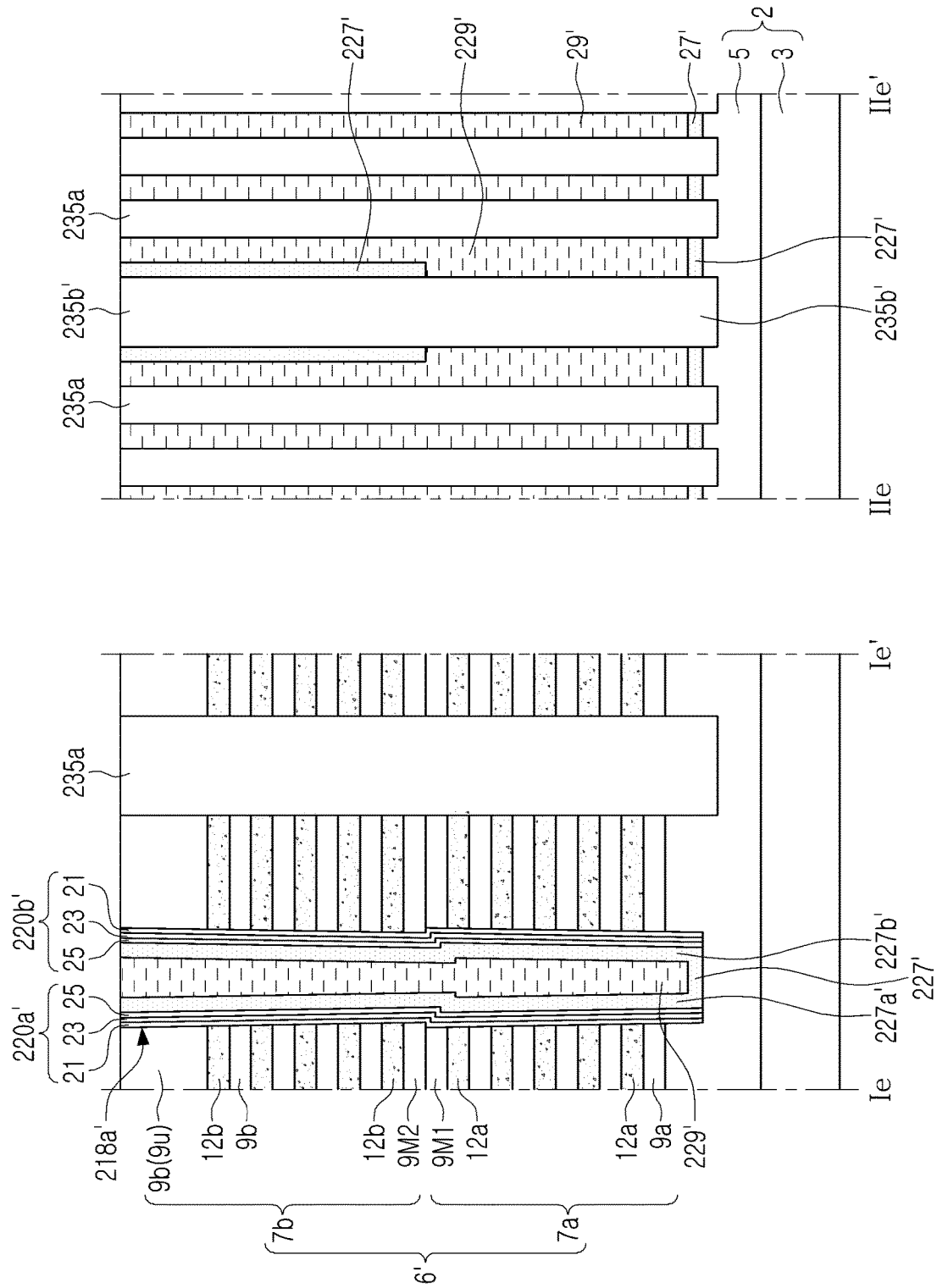
FIG. 13 is a cross-sectional view of a semiconductor device taken along lines Ie-Ie' and IIe-IIe' of FIG. 11 according to an exemplary embodiment of the present inventive concepts.
Figure 14:
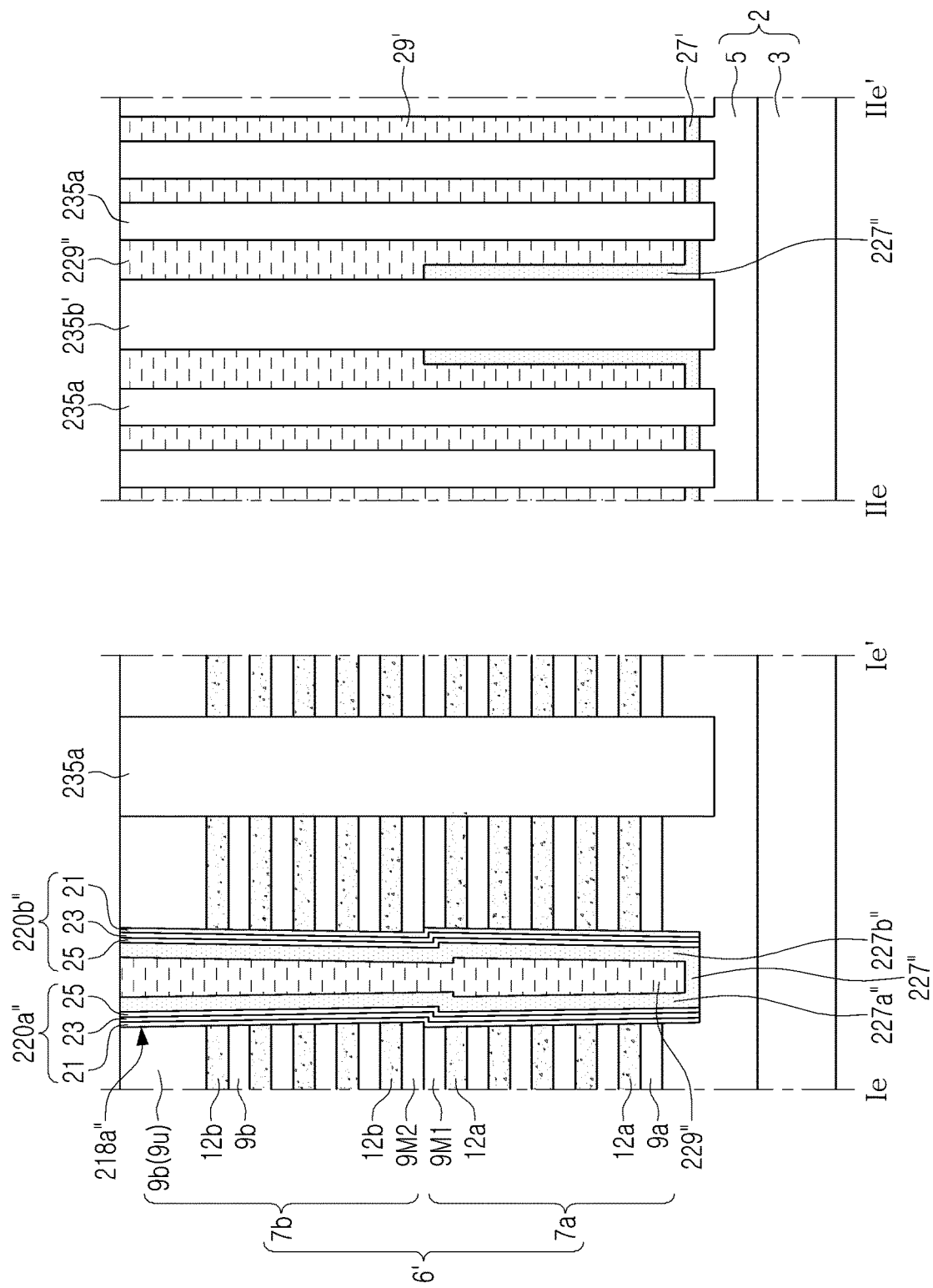
FIG. 14 is a cross-sectional view of a semiconductor device taken along lines Ie-Ie' and IIe-IIe' of FIG. 11 according to an exemplary embodiment of the present inventive concepts.

Various modifications of a semiconductor device according to an exemplary embodiment will be described with reference to FIGS. 11 through 14. FIG. 11 is a plan view illustrating a modified example of the semiconductor device according to an exemplary embodiment. FIG. 12 provides cross-sectional views illustrating a modified example of the semiconductor device according to an exemplary embodiment, and provides cross-sectional views illustrating regions taken along lines Ie-Ie' and IIe-IIe' of FIG. 11. FIG. 13 provides cross-sectional views of regions taken along lines Ie-Ie' and IIe-IIe' of FIG. 11 to illustrate another modification of the semiconductor device according to an exemplary embodiment. FIG. 14 provides cross-sectional views of regions taken along lines Ie-Ie' and IIe-IIe' of FIG. 11 to illustrate another modification of the semiconductor device according to an exemplary embodiment.

Referring to FIGS. 11 and 12 in a modified example, the same stacked structure 6 as described with reference to the exemplary embodiment of FIG. 2A may be disposed on the lower structure 2. Similar to the exemplary embodiment of FIG. 10, the semiconductor device may include first separation structures 235a and second separation structures 235b' having different shapes and sizes. For example, the first separation structures 235a may have a substantially same shape and size as the first separation structures in the exemplary embodiment of FIG. 10. The second separation structures 235b' may have a rectangular shape with rounded corners having relatively longer sides extending in the Y direction. The second separation structures 235b' are larger than the size of each of the first separation structures 235a. For example, each of the first separation structures 235a may have a width in the X direction, which is smaller than a width of each of the second separation structures 235b' in the X direction. The first and second separation structures 235a and 235b' are sequentially disposed in the X direction so that the first separation structures 235a have a greater placement density. For example, each of the second separation structures 235b' may be disposed between a plurality of consecutive first separation structures 235a on each side of the second separation structure 235b.

The first and second separation structures 235a and 235b', and vertical memory structures 18a and 218a are alternately arranged in the X direction. The first and second separation structures 235a and 235b' and first and second vertical memory structures 18a and 218a may penetrate through the stacked structure 6 (e.g., in the Z direction) and may divide the stacked structure 6 in the Y direction.

The semiconductor device may include the first vertical memory structure 18a between two adjacent first separation structures 235a, and the second vertical memory structure 218a adjacent to the second separation structure 235b' and disposed on each side of the second separation structure 235b'. The second vertical memory structure 218a may be disposed between the second separation structure 235b' and the first separation structure 235a adjacent to each other.

The width of the first vertical memory structure 18a in the X direction may be smaller than the width of the second vertical memory structure 218a in the X direction. The width of the first vertical memory structure 18a in the Y direction may be equal to the width of the second vertical memory structure 218a in the Y direction.

The first vertical memory structure 18a may include first and second data storage structures 20a and 20b, a channel semiconductor structure 27, and a core region 29 that are substantially the same as those described in the exemplary embodiments of FIGS. 1 and 2a. In the first vertical memory structure 18a, the channel semiconductor structure 27 may be referred to as a "first channel semiconductor structure", and the core region 29 may be referred to as a "first core region". The channel semiconductor structure 27 may include the first channel semiconductor layer 27a and the second channel semiconductor layer 27b as described above.

The second vertical memory structure 218a may include third and fourth data storage structures 220a and 220b, a second channel semiconductor structure 227, and a second core region 229. The second core region 229 may extend in the Z direction perpendicular to the upper surface of the lower structure 2 to penetrate through the stacked structure 6. Each of the first to fourth data storage structures 20a, 20b, 220a and 220b may include the first dielectric layer 21, the data storage layer 23, and the second dielectric layer 25, substantially the same as those described above.

When seen in a plan view (e.g., in a plane defined by the X direction and the Y direction), both lateral side surfaces of the first core region 29 (e.g., in the X direction) may contact the first separation structures 235a.

In a plan view, in the second vertical memory structure 218a between the second separation structure 235b' and the first separation structure 235a that are adjacent to each other, one lateral side surface of the second core region 229 may contact the first separation structure 235a, and the other lateral side surface of the second core region 229 may be spaced apart from the second separation structure 235b' in the X direction.

The second channel semiconductor structure 227 may cover the lateral side surface of the second core region 229 that does not contact the first separation 235a structures and the top and bottom surfaces of the second core region 229, between portions of the stacked structure 6, which are spaced apart from each other. A portion of the second channel semiconductor structure 227 may be interposed between the second core region 229 and the second separation structure 235b' spaced apart from each other. In a plan view, the second channel semiconductor structure 227 may have a "C" shape. For example, the second channel semiconductor structure 227 may extend from first and second portions 227a and 227b interposed between the second core region 229 and the stacked structure 6, to between the second core region 229 and the second separation structure 235b', to have a "C" shape when viewed in a plan view. The third data storage structure 220a may be disposed between the first portion 227a of the second channel semiconductor structure 227 and the stacked structure 6, and the fourth data storage structure 220b may be disposed between the second portion 227b of the second channel semiconductor structure 227 and the stacked structure 6.

In another exemplary embodiment with reference to FIG. 13, the semiconductor device may include the same stacked structure 6' as described with reference to the exemplary embodiment of FIG. 2B disposed on the lower structure 2. The planar shape of the stacked structure 6' may be substantially the same as the area indicated by the stacked structure 6 shown in the exemplary embodiment of FIG. 11. Accordingly, the exemplary embodiment of FIG. 13 may differ from the exemplary embodiment of FIGS. 11-12 by the inclusion of the stacked structure 6'.

The first separation structures 235a and the second separation structures 235b' that are substantially the same as those described with reference to FIGS. 11 and 12 may be disposed on the lower structure 2.

The semiconductor device may include first and second vertical memory structures 18a' and 218a' alternately arranged with the first and second separation structures 235a and 235b' in the X direction. The arrangement of the first and second vertical memory structures 18a' and 218a' may be substantially the same as the arrangement of the first and second vertical memory structures 18a and 218a previously described in the exemplary embodiment of FIG. 11. The first and second separation structures 235a and 235b', and the first and second vertical memory structures 18a' and 218a', may penetrate through the stacked structure 6' (e.g., in the Z direction) and may divide the stacked structure 6' in the Y direction.

The semiconductor may include a first vertical memory structure 18a' between the first separation structures 235a, and a second vertical memory structure 218a' adjacent to the second separation structure 235b'. The second vertical memory structure 218a' may be disposed between the second separation structure 235b' and the first separation structure 235a adjacent to each other.

The first vertical memory structure 18a' in the exemplary embodiment of FIG. 13 may include the first and second data storage structures 20a' and 20b' of FIG. 2B, the channel semiconductor layer 27' of FIG. 2B, and the core region 29' of FIG. 28, which are the same as those described above in the exemplary embodiment of FIG. 2B.

The second vertical memory structure 218a' may include third and fourth data storage structures 220a' and 220b', a second channel semiconductor structure 227, and a second core region 229'. The second core region 229' may extend in the Z direction that is perpendicular to the upper surface of the lower structure 2 to penetrate through the stacked structure 6'. Each of the first to fourth data storage structures 20a' and 20b' of FIG. 2B and 220a' and 220b' of FIG. 13 may include the first dielectric layer 21, the data storage layer 23 and the second dielectric layer 25 which are substantially the same as those described above.

In the cross-sectional structure taken along the line IIe-IIe', in the second vertical memory structure 218a' between the second separation structure 235b' and the first separation structure 235a adjacent to each other, an entire side surface of the second core region 229' facing the first separation structure 235a may contact the first separation structure 235a, and a side of an upper portion of the second core region 229' facing the second separation structure 235b' is spaced apart from the second separation structure 235b' (e.g., by the second channel semiconductor structure 227'), and a side of a lower portion of the second core region 229' facing the second separation structure 235b' may directly contact the second separation structure 235b'.

The second channel semiconductor structure 227' may cover side and bottom surfaces of the second core region 229', between portions of the stacked structure 6' which are spaced apart from each other. The planar shape of the second channel semiconductor structure 227' may have substantially the same planar shape (e.g., a "C" shape) as the planar shape of the second channel semiconductor structure 227 of the exemplary embodiments of FIGS. 11 and 12 described above. The second channel semiconductor structure 227' may extend from first and second portions 227a' and 227b' interposed between the second core region 229' and the stacked structure 6' to between the upper side of the second core region 229' and the second separation structure 235b', to have a "C" shape when seen in a plan view (e.g., in a plane defined by the X direction and the Y direction).

The third data storage structure 220a' may be disposed between the first portion 227a' of the second channel semiconductor structure 227' and the stacked structure 6' (e.g., in the Y direction). The fourth data storage structure 220b' may be disposed between the second portion 227b' of the second channel semiconductor structure 227' and the stacked structure 6' (e.g., in the Y direction).

In a modified example with reference to the exemplary embodiment of FIG. 14, the semiconductor device may include the lower structure 2, the stacked structure 6', the first separation structures 235a, the second separation structures 235b, and the first vertical memory structure 18a which are the same as those described with reference to the exemplary embodiment of FIG. 13.

The semiconductor device of FIG. 14 includes a second vertical memory structure 218a" in contrast to the second vertical memory structure 218a' described with reference to the exemplary embodiment of FIG. 13.

The second vertical memory structure 218a" may include third and fourth data storage structures 220" and 220b", a second channel semiconductor structure 227", and a second core region 229"'. The second core region 229"' may extend in the Z direction perpendicular to the upper surface of the lower structure 2 to penetrate through the stacked structure 6'. The third and fourth data storage structures 220a" and 220b" may be substantially the same as the third and fourth data storage structures 220a' and 220b' of the exemplary embodiment of FIG. 13.

In the cross-sectional structure taken along line IIe-IIe', in the second vertical memory structure 218a" between the first separation structure 235a and the second separation structure 235b' adjacent to each other, an entire side surface of the second core region 229"' facing the first separation structure 235a may contact the first separation structure 235a, a lower side surface of the second core region 229"' facing the second separation structure 235b' is spaced apart from the second separation structure 235b' (e.g., by the second channel semiconductor structure 227"), and an upper side surface of the second core region 229"' facing the second separation structure 235b' may directly contact the second separation structure 235b'.

The second channel semiconductor structure 227" may cover side and bottom surfaces of the second core region 229", between portions of the stacked structure 6' which are spaced apart from each other. The planar shape of the second channel semiconductor structure 227" may have substantially the same planar shape (e.g., a "C" shape) as the planar shape of the second channel semiconductor structure 227 of the exemplary embodiments of FIGS. 11 and 12. For example, the second channel semiconductor structure 227" may extend, from first and second portions 227a" and 227 b" interposed between the second core region 229"' and the stacked structure 6' and a portion covering a lower surface of the second core region 229", to between the lower side surface of the second core region 229″ and the second separation structure 235b', to have a "C" shape when seen in a plan view.

Figure 15:
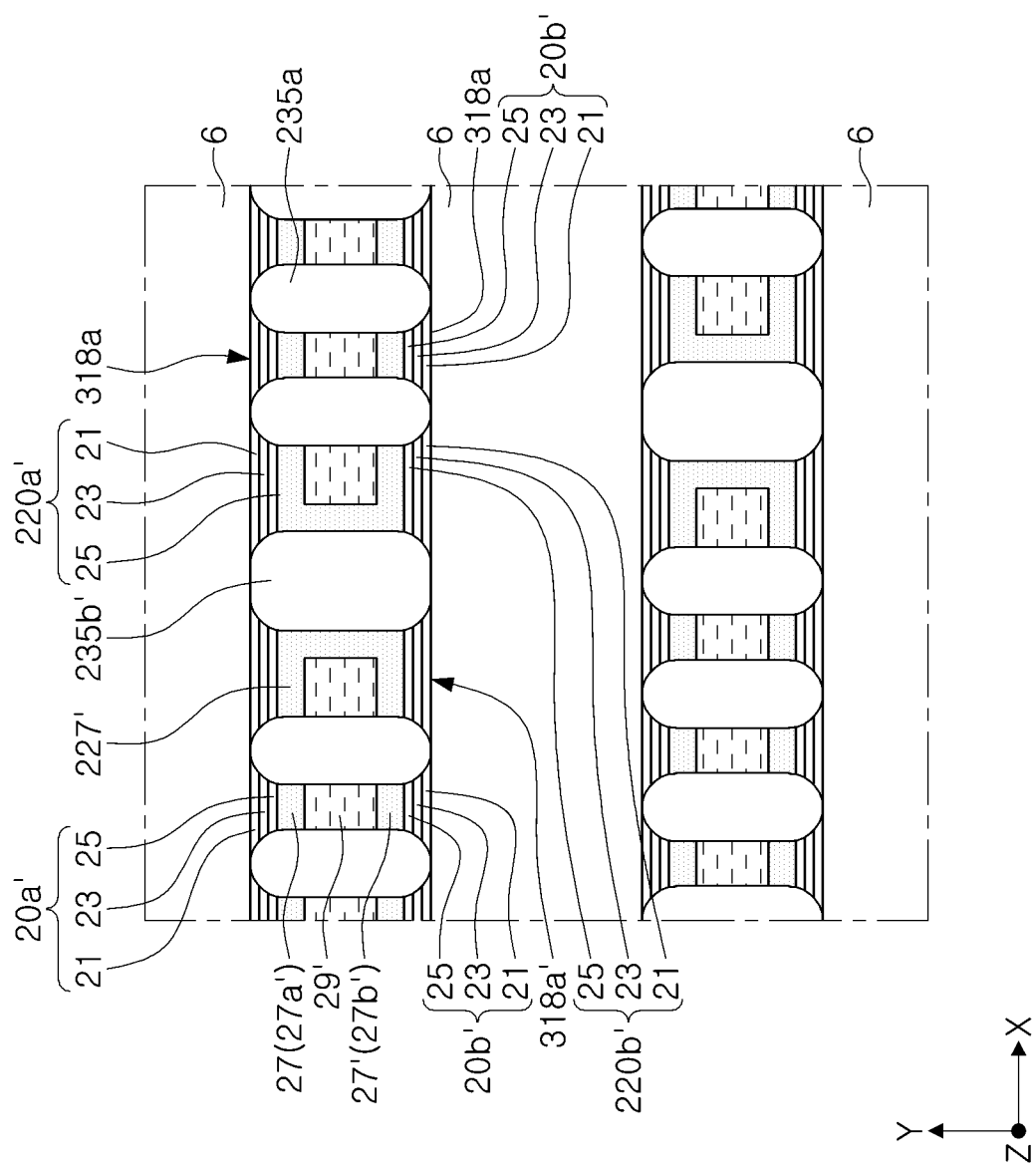
FIG. 15 is a plan view of a semiconductor device according to an exemplary embodiment of the present inventive concepts.

A modified example of the semiconductor device according to an exemplary embodiment will be described with reference to FIG. 15. FIG. 15 is a plan view illustrating a modified example of the planar shape of the vertical memory structures 18a and 218a of the exemplary embodiment of FIG. 11.

Referring to the exemplary embodiment of FIG. 15, the semiconductor device may include a stacked structure 6 and the first and second separation structures 235a and 235b' substantially the same as those described with reference to the exemplary embodiment of FIG. 11.

The separation structures 235a and 235b', and vertical memory structures 318a and 318a' are alternately arranged in the X direction. The semiconductor device includes first and second vertical memory structures 318a and 318a'. The first vertical memory structure 318a is disposed between the first separation structures 235a, and a second vertical memory structure 318' is adjacent to the second separation structure 235b' (e.g., disposed on each side of the second separation structure 235b'). The second vertical memory structure 318a' may be disposed between the second separation structure 235b' and the first separation structure 235a that are adjacent to each other (e.g., in the X direction).

The first vertical memory structure 318a may be a vertical memory structure having a modification of the planar shape (e.g., in a plane defined by the X direction and Y direction) of the first vertical memory structure 18a of the exemplary embodiment of FIG. 11, and the second vertical memory structure 318a' may be a vertical memory structure having a modification of the planar shape of the second vertical memory structure 218a of the exemplary embodiment of FIG. 11.

The X direction width of the first vertical memory structure 318a may be smaller than the X direction width of the second vertical memory structure 318a'. The Y direction width of the first vertical memory structure 318a may be substantially equal to the Y direction width of the second vertical memory structure 318a'.

In each of the first and second vertical memory structures 318a and 318a', the sides facing the stacked structure 6 may have linear shapes parallel to each other (e.g., extending in the X direction) in contrast with the first and second vertical memory structures 18a, 218a of the exemplary embodiment of FIG. 11 having sides facing the stacked structure that are curved.

Figure 16:
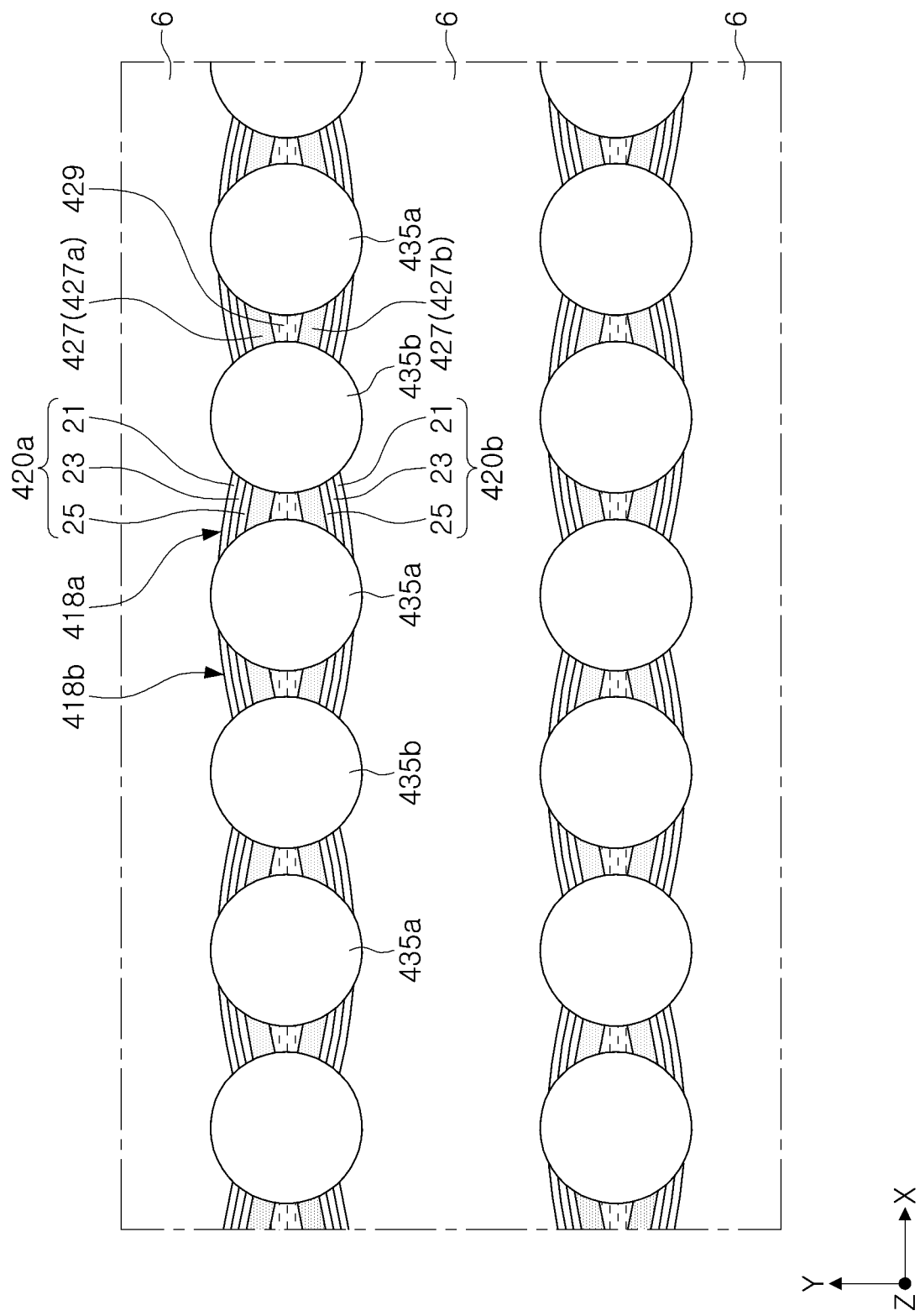
FIG. 16 is a plan view of a semiconductor device according to an exemplary embodiment of the present inventive concepts.

A modified example of a semiconductor device according to an exemplary embodiment will be described with reference to FIG. 16. FIG. 16 is a plan view illustrating a modified example of the planar shape of the vertical memory structures 18a of FIG. 1.

Referring to the exemplary embodiment of FIG. 16, the semiconductor device may include the same stacked structure 6 as in the exemplary embodiment of FIG. 1. The semiconductor device may also include separation structures 435a and 435b that are substantially the same as the separation structures 35 described with reference to the exemplary embodiment of FIG. 1. The first and second separation structures 435a and 435b may include first separation structures 435a and second separation structures 435b that are alternately arranged in the X direction.

The semiconductor device may include vertical memory structures 418a and 418b having a modification of the planar shape of the vertical memory structures 18a described with reference to the exemplary embodiment of FIG. 1.

Each of the vertical memory structures 418a and 418b may include data storage structures 420a and 420b, a channel semiconductor structure 427, and a core region 429. The data storage structures 420a and 420b may be data storage structures having a modification of the planar shape (e.g., in a plane defined by the X direction and Y direction) of the data storage structure 20 described with reference to the exemplary embodiment of FIG. 1, and the channel semiconductor structure 427 may be a channel semiconductor structure having a modification of the planar shape of the channel semiconductor structure 27 described with reference to the exemplary embodiment of FIG. 1. The core region 429 may be a core region having a modification of the planar shape of the core region 29 described in the exemplary embodiment of FIG. 1.

The semiconductor device includes first and second vertical memory structures 418a and 418b that are alternately arranged in the X direction. Each of the first vertical memory structures 418a may have a width in the Y direction that gradually reduces toward the X direction. Each of the second vertical memory structures 418b may have a width in the Y direction that gradually increasing toward the X direction. However, exemplary embodiments of the present inventive concepts are not limited thereto.

Each of the vertical memory structures 418a and 418b may have sides facing the stacked structure 6, and a distance between the sides of each of the first and second vertical memory structures 418a and 418b facing the stacked structure 6 may be gradually narrowed or gradually widened in a direction from one of the separation structures 435a and 435b toward the other separation structure.

The first separation structures 435a and the second separation structures 435b may be circular-shaped and may have the same width in the X direction and Y direction.

Figure 17:
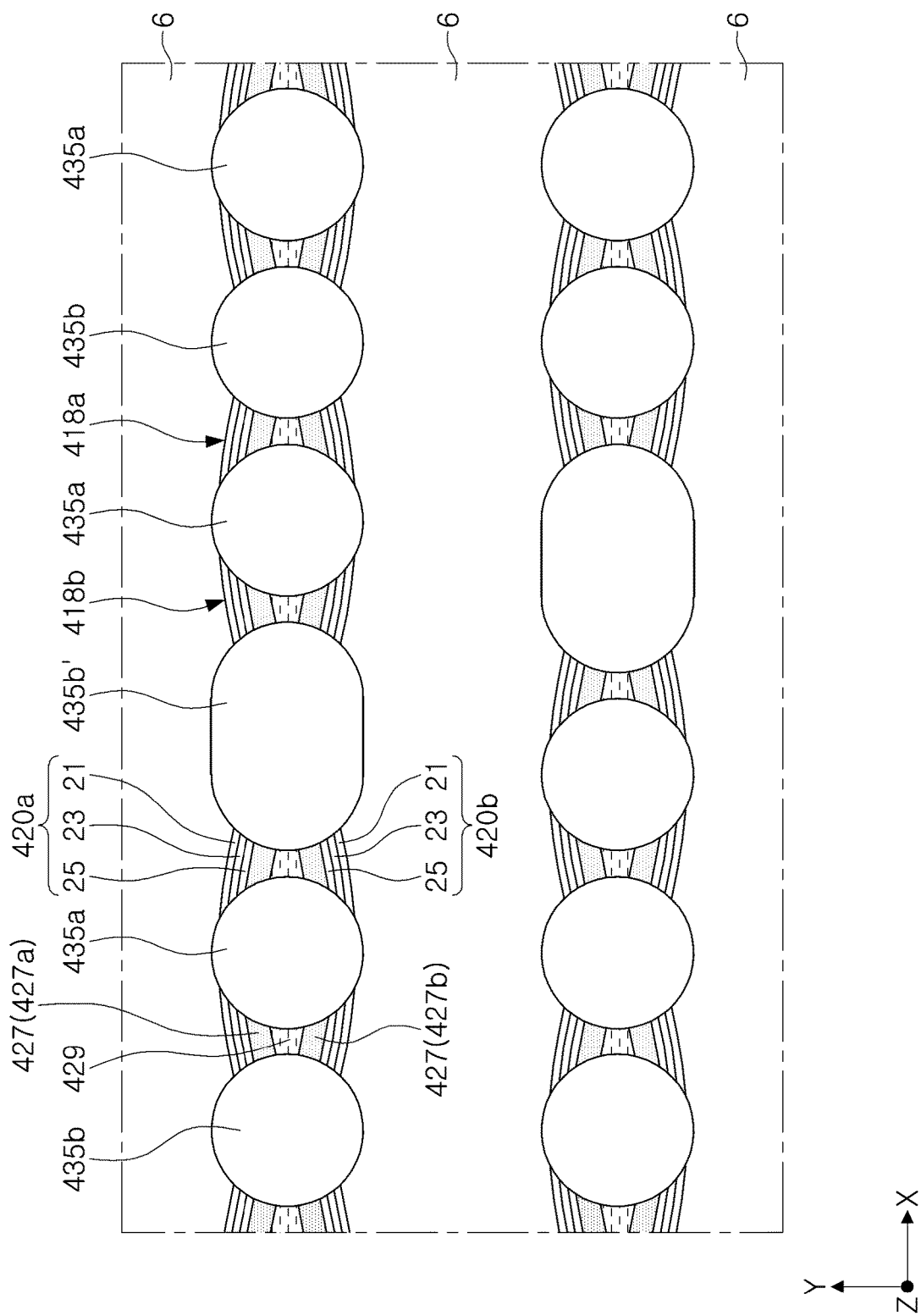
FIG. 17 is a plan view of a semiconductor device according to an exemplary embodiment of the present inventive concepts.

FIG. 17 shows an example in which the first separation structures 435a and the second separation structures 435b have different widths in the X direction. FIG. 17 is a plan view illustrating a modified example of the planar shape of the separation structures 435a and 435b of the exemplary embodiment of FIG. 16.

Referring to the exemplary embodiment of FIG. 17, the semiconductor device may include second separation structures 435b' having an increased width as compared to the second separation structures 435b of the exemplary embodiment of FIG. 16. For example, each of the first separation structures 435a may have a first width in the X direction and each of the second separation structures 435b may have a second width in the X direction that is greater than the first width. The first separation structures 435a and the first and second vertical memory structures 418a and 418b of the exemplary embodiment of FIG. 17 may be substantially the same as those of the exemplary embodiment of FIG. 16.

Figure 18A:
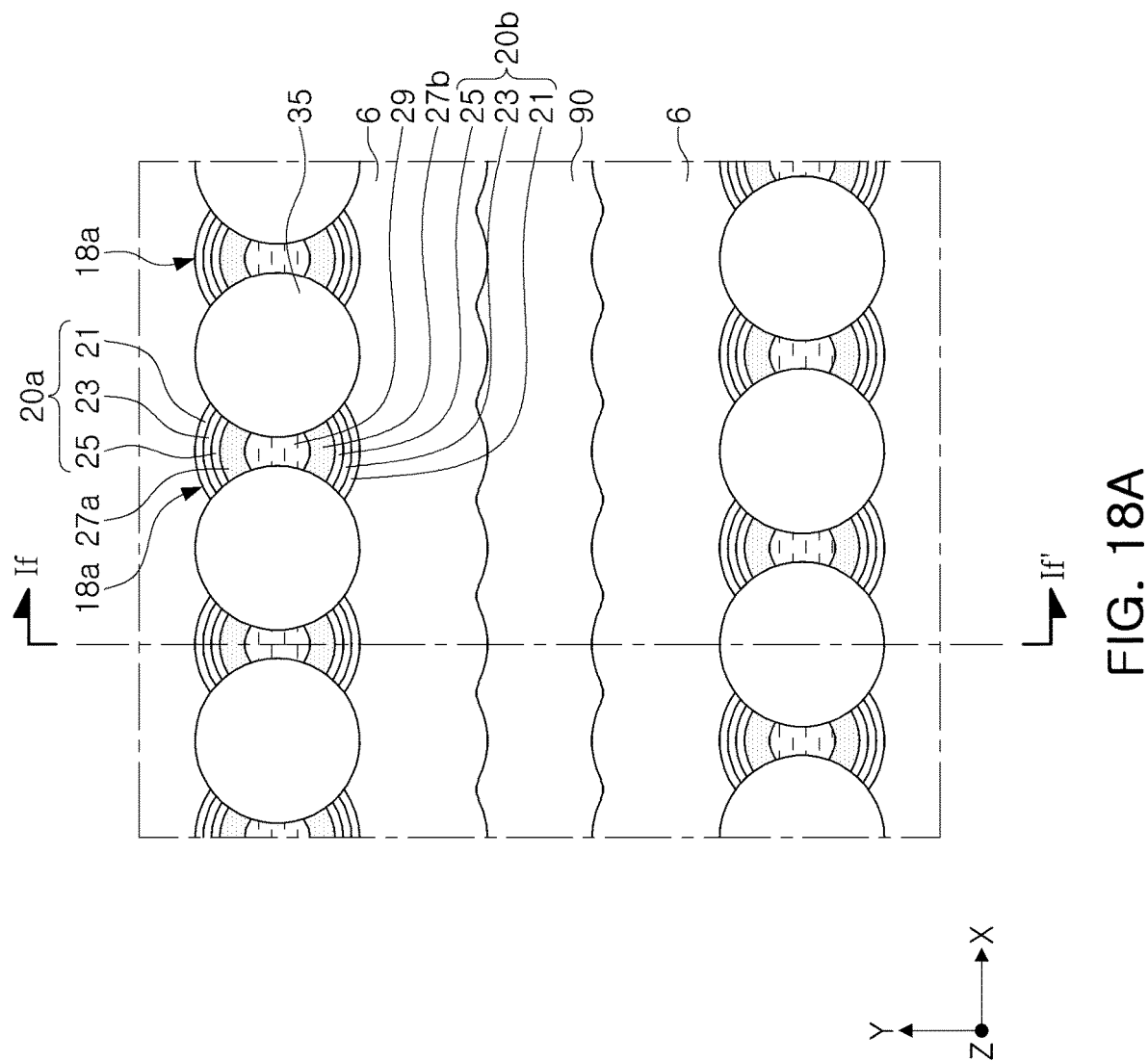
FIG. 18A is a plan view of a semiconductor device according to an exemplary embodiment of the present inventive concepts.
Figure 18B:
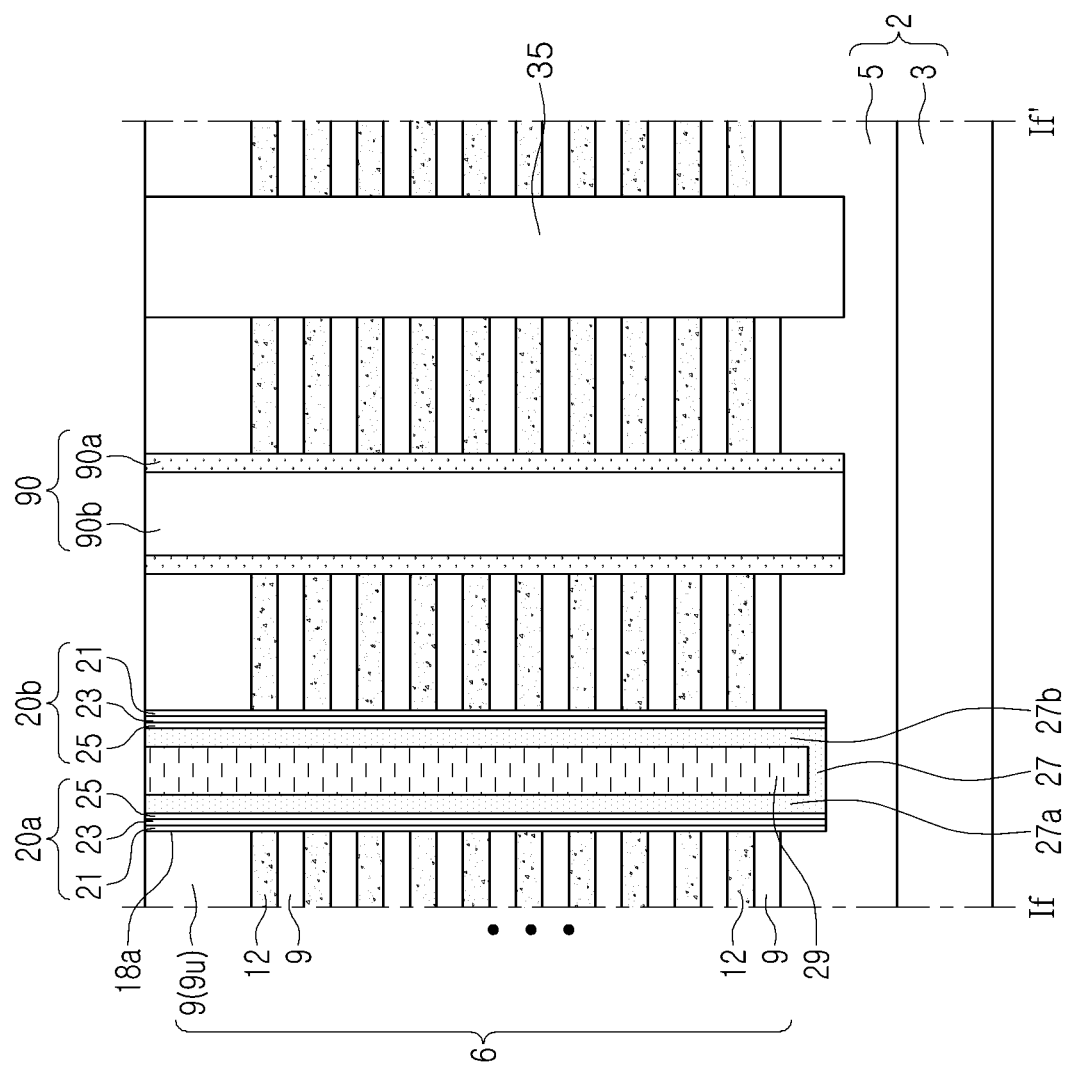
FIG. 18B is a cross-sectional view of a semiconductor device taken along lines If-If' of FIG. 18A according to an exemplary embodiment of the present inventive concepts.

Referring to FIGS. 18A and 18B, a modified example of a semiconductor device according to exemplary embodiments will be described. FIG. 18A is a plan view illustrating a modified example of the semiconductor device according to an exemplary embodiment. FIG. 188 is a cross-sectional view illustrating a region taken along lines If-If' of FIG. 18A.

Referring to the exemplary embodiment of FIGS. 18A and 18B, the semiconductor device includes the same stacked structure 6, vertical memory structures 18a and separation structures 35 as those in the exemplary embodiments of FIGS. 1 and 2A.

A separation pattern 90 may be disposed to penetrate through the stacked structure 6. The separation pattern 90 may extend in the X direction. Side surfaces of the separation pattern 90 in the Y direction may be wavy. The separation pattern 90 may be disposed in the Y direction between the plurality of vertical memory structures 18a sequentially arranged in the X direction and the plurality of vertical memory structures 18a sequentially arranged in the X direction.

The separation pattern 90 may include an isolation core pattern 90b penetrating through the stacked structure 6, and isolation spacers 90a between the isolation core pattern 90b and the stacked structure 6 (e.g., in the Y direction).

In an exemplary embodiment, the isolation core pattern 90b and the isolation spacers 90a may be formed of an insulating material. However, exemplary embodiments of the present inventive concepts are not limited thereto.

For example, in another exemplary embodiment, the isolation core pattern 90b may be formed of a conductive material, and the isolation spacers 90a may be formed of an insulating material.

Figure 19A:
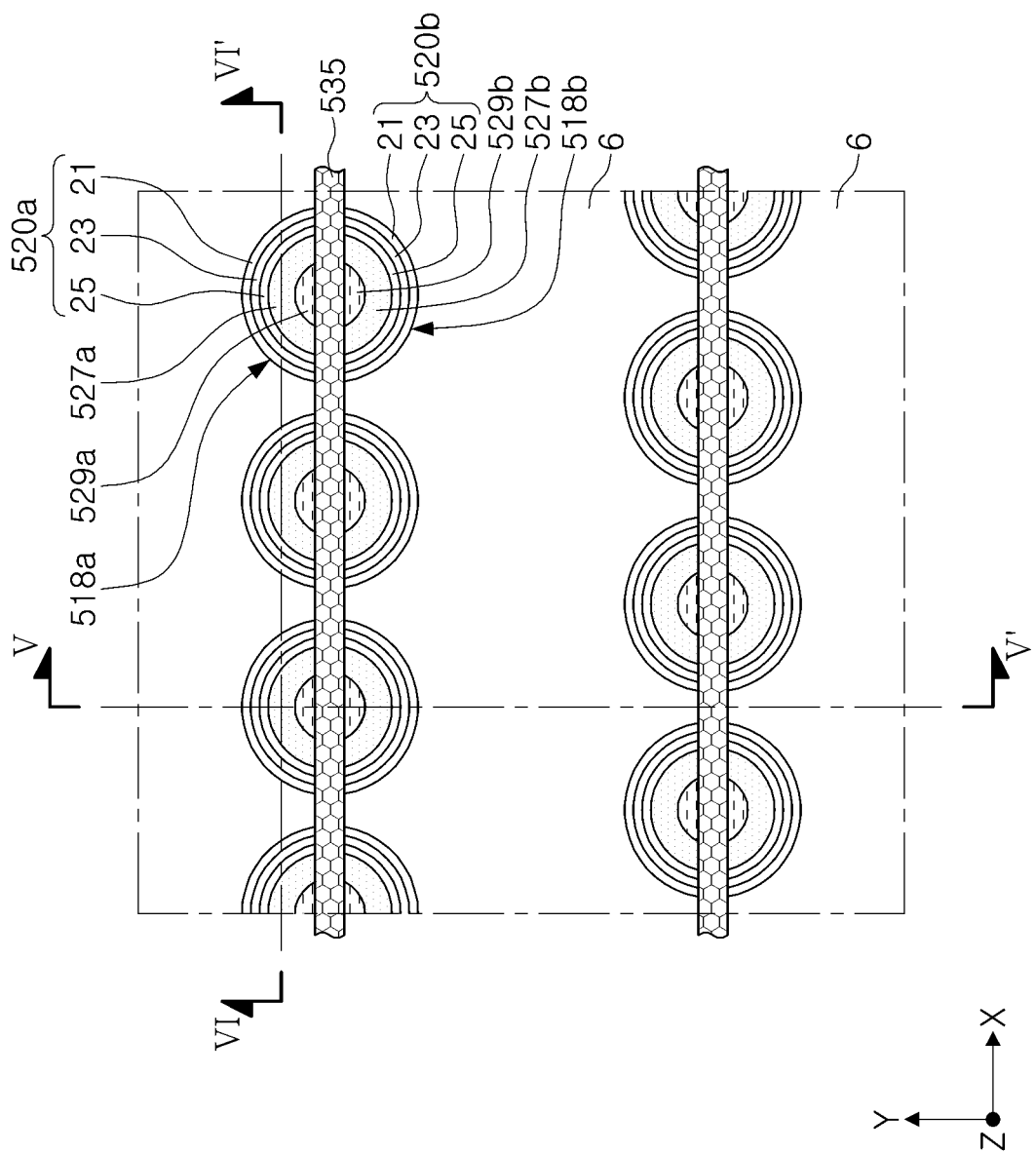
FIG. 19A is a plan view of a semiconductor device according to an exemplary embodiment of the present inventive concepts.
Figure 19B:
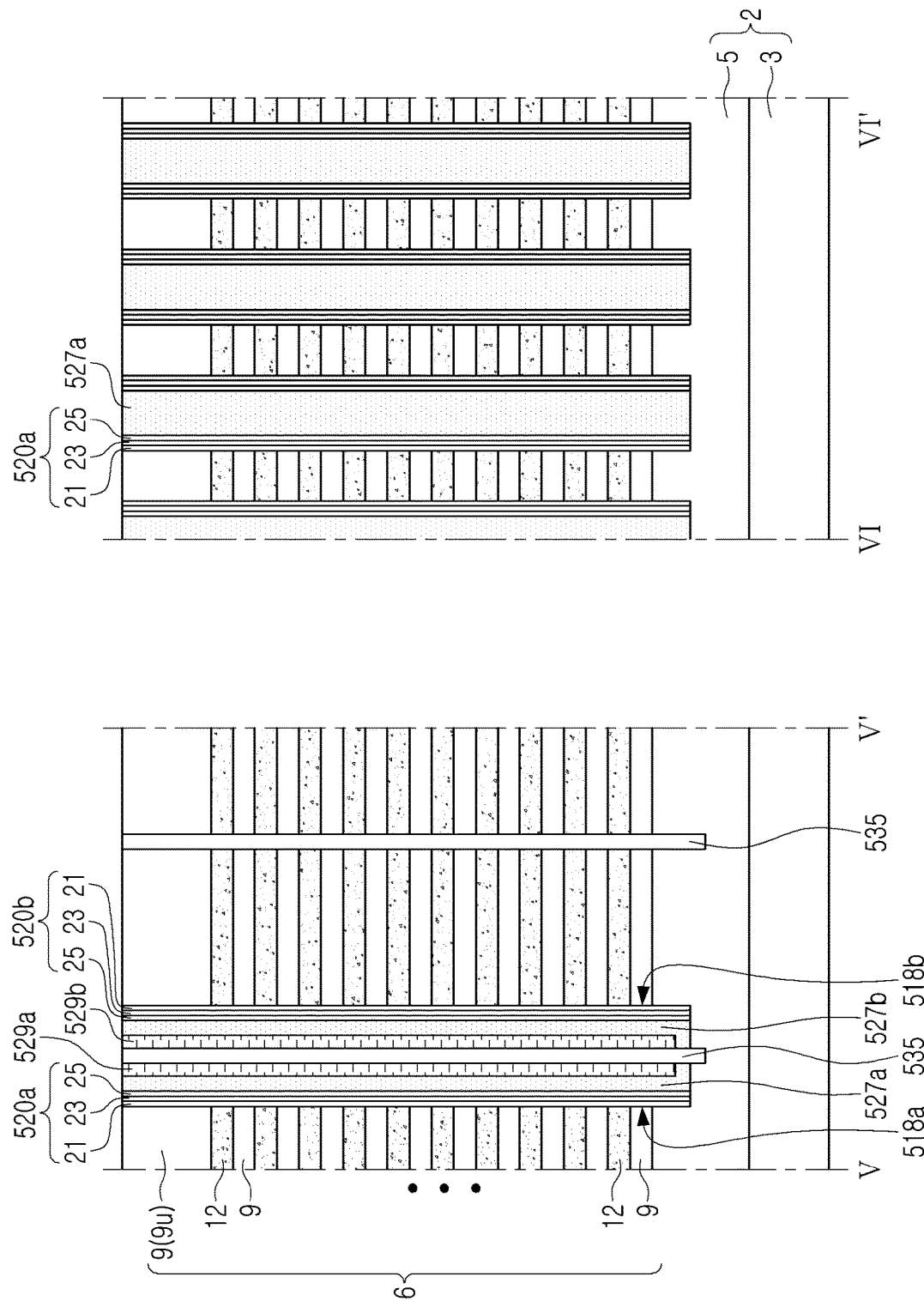
FIG. 19B is a cross-sectional view of a semiconductor device taken along lines V-V and VI-VI' of FIG. 19A according to an exemplary embodiment of the present inventive concepts.

Referring to the exemplary embodiments of FIGS. 19A and 19B, a modified example of a semiconductor device according to exemplary embodiments will be described. FIG. 19A is a plan view illustrating a modified example of the semiconductor device according to an exemplary embodiment. FIG. 19B is a cross-sectional view illustrating a region taken along lines V-V' and VI-VI' of FIG. 19A.

Referring to the exemplary embodiments of FIGS. 19A and 19B, the semiconductor device may include the same lower structure 2 and stacked structure 6 as those described in the exemplary embodiments of FIGS. 1 and 2A.

On the lower structure 2, first and second vertical memory structures 518a and 518b and a separation structure 535 may be disposed to penetrate through the stacked structure 6 (e.g., in the Z direction). The separation structure 535 may have a line shape extending in the X direction.

The first and second vertical memory structures 518a and 518 may be separated by the separation structure 535 in the Y direction.

The first vertical memory structures 518a and the second vertical memory structures 518b may be mirror symmetry structures with the separation structure 535 interposed therebetween (e.g., in the Y direction). The first vertical memory structures 518a and the second vertical memory structures 518b may be hemispherical.

Each of the first vertical memory structures 518a may include a first data storage structure 520a, a first channel semiconductor layer 527a, and a first core region 529a. Each of the second vertical memory structures 518b may include a second data storage structure 520b, a second channel semiconductor layer 527b, and a second core region 529b.

Each of the first data storage structure 520a and the second data storage structure 520b may include the first dielectric layer 21, the data storage layer 23 and the second dielectric layer 25 the same as those described with reference to the exemplary embodiments of FIGS. 1 and 2A.

In a plan view (e.g., in a plane defined by the X direction and the Y direction), side surfaces of the first and second core regions 529a and 529b may be convex in a direction facing the first and second channel semiconductor layers 527a and 527b. In a plan view, the side surfaces of the first and second vertical memory structures 518a and 518b in a direction facing the stacked structure 6.

A modified example of the planar shape of the first and second vertical memory structures 518a and 518b will be described with reference to the exemplary embodiment of FIG. 19C. FIG. 19C is an enlarged plan view illustrating a pair of the first and second vertical memory structures 518a' and 518b'.

Referring to the exemplary embodiment of FIG. 19C, the semiconductor device includes a pair of the first and second vertical memory structures 518a' and 518b', which are mirror symmetry structures with respect to one separation structure 535 that separates the first and second vertical memory structures 518a' and 518b' in the Y direction. The first vertical memory structure 518a' may include a first data storage structure 520a', a first channel semiconductor layer 527a', and a first core region 529a'. Each of the second vertical memory structures 518b' may include a second data storage structure 520b', a second channel semiconductor layer 527b', and a second core region 529b'. Each of the first and second vertical memory structures 518a' and 518b' may have an elongated hemispherical shape in the Y direction in contrast with the first and second vertical memory structures 518a and 518b of the exemplary embodiment of FIG. 19A which have a hemispherical shape.

Figure 20A:
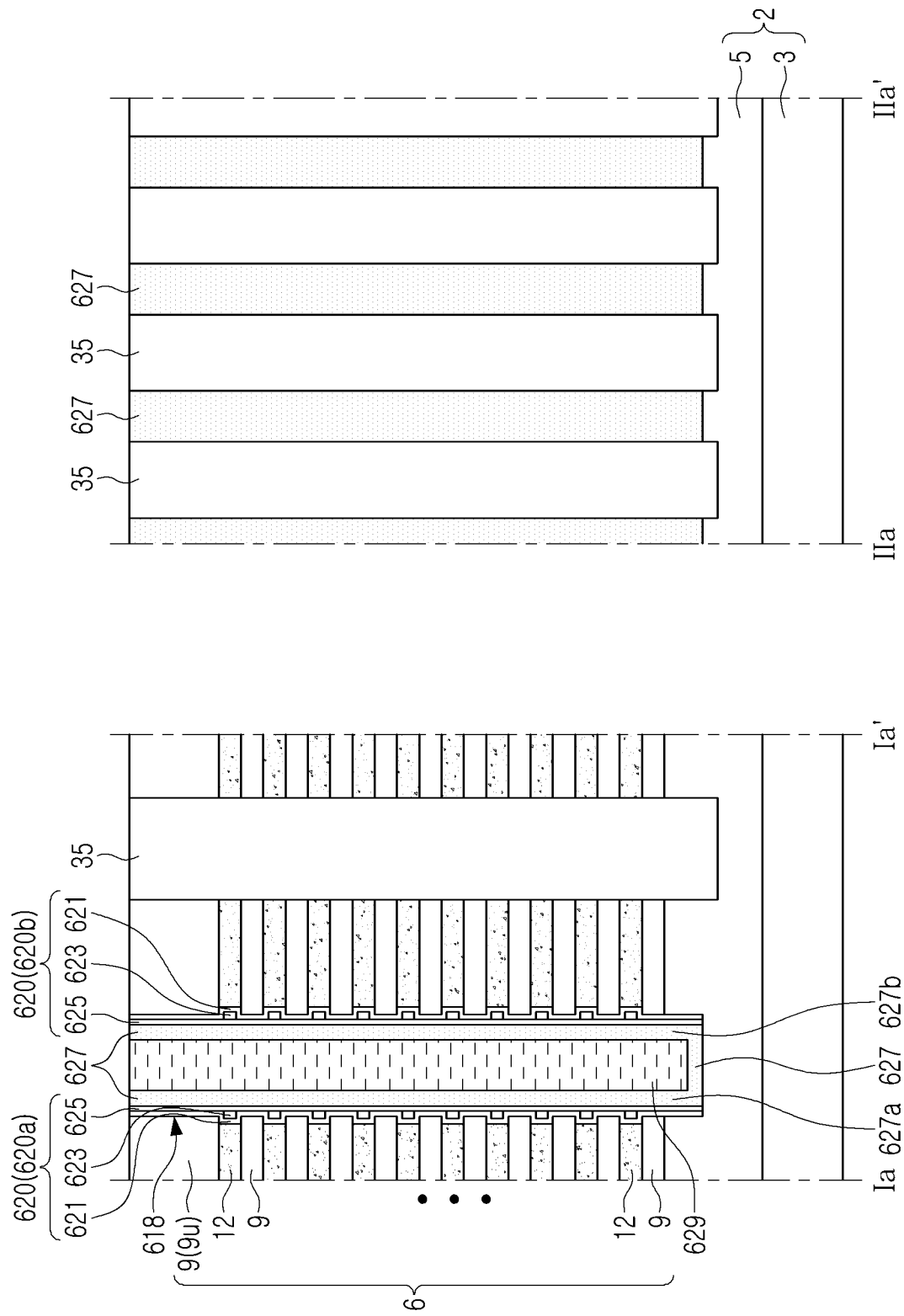
FIG. 20A is a cross-sectional view of a semiconductor device taken along lines Ia-Ia' and IIa-IIa' of FIG. 1 according to exemplary embodiments of the present inventive concepts.

A modified example of the semiconductor device according to an exemplary embodiment will be described with reference to FIG. 20A. FIG. 20A is a cross-sectional view illustrating modified examples of cross sections illustrating regions taken along lines Ia-Ia' and IIa-IIa' in FIG. 1.

Referring to the exemplary embodiment of FIGS. 1 and 20A, the semiconductor device may include a vertical memory structure 618 that is modified from the vertical memory structure 18a in the exemplary embodiments of FIGS. 1 and 2A. While the modified vertical memory structure 618 of FIG. 20A is described with reference to the exemplary embodiment of FIGS. 1 and 2A, this modified vertical memory structure 618 may be included as at least one of the vertical memory structures in any of the exemplary embodiments described in FIGS. 2B through 19C. Therefore, the vertical memory structure 618 will be mainly described, and descriptions of other components will be omitted.

The vertical memory structure 618 may include a data storage structure 620, a channel semiconductor structure 627, and a core region 629.

The core region 629 may penetrate through the stacked structure 6 (e.g., in the Z direction). In an exemplary embodiment, the core region 629 may be formed of an insulating material, such as silicon oxide, as described with reference to the exemplary embodiment of FIG. 2A. In another exemplary embodiment, the core region 629 may be comprised of a lower core region, such as lower core region 29' in the exemplary embodiment of FIG. 2D that is formed of an insulating material and an upper core region having an N-type conductivity.

Between the first and second stacked structures (see 6a and 6b of FIG. 1), the channel semiconductor structure 627 may cover the bottom and side surfaces of the core region 629. The channel semiconductor structure 627 may include a first channel semiconductor layer 627a disposed between the core region 629 and the first stacked structure (6a of FIG. 1), and a second channel semiconductor layer 627b disposed between the core region 629 and the second stacked structure (6b of FIG. 1).

The data storage structure 620 may include a first data storage structure 620a between the first stacked structure 6a and the first channel semiconductor layer 627a, and a second data storage structure 620b between the second stacked structure 6b and the second channel semiconductor layer 627b.

Each of the first data storage structure 620a and the second data storage structure 620b may include a first dielectric layer 621, a plurality of data storage layers 623, and a second dielectric layer 625. The plurality of data storage layers 623 may be interposed between the first dielectric layer 21 and the second dielectric layer 25. The plurality of data storage layers 623 may be spaced apart from each other in the Z direction perpendicular to the upper surface of the lower structure 2.

The first dielectric layer 621 may be in direct contact with the stacked structure 6, and the second dielectric layer 625 may be in direct contact with the channel semiconductor structure 627. In an exemplary embodiment, the first dielectric layer 621 may include silicon oxide or silicon oxide doped with impurities. The second dielectric layer 625 may comprise silicon oxide and/or a high-k dielectric. However, exemplary embodiments of the present inventive concepts are not limited thereto.

Each of the first data storage structure 620a and the second data storage structure 620b may protrude in the Y direction toward the gate layers 12 of the stacked structure 6 in regions including the plurality of data storage layers 623.

In an exemplary embodiment, the plurality of data storage layers 623 may be a charge trap layer capable of trapping charge. For example, the data storage layer 623 may include a material that is configured for trapping charge, such as silicon nitride. The data storage layer 623 may be used as a data storage area of a NAND flash memory.

Figure 20B:
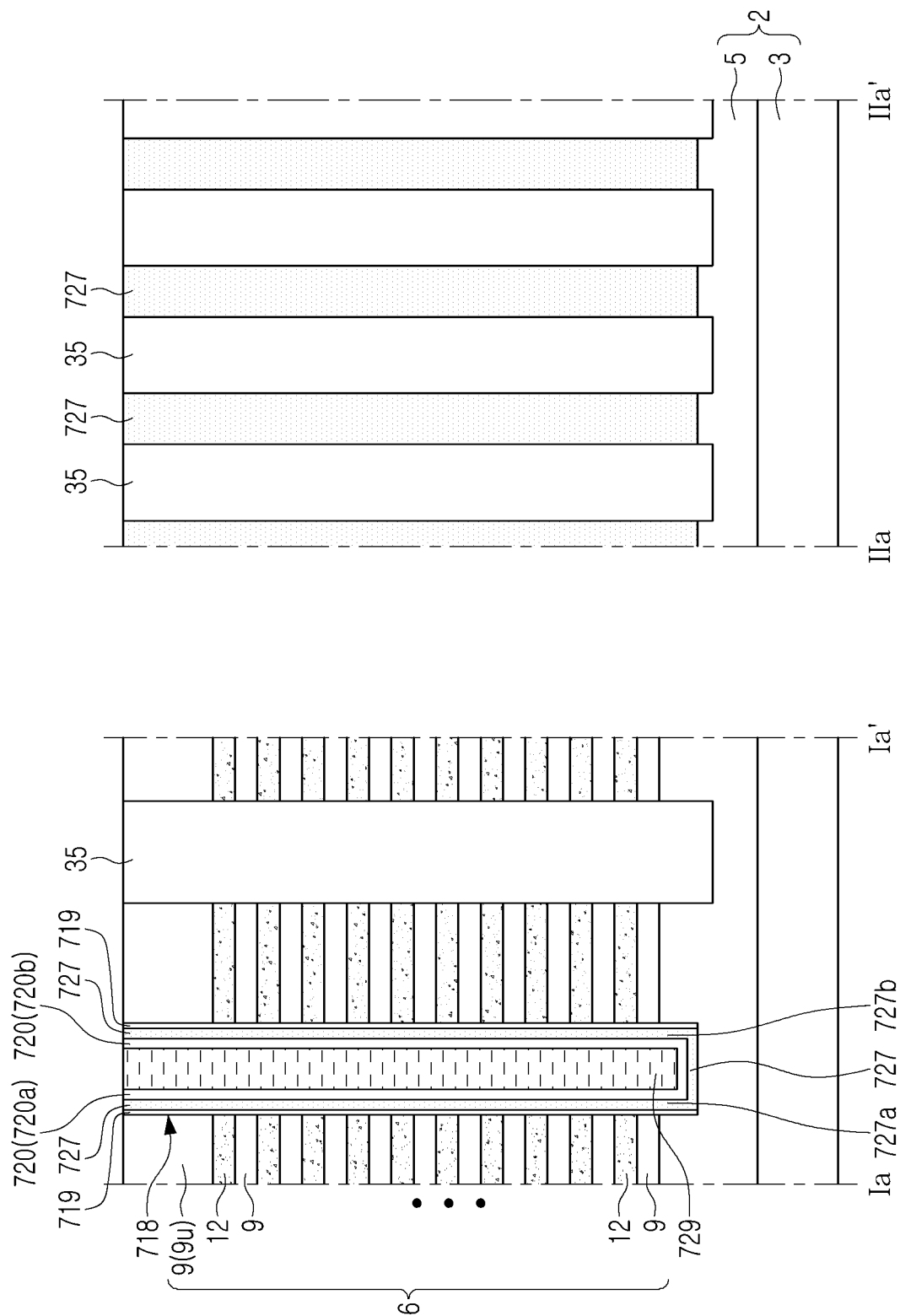
FIG. 20B is a cross-sectional view of a semiconductor device taken along lines Ia-Ia' and IIa-IIa' of FIG. 1 according to exemplary embodiments of the present inventive concepts.

A cross-sectional view of a modified example of the semiconductor device according to an exemplary embodiment will be described with reference to FIG. 20B. FIG. 20B is a cross-sectional taken along lines Ia-Ia' and IIa-IIa' of FIG. 1 illustrating a modified example of the semiconductor device.

In a modified example with reference to FIGS. 1 and 20B, the semiconductor device may include a vertical memory structure 718 that is different from the vertical memory structure 618 described in the exemplary embodiments of FIGS. 1-20A.

The vertical memory structure 718 may include a gate dielectric layer 719, a channel semiconductor structure 727, a data storage structure 720, and a core region 729.

The core region 729 may be disposed on the lower structure 2 to penetrate through the stacked structure 6 (e.g., in the Z direction). Between the first and second stacked structures 6a and 6b of FIG. 1, the channel semiconductor structure 727 may be disposed on the bottom and side surfaces of the core region 729. The channel semiconductor structure 727 may include a first channel semiconductor layer 727a disposed between the core region 729 and the first stacked structure (6a of FIG. 1) in the Y direction, and a second channel semiconductor layer 727b disposed between the core region 729 and the second stacked structure (6b of FIG. 1) in the Y direction.

In contrast to the previously described vertical memory structures, the data storage structure 720 of the exemplary embodiment of FIG. 20B may be disposed between the channel semiconductor structure 727 and the core region 729 (e.g., in the Y direction). The data storage structure 720 may directly contact the side and bottom surfaces of the core region 729. The data storage structure 720 may include a first data storage structure 720a between the core region 729 and the first channel semiconductor layer 727a, and a second data storage structure 720b between the core region 729 and the second channel semiconductor layer 727b. The gate dielectric layer 719 may be disposed between the channel semiconductor structure 727 and the stacked structure 6.

In an exemplary embodiment, the data storage structure 720 may include a variable resistance material.

In an exemplary embodiment, the variable resistance material of the data storage structure 720 may include a transition metal oxide. For example, the data storage structure 720 may include a metal oxide such as at least one compound selected from hafnium oxide and aluminum oxide.

In an exemplary embodiment, the variable resistance material of the data storage structure 720 may include one of SiOx, AlOx, MgOx, ZrOx, HfOx, SiNx, WOx and TiOx, or a composite material including at least two or more thereof. For example, the variable resistance material of the data storage structure 720 may be formed of a composite material such as Zr—Hf—Ox. However, exemplary embodiments of the present inventive concepts are not limited thereto and the variable resistance material of the data storage structure 720 may be replaced with other materials that may be used as the data storage material of a ReRAM. In another exemplary embodiment, the data storage structure 720 may include a phase change material. For example, the data storage structure 720 may be a phase change memory material such as a chalcogenide material including at least one compound selected from Ge, Sb, and Te. Alternatively, the data storage structure 720 may also be a phase change memory material including at least one compound selected from Te and Se and at least one compound selected from Ge, Sb, Bi, Pb, Sn, As, S, Si, P, O, N and In.

The stacked structure and the vertical memory structure described above with reference to the exemplary embodiments of FIGS. 1 through 20A, such as the stacked structure 6 and the vertical memory structure 18a described with reference to FIGS. 18A and 18B may be replaced with a stacked structure and a vertical memory structure modified in other forms, respectively. Various examples of the stacked structure and the vertical memory structure which may be replaced as described above will be described with reference to the exemplary embodiments of FIGS. 20C and 20F, respectively. In this case, the components that may be replaced will be mainly described, while the description of the components that are not replaced will be omitted. FIGS. 20C to 20F are cross-sectional views illustrating various modifications of a semiconductor device according to exemplary embodiments of the present inventive concepts. FIGS. 20C to 20F are cross-sectional views of a region taken along line If-If' of FIG. 18A.

Figure 20C:
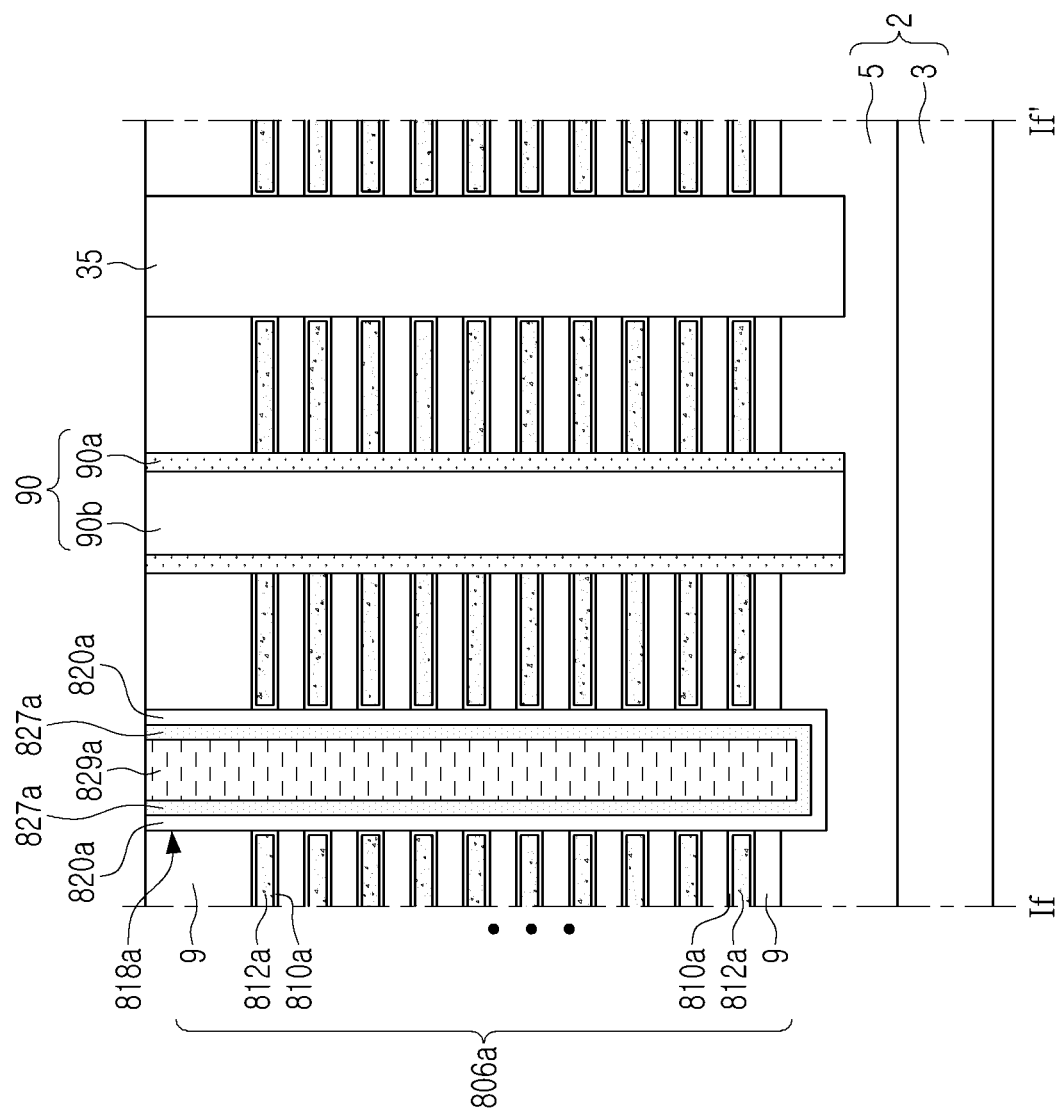
FIG. 20C is a cross-sectional view of a semiconductor device taken along lines If-If' of FIG. 18A according to an exemplary embodiment of the present inventive concepts.

Referring to the exemplary embodiments of FIGS. 1 and 20C, the semiconductor device may include a stacked structure 806a and a vertical memory structure 818a shown in FIG. 20C in contrast to the stacked structure and the vertical memory structure described above with reference to the exemplary embodiments of FIGS. 1 through 20A.

The stacked structure 806a may include interlayer insulating layers 9, planar conductive layers 812a, and switching layers 810a. The interlayer insulating layers 9 and the planar conductive layers 812a may be alternately and repeatedly stacked (e.g., in the Z direction). Each of the switching layers 810a may be interposed between a side of each of the planar conductive layers 812a and the vertical memory structure 818a and may extend to cover the upper and lower surfaces of each of the planar conductive layers 812a.

In an exemplary embodiment, each of the planar conductive layers 812a may include at least one material selected from a metal material, such as at least one compound selected from W, Ti, Ta and the like, a metal nitride, such as at least one compound selected from WN, TiN, TaN and the like, and doped silicon. However, exemplary embodiments of the present inventive concepts are not limited thereto and the planar conductive layers 812a may also be formed of another conductive material as well as the above materials.

In an exemplary embodiment, the planar conductive layers 812a may be gate layers.

The vertical memory structure 818a may include a core region 829a penetrating through the stacked structure 806a (e.g., in the Z direction), a data storage structure 820a extending between the core region 829a and the lower structure 2 (e.g., in the Z direction), while also being interposed between the core region 829a and the stacked structure 806a (e.g., in the Y direction), and a vertical conductive layer 827a disposed between the data storage structure 820a and the core region 829a. For example, the vertical conductive layer 827a may directly contact bottom and side surfaces of the core region 829a and the data storage structure 820a.

In an exemplary embodiment, the vertical conductive layer 827a may include at least one material selected from a metal material, such as W. Ti, Ta and the like a metal nitride, such as WN, TiN, TaN and the like and doped silicon. However, exemplary embodiments of the present inventive concepts are not limited thereto and the vertical conductive layer 827a may be formed of other materials as well as the material described above. In an exemplary embodiment, the vertical conductive layer 827a may be a string wiring.

In an exemplary embodiment, the data storage structure 820a may include a variable resistance material, such as any one of SiOx, AlOx, MgOx, ZrOx, HfOx, SiNx, WOx and TiOx, or a composite material (e.g., Hf—Zr—Ox) including at least two or more thereof. However, exemplary embodiments of the present inventive concepts are not limited thereto. For example, the material of the data storage structure 820a may be replaced with another variable resistance material other than the material described above.

In an exemplary embodiment, the switching layers 810a may be respectively formed of a material having switching device characteristics. For example, the switching layers 810a may include an oxide including any one of Zr, Hf, Al, Ni, Cu, Mo, Ta, Ti, Zn, V, Nb and W, or an oxide including at least two or more thereof. However, exemplary embodiments of the present inventive concepts are not limited thereto. For example, the material of the switching layers 810a may be replaced with another switching material that may be used as the switching element in addition to the above-described material.

In an exemplary embodiment, the core region 829a may include an insulating material, such as silicon oxide. The core region 829a may also include a void in the insulating material.

Figure 20D:
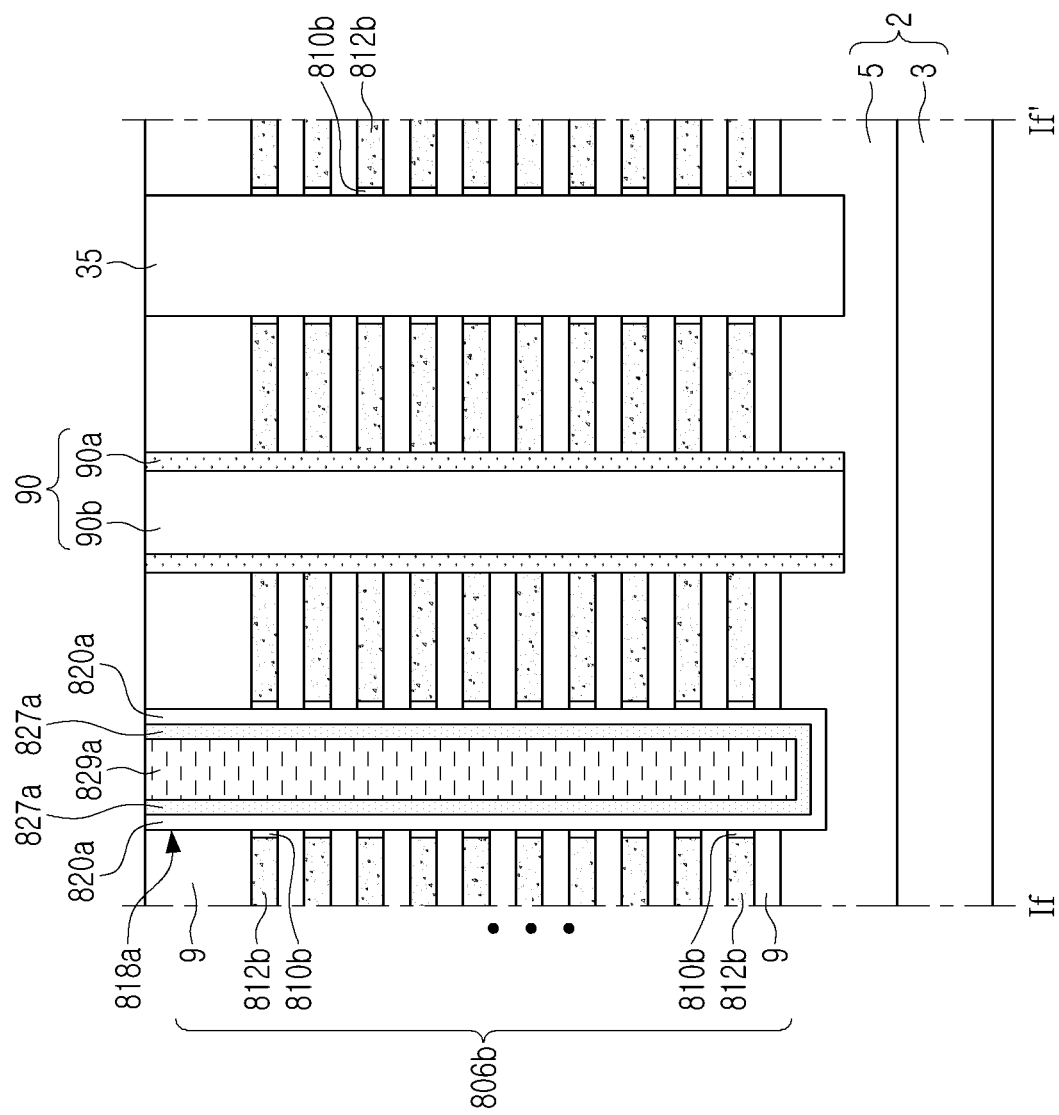
FIG. 20D is a cross-sectional view of a semiconductor device taken along lines If-If' of FIG. 18A according to an exemplary embodiment of the present inventive concepts.

In a modified example with reference to the exemplary embodiments of FIGS. 1 and 20D, the semiconductor device may include the stacked structure 806b shown in FIG. 20D in contrast with the stacked structure 806a described in the exemplary embodiment of FIG. 20C. The semiconductor device in the exemplary embodiment of FIG. 20D may include the same vertical memory structure 818a as that described with reference to FIG. 20C.

The stacked structure 806b may include the interlayer insulating layers 9, planar conductive layers 812b, and switching layers 810b. The interlayer insulating layers 9 and the planar conductive layers 812b may be alternately and repeatedly stacked (e.g., in the Z direction). Each of the switching layers 810b may be interposed between a side of each of the planar conductive layers 812b adjacent to the vertical memory structure 818a and the vertical memory structure 818a (e.g., in the Y direction). One side surface of each of the switching layers 810b may directly contact a side of the planar conductive layer 812b and the other side surface of each of the switching layers 810b may directly contact the data storage structure 820a. The interlayer insulating layers 9 and the planar conductive layers 812b may be alternately stacked to be in direct contact with each other. Upper and lower surfaces of the switching layers 810b may be in direct contact with the lower and upper surfaces of the interlayer insulating layers 9, respectively.

In an exemplary embodiment, the planar conductive layers 812b and the switching layers 810b may be formed of substantially the same material as the material of the planar conductive layers 812a and the switching layers 810a described with reference to the exemplary embodiment of FIG. 20C.

Figure 20E:
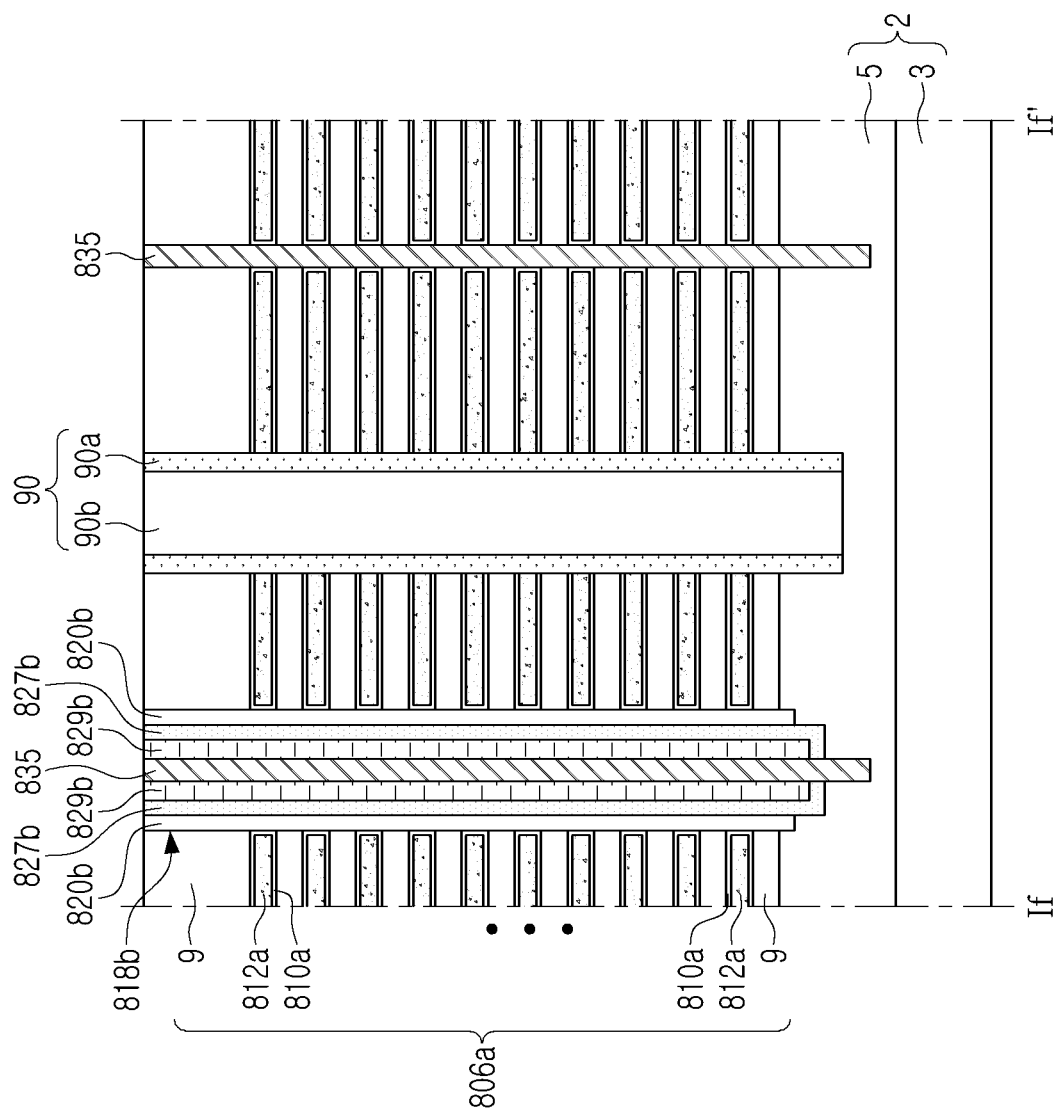
FIG. 20E is a cross-sectional view of a semiconductor device taken along lines If-If' of FIG. 18A according to an exemplary embodiment of the present inventive concepts.

In an another exemplary embodiment with reference to FIGS. 1 and 20E, the semiconductor device may include the vertical memory structure 818b shown in FIG. 20E in contrast with the vertical memory structure 818a shown in the exemplary embodiment of FIG. 20C. The semiconductor device may also include separation structure 835 shown in FIG. 20E in contrast with the separation structure 35 of FIG. 18A. The separation structure 835 may be substantially the same as the separation structure 535 shown in the exemplary embodiments of FIGS. 19A and 19B. The planar shape of the vertical memory structure 818b may be substantially the same as the planar shape of the first and second vertical memory structures 518a and 518b in the exemplary embodiment of FIG. 19A and are separated by the separation structure 835 in a substantially same manner as the separation structure 535 of FIG. 19A. The semiconductor device may include the same stacked structure 806a as that described in the exemplary embodiment of FIG. 20C.

The vertical memory structure 818b may include a core region 829b penetrating at least the planar conductive layers 812a of the stacked structure 806a, a data storage structure 820b disposed on both sides of the core region 829b and interposed between the side of the core region 829b and the stacked structure 806a, and a vertical conductive layer 827b between the data storage structure 820b and the core region 829b. One side surface of the data storage structure 820b may directly contact side surfaces of the stacked structure 806a and the other side surface of the data storage structure 820b may directly contact the vertical conductive layer 827b.

The separation structure 835 may penetrate through the vertical memory structure 818b and the stacked structure 806a (e.g., in the Z direction) and may extend into the lower structure 2. The separation structure 835 may penetrate through the core region 829b and extend downward into the lower structure 2 while dividing the vertical conductive layer 827b. For example, the separation structure 835 may extend through a bottom surface of the vertical conductive layer 827b. Thus, the separation structure 835 may divide the vertical memory structure 818b into two portions spaced apart from each other.

Figure 20F:
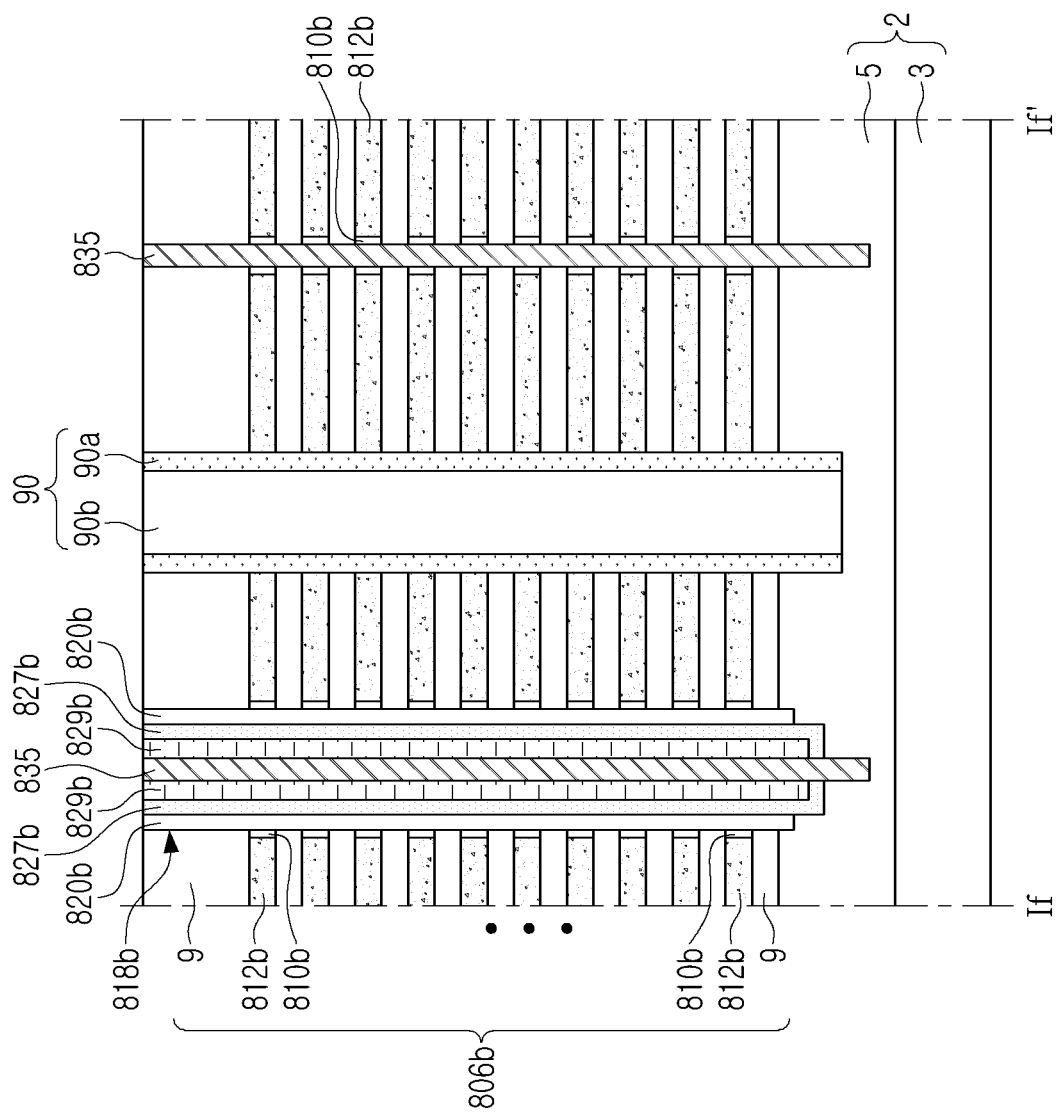
FIG. 20F is a cross-sectional view of a semiconductor device taken along lines If-If' of FIG. 18A according to an exemplary embodiment of the present inventive concepts.

Referring to the exemplary embodiments of FIGS. 1 and 20F, the semiconductor device may include the stacked structure 806b shown in the exemplary embodiment of FIG. 20D. In addition, the semiconductor device may include the vertical memory structure 818b and the separation structure 835 shown in the exemplary embodiment of FIG. 20E. Accordingly, the vertical memory structure 818b and the separation structure 835 as described in the exemplary embodiment of FIG. 20E may be disposed to penetrate through the stacked structure 806b (e.g., in the Z direction) as described in the exemplary embodiment of FIG. 20D.

In an exemplary embodiment, the switching layers 810b of the stacked structure 806b may include switching layers interposed between the planar conductive layers 812b and the vertical memory structures 818b (e.g., in the Y direction), and switching layers interposed between the planar conductive layers 812b and the separation structure 835 (e.g., in the Y direction).

In another exemplary embodiment, the semiconductor device may not include the switching layers interposed between the planar conductive layers 812b and the separation structure 835. For example, the switching layers 810b of the stacked structure 806b may be interposed between the planar conductive layers 812b and the vertical memory structures 818b, but may not be interposed between the planar conductive layers 812b and the separation structure 835.

Accordingly, each of the vertical memory structures described above in the exemplary embodiments described with reference to FIGS. 1 through 20F may include memory cells of any one among memory cells of a NAND flash memory device, memory cells of a phase change memory device, and memory cells of a variable resistance memory device.

Figure 21:
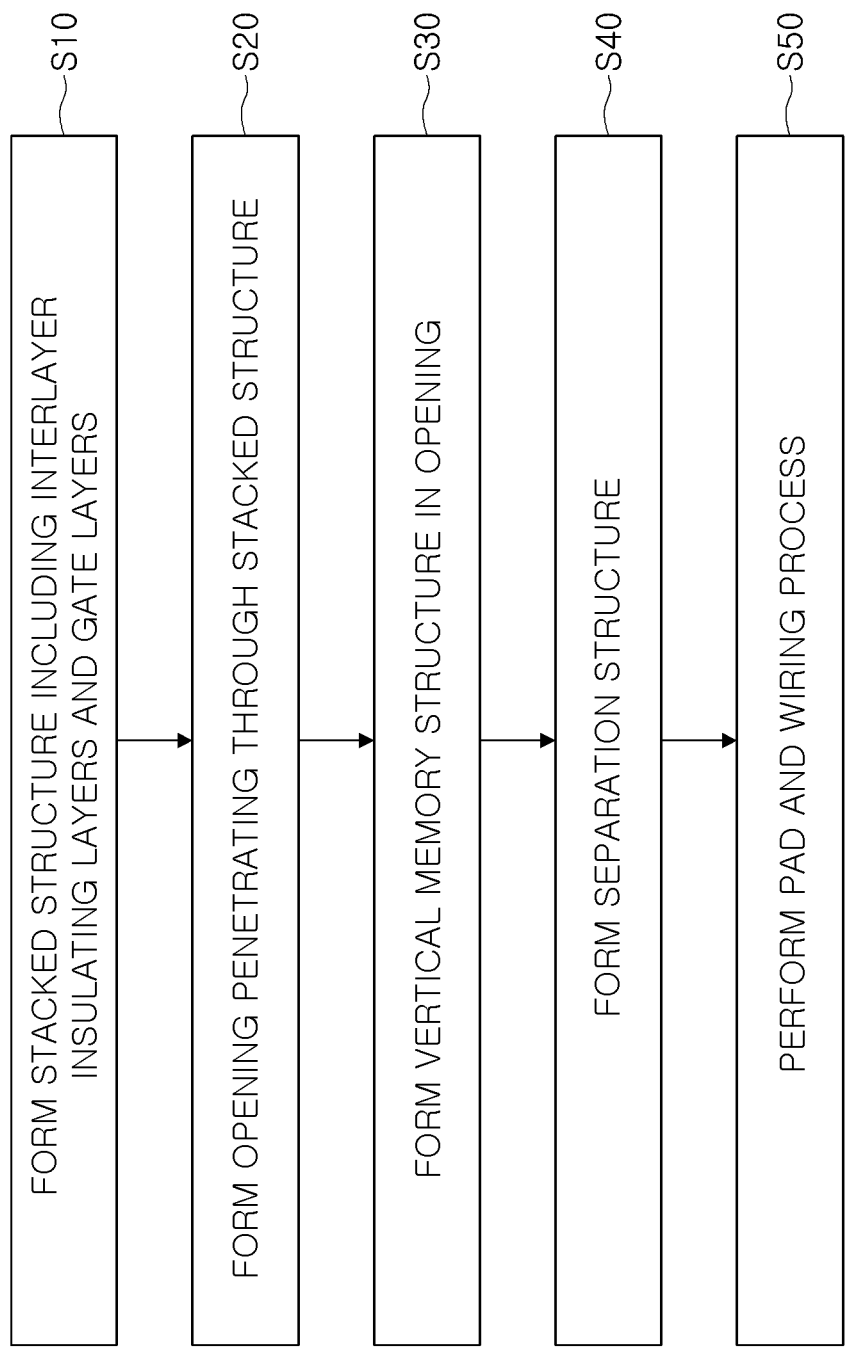
FIG. 21 is a flowchart illustrating a method of forming a semiconductor device according to an exemplary embodiment of the present inventive concepts.

A method of forming a semiconductor device according to exemplary embodiments will be described with reference to FIG. 21. FIG. 21 is a flowchart illustrating a method of forming a semiconductor device according to an exemplary embodiment of the present inventive concepts.

Referring to the exemplary embodiment of FIG. 21, in block S10 a stacked structure including interlayer insulating layers and gate layers may be formed. In block S20, an opening may be formed to penetrate through the stacked structure. In block S30, a vertical memory structure may be formed in the opening. In block S40, a separation structure may be formed. In block S50, a pad and wiring process may be performed.

Figure 22A:
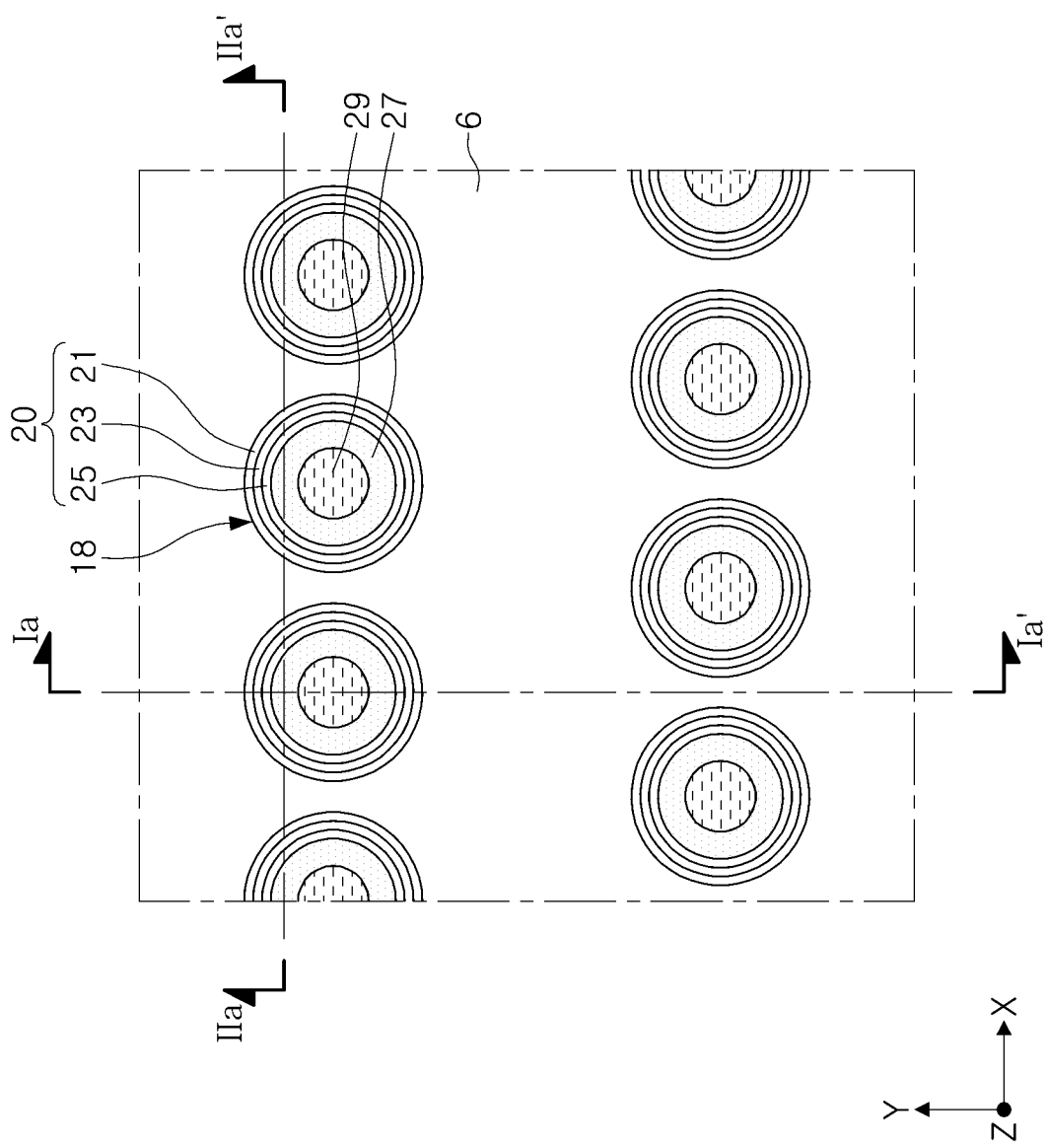
FIG. 22A is a plan view illustrating a method of forming a semiconductor device according to an exemplary embodiment of the present inventive concepts.

An exemplary embodiment of a method of forming a semiconductor device according will be described with reference to FIGS. 1 and 2A and FIGS. 22A through 22C. FIG. 22A is a plan view illustrating a method of forming a semiconductor device according to an exemplary embodiment, and FIGS. 22B and 22C are cross-sectional views illustrating regions taken along lines Ia-Ia' and IIa-IIa' in FIG. 22A.

Figure 22B:
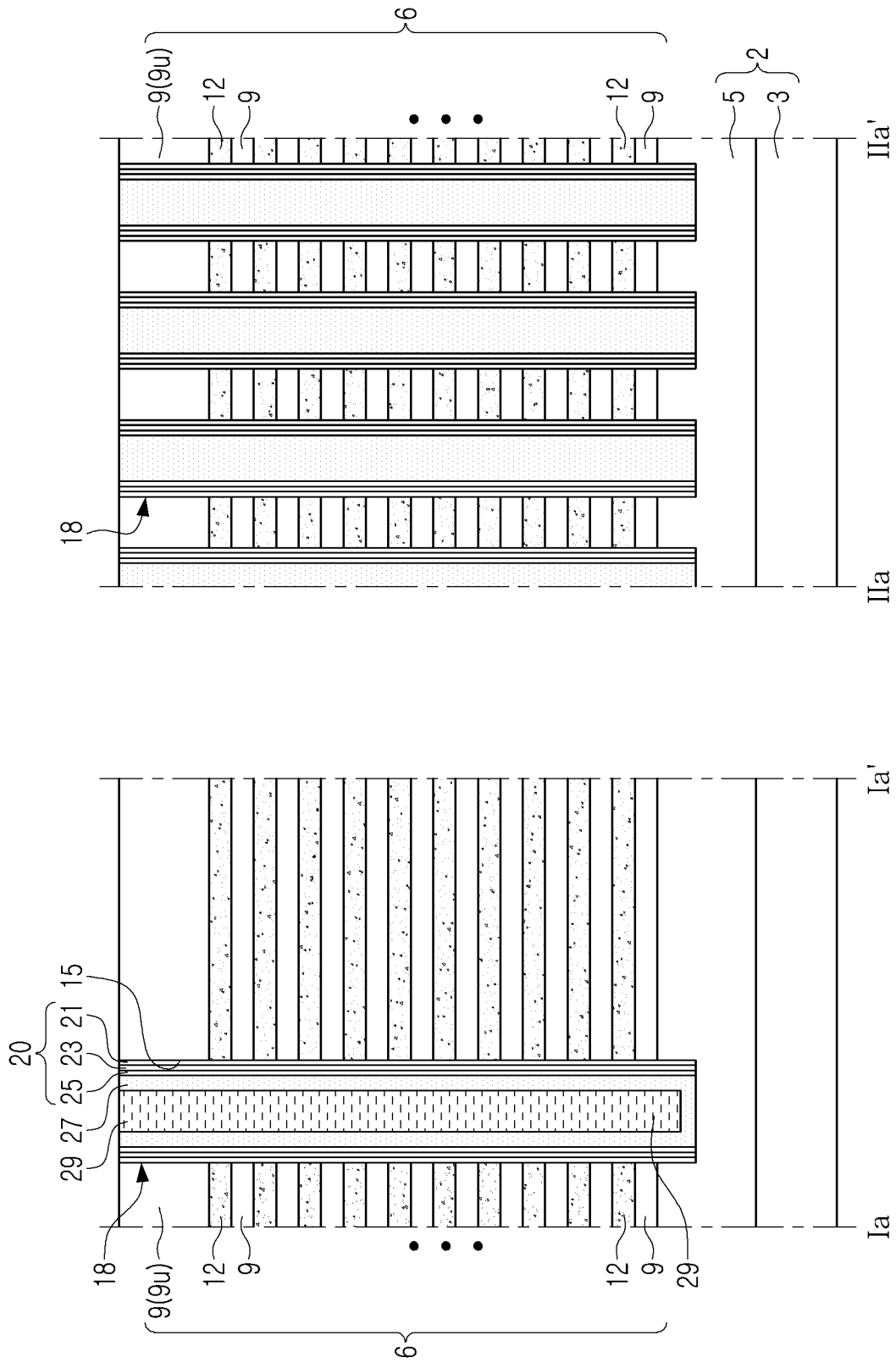
FIG. 22B is a cross-sectional view illustrating a method of forming a semiconductor device taken along lines Ia-Ia' and IIa-IIa' of FIG. 22A according to exemplary embodiments of the present inventive concepts.

Referring to FIGS. 22A and 22B together with FIG. 21, in block S10, a stacked structure 6 may be formed that includes interlayer insulating layers 9 and gate layers 12. The stacked structure 6 may be formed on a lower structure 2 that is substantially the same as the lower structure 2 shown in the exemplary embodiment of FIG. 2A. In block S20, openings 15 penetrating through the stacked structure 6 (e.g., in the Z direction) may be formed. In block S30, vertical memory structures 18 may be formed in the openings 15. The forming of the vertical memory structures 18 may include forming a data storage structure 20 on respective sidewalls of the openings 15, forming a channel semiconductor structure 27 conformally covering bottom surfaces and the sidewalls of the openings 15 on which the data storage structure 20 is formed. For example, the channel semiconductor structure 27 may directly contact inner side surfaces of the data storage structure 20. A core region 29 may be formed on the channel semiconductor structure 27 to fill the openings 15. For example, the core region 29 may directly contact inner side surfaces and a bottom surface of the channel semiconductor structure 27.

In an exemplary embodiment, each of the vertical memory structures 18 may be circular or elliptical in a plan view (e.g., in a plane defined by the X direction and the Y direction).

Figure 22C:
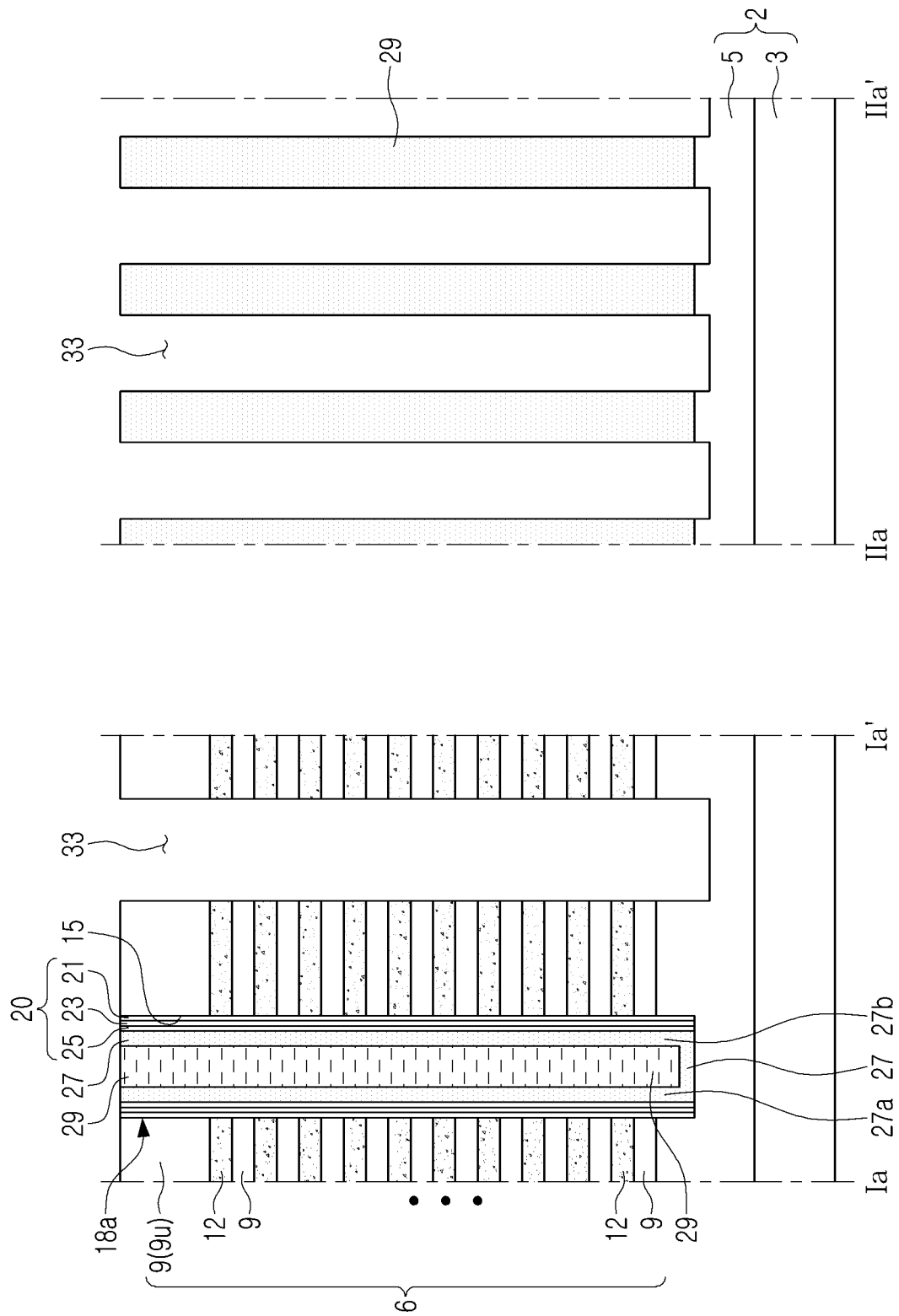
FIG. 22C is a cross-sectional view illustrating a method of forming a semiconductor device taken along lines Ia-Ia' and IIa-IIa' of FIG. 22A according to exemplary embodiments of the present inventive concepts.

Referring to the exemplary embodiment of FIG. 22C, isolation holes 33 penetrating through the stacked structure 6 (e.g., in the Z direction) may be formed.

Referring to the exemplary embodiments of FIGS. 1, 2A and 21, in block 540, separation structures 35 may be formed. The separation structures 35 may be formed in the isolation holes 33 of FIG. 22C. Thus, the vertical memory structures 18a and the separation structures 35 as described with reference to the exemplary embodiments of FIGS. 1 and 2A may be formed.

In block S50, the pad and wiring process may be performed as described with reference to FIG. 21. The pad and wiring process may be a process in which pads, such as the first and second pads 152a and 152b shown in the exemplary embodiments of FIGS. 7A and 7B and/or the first and second pads 252a and 252b shown in the exemplary embodiments of FIGS. 8A and 8B are formed and the conductive lines, such as at least one of the conductive line 60 of the exemplary embodiments of FIGS. 6A and 6B, conductive line 180 of the exemplary embodiments of FIGS. 7A and 7B, and the first and second conductive lines 180a and 180b of the exemplary embodiments of FIGS. 8A and 8B are formed.

Figure 23A:
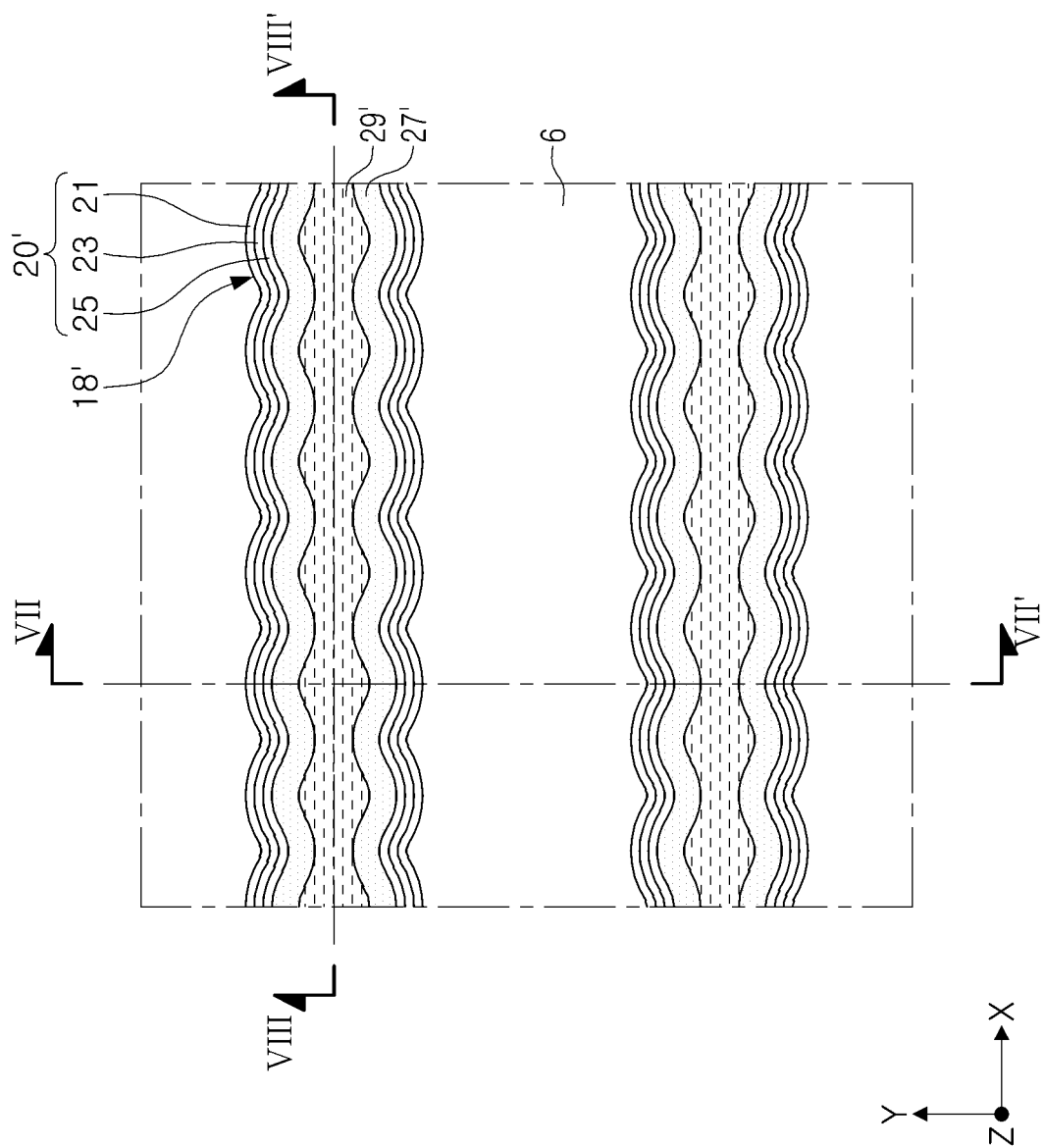
FIG. 23A is a plan view illustrating a method of forming a semiconductor device according to an exemplary embodiment of the present inventive concepts.
Figure 23B:
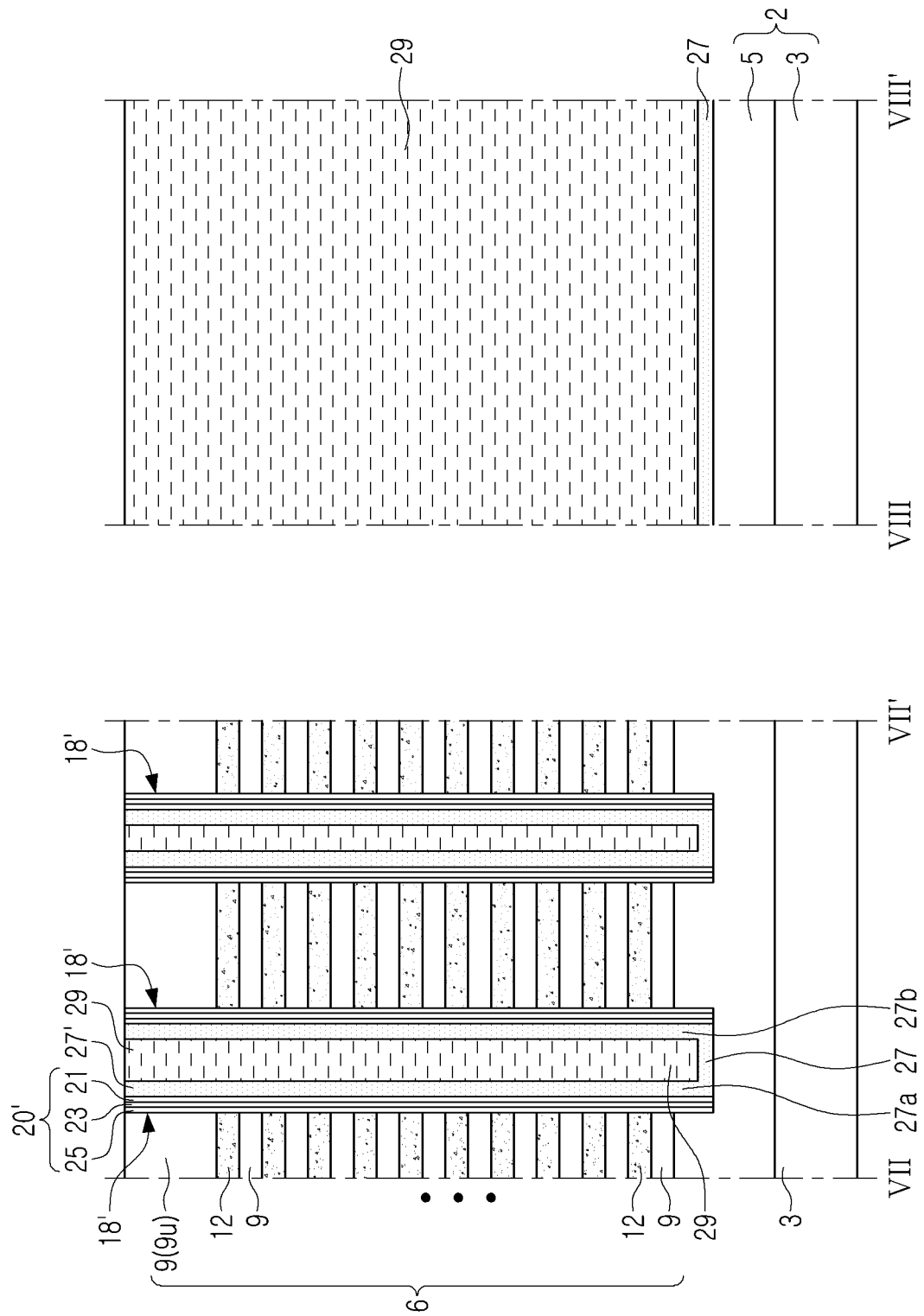
FIG. 23B is a cross-sectional view illustrating a method of forming a semiconductor device taken along lines VII-VII' and VIII-VIII' of FIG. 23A according to exemplary embodiments of the present inventive concepts.

Modified exemplary embodiments of the method of forming a semiconductor device will be described with reference to FIGS. 23A and 23B. FIG. 23A is a plan view illustrating a modified example of a method of forming a semiconductor device according to an exemplary embodiment, and FIG. 23B is a cross-sectional view illustrating regions taken along lines VII-VII' and VIII-VIII' of FIG. 23A.

Referring to the exemplary embodiments of FIGS. 23A and 23B, the stacked structure 6 as described with reference to FIGS. 22A and 22B may be formed. The vertical memory structures 18 shown in FIGS. 22A and 22B having a circular or elliptical shape may be formed as line-shaped preliminary vertical memory structures 18'. Accordingly, each of the preliminary vertical memory structures 18' may include a data storage structure 20', a channel semiconductor structure 27', and a core region 29' which are sequentially formed (e.g., in the Y direction). In an exemplary embodiment, the sides of the vertical memory structures 18' may be wavy. However, exemplary embodiments of the present inventive concepts are not limited thereto and the sides of the vertical memory structures 18' may be formed in various other shapes, such as straight lines or the like.

Referring to the exemplary embodiments of FIG. 9 or FIG. 10, the separation structure 235 of FIG. 9 or the first and second separation structures 235a and 235b of FIG. 10 may be formed to penetrate through the line-shaped preliminary vertical memory structures 18' shown in FIG. 23A. Each of the preliminary vertical memory structures 18' of FIG. 23A may be divided by the separation structures (e.g., separation structure 235 of FIG. 9 or first and second separation structures 235a and 235b of FIG. 10) to form vertical memory structures 18a.

Figure 24:
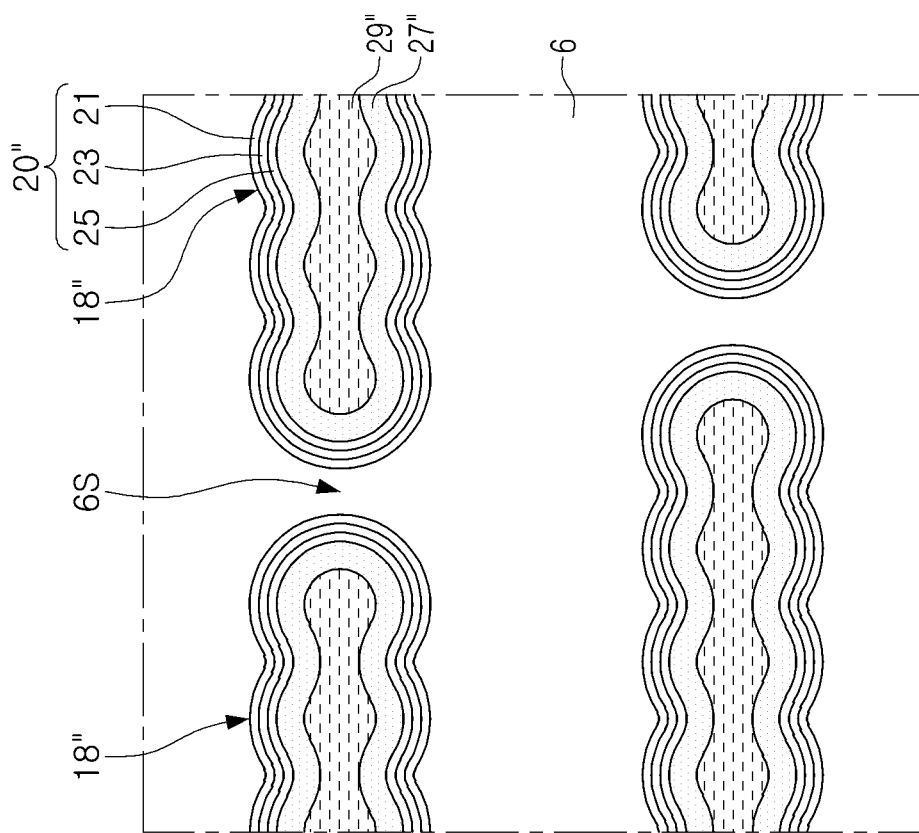
FIG. 24 is a plan view illustrating a method of forming a semiconductor device according to an exemplary embodiment of the present inventive concepts.

A method of forming the vertical memory structures 18a and the separation structures (e.g., first and second separation structures 235a and 235b of FIG. 10 or first and second separation structures 235a and 235b' of FIG. 11) described in FIG. 10 or 11 will be described with reference to FIG. 24. FIG. 24 is a plan view illustrating a modified method of forming a semiconductor device according to an exemplary embodiment.

Referring to the exemplary embodiment of FIG. 24, the preliminary vertical memory structures 18' having a linear shape in FIG. 23A may be formed as preliminary vertical memory structures 18" having a partially cut linear shape. Each of the preliminary vertical memory structures 18" may include a data storage structure 20", a channel semiconductor structure 27", and a core region 29". A region 6s between the ends of the preliminary vertical memory structures 18" arranged in the X direction may be filled by the stacked structure 6, and may be referred to as a "support". For example, an area between the ends of the preliminary vertical memory structures 18" arranged in the X direction, for example, the support 6s, may serve to prevent the stacked structure 6 from being deformed or collapsing in a process of forming an opening by etching the stacked structure 6 to form the preliminary vertical memory structures 18".

Referring back to the exemplary embodiment of FIG. 10, separation structures 235a and 235b may be formed to penetrate through the preliminary vertical memory structures 18" in FIG. 24 (e.g., in the Z direction). The preliminary vertical memory structures 18" in FIG. 24 may be divided by the separation structures 235a and 235b to form the vertical memory structures 18a. Among the separation structures 235a and 235b described above with reference to the exemplary embodiment of FIG. 10, the second separation structure 235b having a relatively larger width (e.g., in the X direction) may penetrate through the support (6s of FIG. 24) between the ends of the preliminary vertical memory structures 18" in FIG. 24, thereby removing the support 6s shown in FIG. 24.

Referring back to the exemplary embodiment of FIG. 11, separation structures 235a and 235b' penetrating through the preliminary vertical memory structures 18" (e.g., in the Z direction) in FIG. 24 may be formed. The preliminary vertical memory structures 18" in FIG. 24 may be divided by the separation structures 235a and 235b' shown in FIG. 11, to form the vertical memory structures 18a and 218a.

Among the separation structures 235a and 235b' described above with reference to FIG. 11, the second separation structure 235b' having a relatively larger width may penetrate through the support 6s shown in FIG. 24 between the ends of the preliminary vertical memory structures 18" in FIG. 24 to remove the support 6s, and a portion of the ends of the preliminary vertical memory structures 18" shown in FIG. 24 may remain. The second vertical memory structures 218a described with reference to the exemplary embodiment of FIG. 11 may include remaining ends of the preliminary vertical memory structures 18" shown in FIG. 24.

Figure 25A:
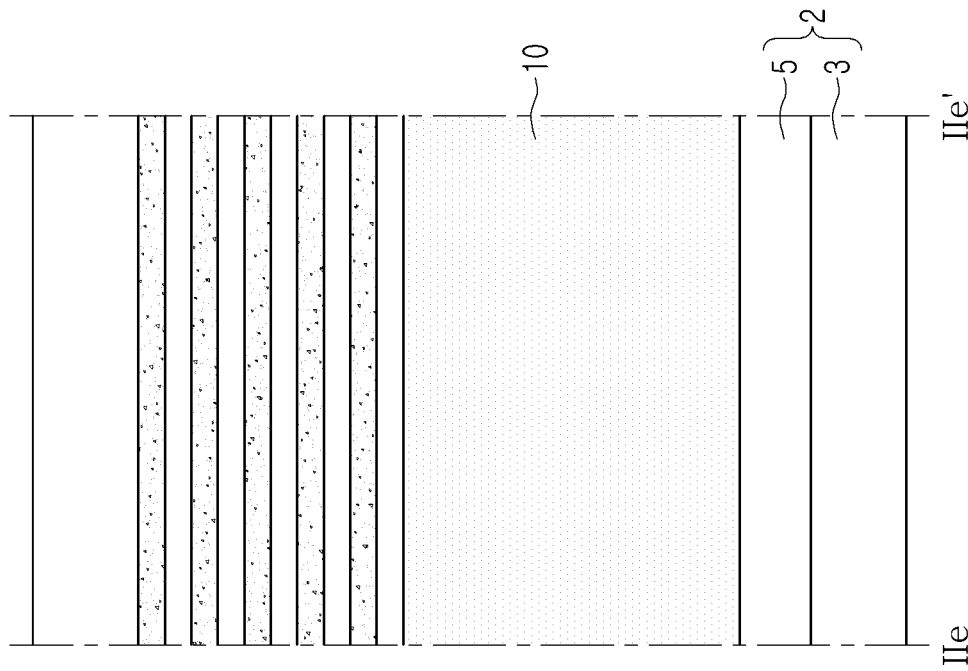
FIGS. 25A to 25C are cross-sectional views illustrating a method of forming a semiconductor device taken along lines Ie-Ie' and IIe-IIe' of FIG. 11 according to exemplary embodiments of the present inventive concepts.
Figure 25A:
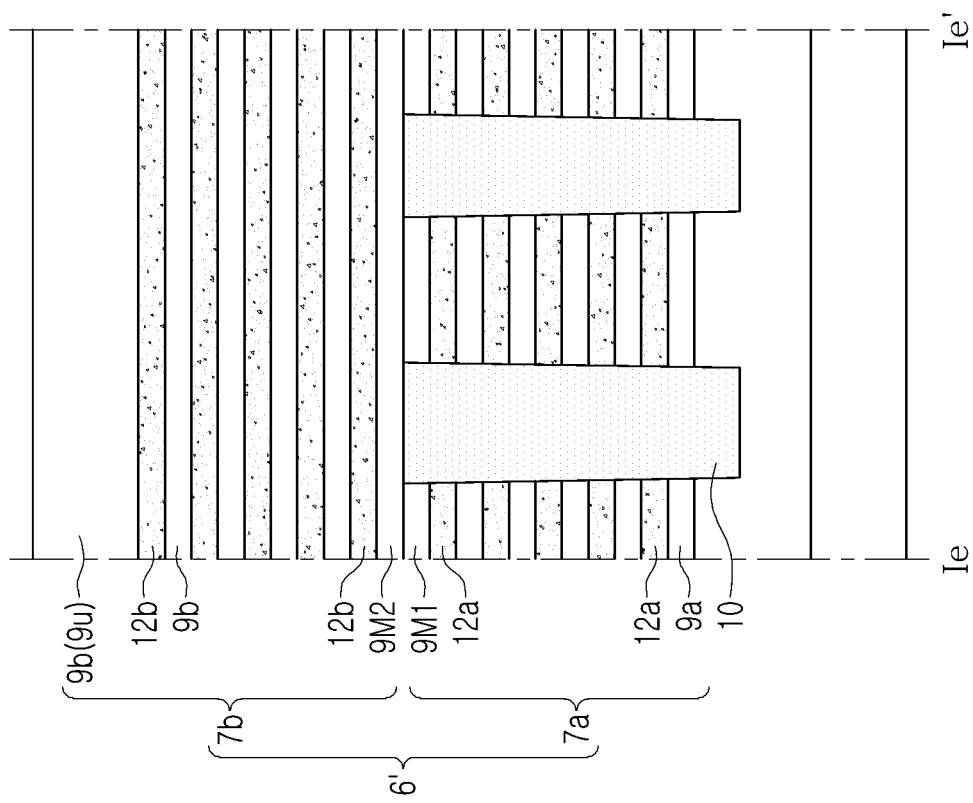
Figure 25B:
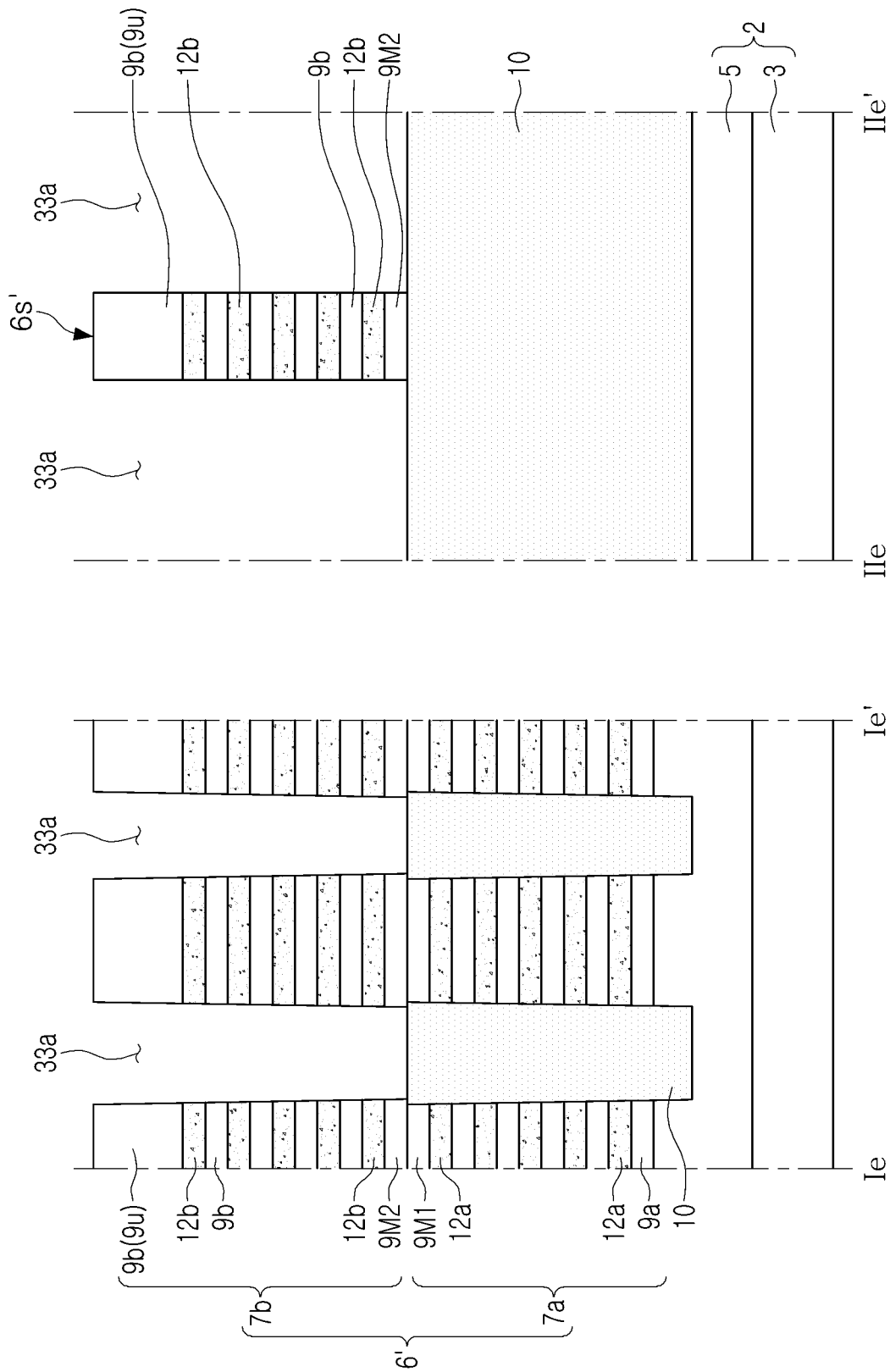
Figure 25C:
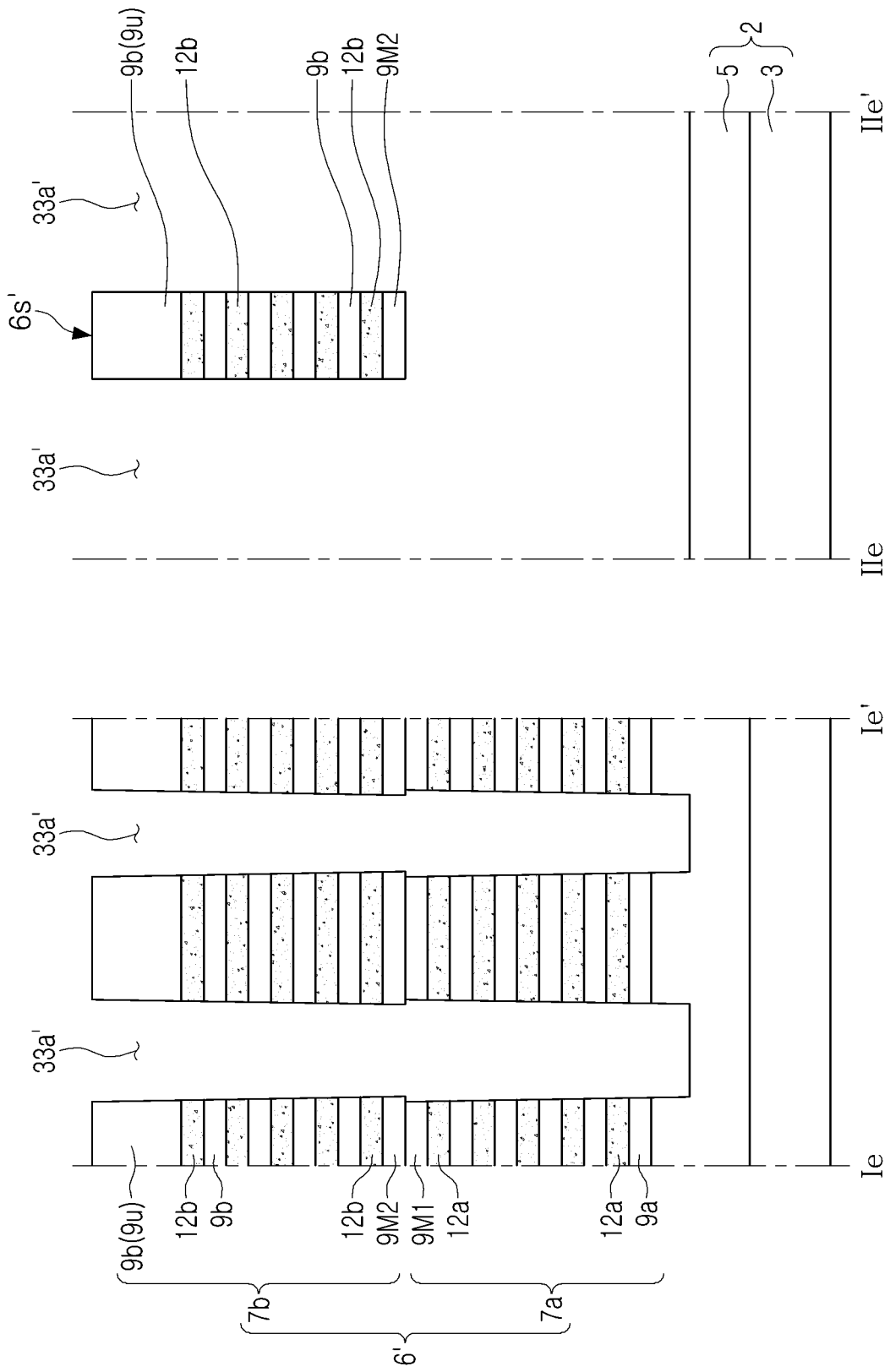

Next, an example of a method of forming the semiconductor device described with reference to the exemplary embodiment of FIG. 13 will be described with reference to the exemplary embodiments of FIGS. 25A through 25C. FIGS. 25A to 25C are cross-sectional views of the semiconductor device taken along lines Ie-Ie' and IIe-IIe' of FIG. 11 to illustrate an example of a method of forming the semiconductor device described with reference to FIG. 13.

Referring to the exemplary embodiments of FIGS. 11 and 25A, a lower stacked structure 7a may be formed on the lower structure 2. For example, the lower stacked structure 7a may be formed directly on an upper surface of the lower structure 2. The lower stacked structure 7a may include first interlayer insulating layers 9a and first gate layers 12a alternately and repeatedly stacked (e.g., in the Z direction). An uppermost layer of the first interlayer insulating layers 9a and the first gate layers 12a may be a first intermediate interlayer insulating layer 9M1. The upper stacked structure 7b may include second interlayer insulating layers 9b and second gate layers 12b, alternately and repeatedly stacked (e.g., in the Z direction). An uppermost layer of the second interlayer insulating layers 9b and the second gate layers 12b may be an upper interlayer insulating layer 9U, and a lowermost layer thereof may be a second intermediate interlayer insulating layer 9M2.

Lower sacrificial patterns 10 penetrating through the lower stacked structure 7a may be formed.

In an exemplary embodiment, the planar shape (e.g., in a plane defined by the X direction and the Y direction) of the lower sacrificial patterns 10 may be the same as or similar to the planar shape of the preliminary vertical memory structures 18' shown in the exemplary embodiment of FIG. 23A. Therefore, each of the lower sacrificial patterns 10 may have a line shape extending in the X direction.

An upper stacked structure 7b may be formed on the lower stacked structure 7a and the lower sacrificial patterns 10 (e.g., in the Z direction). The upper stacked structure 7b may include the second interlayer insulating layers 9b and the second gate layers 12b that are alternately and repeatedly stacked (e.g., in the Z direction). An uppermost layer of the second interlayer insulating layers 9b and the second gate layers 12b may be an upper interlayer insulating layer 9U, and a lowermost layer thereof may be a second intermediate interlayer insulating layer 9M2. The lower and upper stacked structures 7a and 7b may constitute a stacked structure 6'.

Referring to the exemplary embodiments of FIGS. 11 and 25B, upper openings 33a penetrating through the upper stacked structure 7b may be formed. The planar shape of the upper openings 33a may be a line shape of which a portion is broken, while overlapping the lower sacrificial patterns 10. For example, the planar shape of the upper openings 33a may be a line shape having end portions facing each other, as shown in the preliminary vertical memory structures 18" of FIG. 24. Accordingly, a portion of the upper stacked structure 7b may remain between the end portions of the upper openings 33a facing each other in a line shape. The portion of the upper stacked structure 7b remaining between the end portions of the upper openings 33a facing each other as described above may be referred to as an upper support 6s'.

Referring to the exemplary embodiments of FIGS. 11 and 25C, the lower sacrificial patterns 10 exposed by the upper openings 33a are removed, thereby forming openings 33a' which include the upper openings 33a shown in FIG. 25B and the empty spaces formed by removing the lower sacrificial patterns 10. The upper support 6s' may prevent the stacked structure 6' from being deformed or collapsed, which may occur when the openings 33a' are formed.

Referring again to the exemplary embodiments of FIGS. 11 and 13, preliminary vertical memory structures are formed in the openings 33a' shown in FIG. 25C, and subsequently, the first and second separation structures 235a and 235b' as described in FIGS. 11 and 13 may be formed. Each of the preliminary vertical memory structures may include the data storage structure 20', the channel semiconductor structure 27', and the core region 29' which are substantially the same as those described above with reference to the exemplary embodiments of FIGS. 23A and 23B.

The preliminary vertical memory structures are divided by the first and second separation structures 235a and 235b', thereby forming the first and second vertical memory structures 18a and 218a' as described with reference to FIGS. 11 and 13. The second separation structure 235b' having a relatively large width (e.g., in the X direction) among the separation structures 235a and 235b' penetrates through the upper support 6s' in FIG. 25C to remove the upper support 6s' in FIG. 25C, and a portion of the ends of the preliminary vertical memory structures may remain. Accordingly, the second vertical memory structures 218a' described with reference to the exemplary embodiments of FIGS. 11 and 13 may include remaining ends of the preliminary vertical memory structures.

Figure 26A:
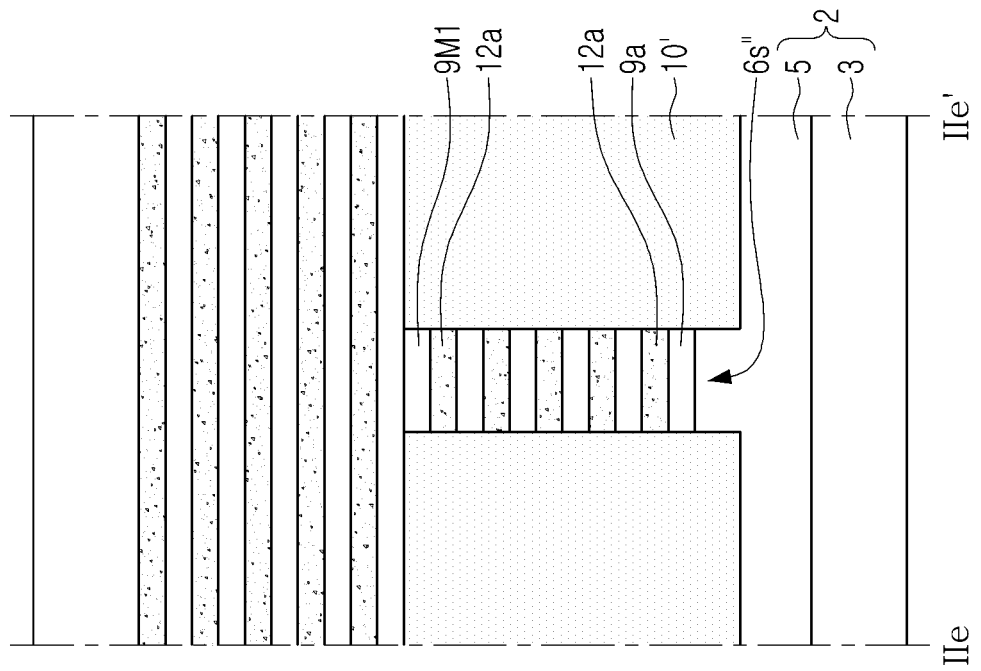
FIGS. 26A and 26B are cross-sectional views illustrating a method of forming a semiconductor device taken along lines Ie-Ie' and IIe-IIe' of FIG. 11 according to exemplary embodiments of the present inventive concepts.
Figure 26A:
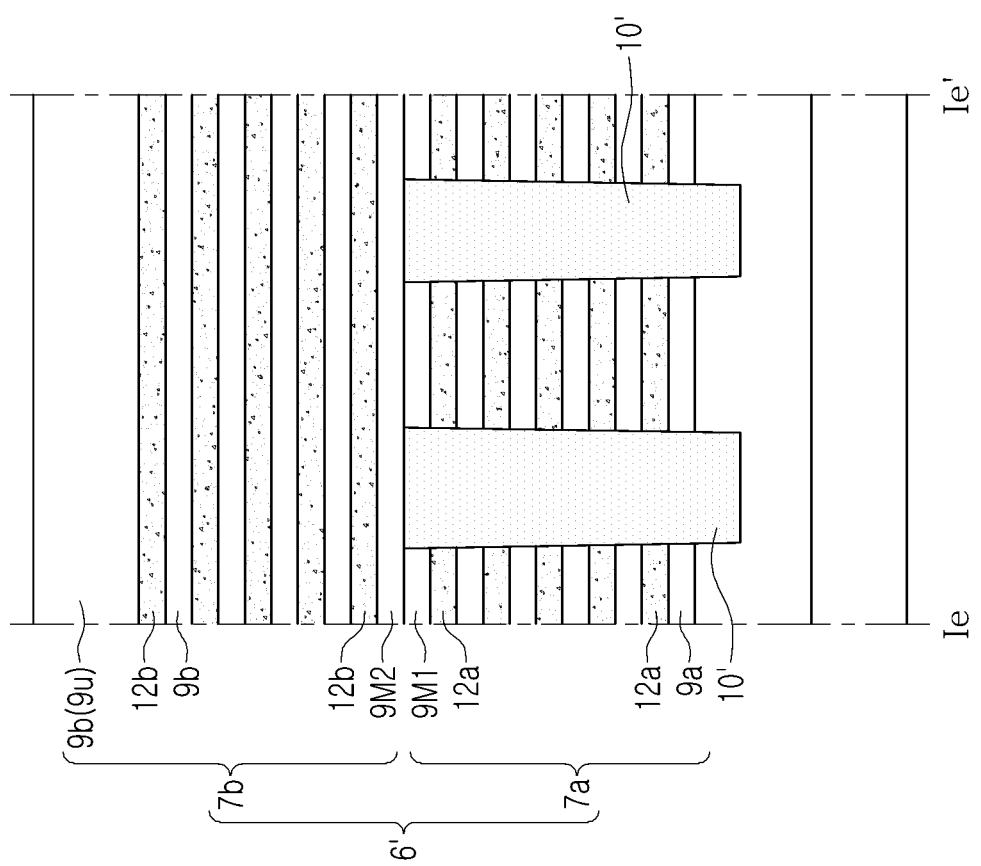
Figure 26B:
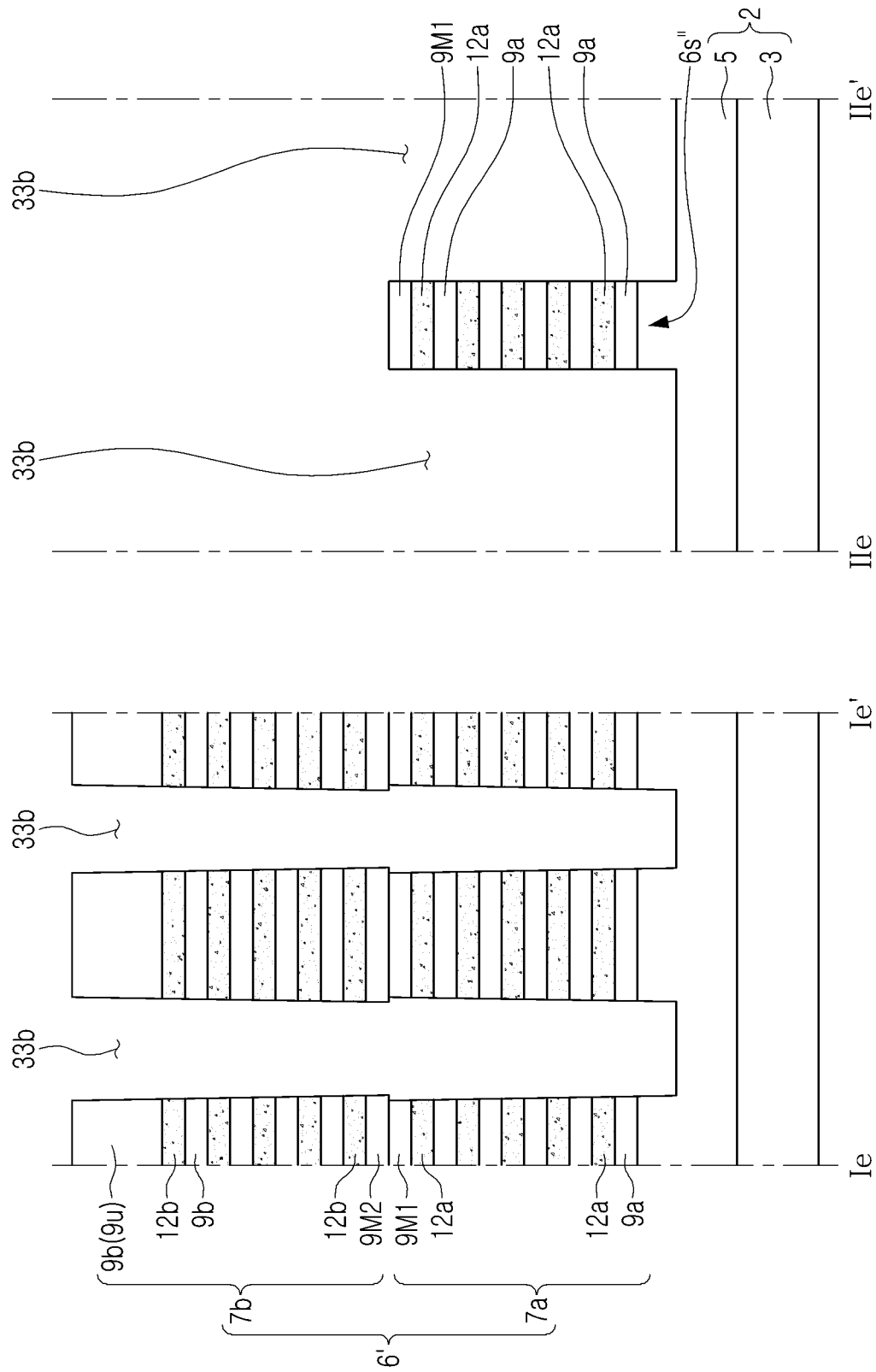

A method of forming the semiconductor device described with reference to FIG. 14 will be described with reference to the exemplary embodiments of FIGS. 26A and 26B. FIGS. 26A and 26B are cross-sectional views of a semiconductor device taken along lines Ie-Ie' and IIe-IIe' of FIG. 11 to illustrate an example of a method of forming the semiconductor device described with reference to FIG. 14.

Referring to FIGS. 11 and 26A, the lower stacked structure 7a as described with reference to FIG. 25A may be formed on the lower structure 2.

Lower sacrificial patterns 10 penetrating through the lower stacked structure 7a may be formed. The planar shape of the lower sacrificial patterns 10' may be substantially the same as the upper openings 33a of FIG. 25B. For example, the planar shape of the lower sacrificial patterns 10' may be a line shape having end portions facing each other, as shown in the preliminary vertical memory structures 18" of FIG. 24. Thus, a portion of the lower stacked structure 7a may remain between the end portions of the lower sacrificial patterns 10' facing each other, and thus, the lower stacked structure 7a remaining between the ends of the lower sacrificial patterns 10' facing each other as described above may be referred to as a lower support 6s".

The upper stacked structure 7b as described with reference to FIG. 25A may be formed on the lower stacked structure 7a and the lower sacrificial patterns 10' (e.g., in the Z direction). Thus, a stacked structure 6' including the lower and upper stacked structures 7a and 7b may be formed.

Upper openings may be formed to penetrate through the upper stacked structure 7b. The upper openings may have a line shape overlapping the lower sacrificial patterns 10' and the lower support 6s". Subsequently, the lower sacrificial patterns 10' may be removed, thereby forming openings 33b including empty spaces formed by removing the lower sacrificial patterns 10' and the upper openings.

The lower support 6s" may prevent the stacked structure 6' from being deformed or collapsed, which may occur when the openings 33b are formed.

Referring again to FIGS. 11 and 14, similar to the method described above with reference to FIGS. 11 and 13, preliminary vertical memory structures are formed in the openings 33b in FIG. 26B. The first and second separation structures 235a and 235b' which are the same as those described with reference to the exemplary embodiments of FIGS. 11 and 14 may then be formed. Thus, the preliminary vertical memory structures are divided by the first and second separation structures 235a and 235b', thereby forming the first and second vertical memory structures 18a and 218a" as described with reference to the exemplary embodiments of FIGS. 11 and 14. The second separation structure 235b' having a relatively large width (e.g., in the X direction) among the separation structures 235a and 235b' penetrates through the lower support 6s" in FIG. 26B to remove the lower support 6s" in FIG. 26B, and a portion of the ends of the preliminary vertical memory structures may remain. Thus, the second vertical memory structures 218a" described with reference to FIGS. 11 and 14 may include remaining ends of the preliminary vertical memory structures.

As set forth above, according to exemplary embodiments, a separation structure and a vertical memory structure may separate the stacked structure into a first stacked structure and a second stacked structure. The vertical memory structure may include a first data storage structure facing the first stacked structure and a second data storage structure facing the second stacked structure. Since a plurality of data storage areas may be formed in the first data storage structure facing the plurality of gate layers that may be word lines of the first stacked structure, and a plurality of data storage areas may be formed in the second data storage structure facing the plurality of gate layers that may be word lines of the second stacked structure, the semiconductor device may have a high level of integration.

While exemplary embodiments of the present inventive concepts have been illustrated and described above, it will be apparent to those skilled in the art that modifications and variations could be made without departing from the scope of the present inventive concepts.

What is claimed is:

1. A semiconductor device comprising:
   a lower structure;
   a plurality of separation structures disposed on the lower structure and spaced apart from each other in a first direction that is parallel to an upper surface of the lower structure;
   a vertical memory structure disposed between adjacent separation structures of the plurality of separation structures, the vertical memory structure including a core region, a channel semiconductor structure and a data storage structure, wherein the plurality of separation structures directly contacts the core region, the channel semiconductor structure and the data storage structure;
   a stacked structure disposed on the lower structure;
   the stacked structure including a first stacked structure and a second stacked structure spaced apart from each other in a second direction by the plurality of separation structures and the vertical memory structure, the second direction is parallel to the upper surface of the lower structure and perpendicular to the first direction;
   each of the first and second stacked structures includes a plurality of interlayer insulating layers and a plurality of gate layers alternately repeatedly stacked on the lower structure;
   the channel semiconductor structure including a first channel semiconductor layer disposed between the core region and the first stacked structure in the second direction and a second channel semiconductor layer disposed between the core region and the second stacked structure in the second direction;
   the data storage structure includes a first data storage structure disposed between the first stacked structure and the first channel semiconductor layer in the second direction and a second data storage structure disposed between the second stacked structure and the second channel semiconductor layer in the second direction;
   each of the first and second data storage structures includes a first dielectric layer, a second dielectric layer, and a data storage layer disposed between the first and second dielectric layers; and
   side surfaces of the first and second stacked structures that face the vertical memory structure are concave in a first plan view defined by the first direction and the second direction.

2. The semiconductor device of claim 1, wherein side surfaces of the core region that face the channel semiconductor structure are convex in the first plan view.

3. The semiconductor device of claim 2, wherein side surfaces of the core region that face the separation structures are concave in the first plan view.

4. The semiconductor device of claim 2, wherein side surfaces of the core region that face the separation structures have line shapes that are parallel to each other in the first plan view.

5. The semiconductor device of claim 1, wherein a length of an interfacial surface between the first data storage structure and the first channel semiconductor layer is greater than a length of an interfacial surface between the first channel semiconductor layer and the core region in the first plan view.

6. The semiconductor device of claim 1, wherein a length of an interfacial surface between the first data storage structure and the first stacked structure is greater than a length of an interfacial surface between the first data storage structure and the first channel semiconductor layer in the first plan view.

7. The semiconductor device of claim 1, wherein:
each of the separation structures includes a lower portion and an upper portion disposed on the lower portion; and
a width of the lower portion is greater than a width of the upper portion in the first plan view.

8. The semiconductor device of claim 1, further comprising:
a contact plug disposed on the vertical memory structure, the contact plug is configured to be electrically connected to the first and second channel semiconductor layers; and
a conductive line on the contact plug, the conductive line is configured to be electrically connected to the contact plug.

9. The semiconductor device of claim 1, further comprising:
a first pad disposed on the vertical memory structure, the first pad is configured to be electrically connected to the first channel semiconductor layer;
a second pad disposed on the vertical memory structure, the second pad is configured to be electrically connected to the second channel semiconductor layer;
a contact plug disposed on the first pad, the contact plug is configured to be electrically connected to the first pad; and
a conductive line disposed on the contact plug, the conductive line is configured to be electrically connected to the contact plug.

10. The semiconductor device of claim 9, wherein:
the channel semiconductor structure extends between the core region and the lower structure from the first and second channel semiconductor layers; and
the data storage structure extends between the channel semiconductor structure and the lower structure from the first and second data storage structures.

11. The semiconductor device of claim 1, further comprising:
a first pad disposed on the vertical memory structure, the first pad is configured to be electrically connected to the first channel semiconductor layer;
a second pad disposed on the vertical memory structure, the second pad is configured to be electrically connected to the second channel semiconductor layer;
a first contact plug disposed on the first pad, the first contact plug is configured to be electrically connected to the first pad;
a second contact plug disposed on the second pad, the second contact plug is configured to be electrically connected to the second pad;
a first conductive line disposed on the first contact plug, the first conductive line is configured to be electrically connected to the first contact plug; and
a second conductive line disposed on the second contact plug, the second conductive line is configured to be electrically connected to the second contact plug,
wherein the first conductive line and the second conductive line are parallel to each other.

12. The semiconductor device of claim 1, further comprising:
a separation pattern penetrating through the stacked structure and extending in the first direction; and
the separation pattern is spaced apart from the separation structures and the vertical memory structure in the second direction.

13. A semiconductor device comprising:
a first stacked structure and a second stacked structure disposed on a substrate, the first stacked structure and the second stacked structure are spaced apart from each other in a first direction that is parallel to an upper surface of the substrate;
a plurality of separation structures and a plurality of vertical memory structures alternately arranged between the first stacked structure and the second stacked structure in a second direction that is parallel to the upper surface of the substrate and is perpendicular to the first direction, each of the plurality of vertical memory structures further comprises a core region and a channel semiconductor structure, wherein the plurality of separation structures directly contacts the core region and the channel semiconductor structure of the plurality of vertical memory structures;
each of the first and second stacked structures includes a plurality of interlayer insulating layers and a plurality of gate layers alternately repeatedly stacked on the substrate;
each of the plurality of vertical memory structures includes a first data storage structure facing the first stacked structure and a second data storage structure facing the second stacked structure; and
side surfaces of the first and second stacked structures that face the plurality of vertical memory structures are concave in a first plan view defined by the first direction and the second direction.

14. The semiconductor device of claim 13, wherein:
the plurality of separation structures comprises a plurality of first separation structures and a second separation structure disposed between adjacent first separation structures of the plurality of first separation structures; and
wherein a width in the second direction of each of the plurality of first separation structures is less than a width in the second direction of the second separation structure.

15. The semiconductor device of claim 13, wherein:
the channel semiconductor structure comprises a first channel semiconductor layer adjacent to the first stacked structure and a second channel semiconductor layer adjacent to the second stacked structure;

the core region is disposed between the first channel semiconductor layer and the second channel semiconductor layer;

the first data storage structure is disposed between the first stacked structure and the first channel semiconductor layer;

the second data storage structure is disposed between the second stacked structure and the second channel semiconductor layer; and the core region has a first side that is convex in a direction toward the first stacked structure and a second side that is convex in a direction toward the second stacked structure in the first plan view.

16. The semiconductor device of claim 13, wherein:

each of the first and second stacked structures comprises a lower stacked structure and an upper stacked structure disposed on the lower stacked structure; and each of the plurality of vertical memory structures comprises a lower memory portion penetrating through the lower stacked structure and an upper memory portion penetrating through the upper stacked structure, wherein a width of an upper surface of the lower memory portion is greater than a width of a lower surface of the upper memory portion in the first plan view.

17. A semiconductor device comprising:

a first stacked structure and a second stacked structure disposed on a substrate, each of the first and second stacked structures including a plurality of interlayer insulating layers and a plurality of gate layers alternately repeatedly stacked on the substrate;

a plurality of vertical memory structures disposed between the first and second stacked structures and arranged in a first direction that is parallel to an upper surface of the substrate, each of the plurality of vertical memory structures including a channel semiconductor structure and a data storage structure;

a separation structure filling a gap between the first and second stacked structures together with the plurality of vertical memory structures and separating adjacent vertical memory structures of the plurality of vertical memory structures, the separation structure directly contacting the channel semiconductor structure and the data storage structure of the plurality of vertical memory structures;

conductive lines disposed on the vertical memory structures to extend in a second direction perpendicular to the first direction;

the channel semiconductor structure includes a first channel semiconductor layer and a second channel semiconductor layer having a mirror symmetry structure with respect to each other, and the data storage structure includes a first data storage structure and a second data storage structure having a mirror symmetry structure with respect to each other;

the first data storage structure is disposed between the first channel semiconductor layer and the first stacked structure;

the second data storage structure is disposed between the second channel semiconductor layer and the second stacked structure;

a side surface of the first stacked structure that faces the first data storage structure is concave;

a side surface of the second stacked structure that faces the second data storage structure is concave; and the first channel semiconductor layer has a substantially uniform thickness and faces the first data storage structure in a plan view.

18. The semiconductor device of claim 17, wherein:

each of the vertical memory structures further comprises a core region, wherein the core region is disposed between the first and second channel semiconductor layers.

19. The semiconductor device of claim 17, wherein:

the conductive lines include a first conductive line and a second conductive line that are adjacent to each other;

the first channel semiconductor layer is configured to be electrically connected to the first conductive line; and the second channel semiconductor layer is configured to be electrically connected to the second conductive line.

20. The semiconductor device of claim 17, wherein in each of the plurality of vertical memory structures, the first channel semiconductor layer and the second channel semiconductor layer are configured to be electrically connected to one of the conductive lines.

* * * * *